(12) United States Patent
Yamazaki et al.

(10) Patent No.: US 9,087,950 B2
(45) Date of Patent: Jul. 21, 2015

(54) PHOTOELECTRIC CONVERSION DEVICE AND METHOD FOR MANUFACTURING THE SAME

(75) Inventors: Shunpei Yamazaki, Tokyo (JP); Yukie Suzuki, Kanagawa (JP); Kazuo Nishi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 305 days.

(21) Appl. No.: 12/788,862

(22) Filed: May 27, 2010

(65) Prior Publication Data

US 2010/0307557 A1 Dec. 9, 2010

(30) Foreign Application Priority Data

Jun. 5, 2009 (JP) ................... 2009-136644

(51) Int. Cl.
*H01L 31/18* (2006.01)
*H01L 31/042* (2014.01)
*H01L 31/076* (2012.01)
(Continued)

(52) U.S. Cl.
CPC ............... *H01L 31/076* (2013.01); *B60T 1/10* (2013.01); *H01L 31/03685* (2013.01); *H01L 31/03926* (2013.01); *H01L 31/043* (2013.01); *H01L 31/048* (2013.01); *H01L 31/0488* (2013.01); *H01L 31/0687* (2013.01); *H01L 2924/0002* (2013.01); *H01L 2924/09701* (2013.01);
(Continued)

(58) Field of Classification Search
CPC ............ H01L 31/03685; H01L 31/03926; H01L 31/048; H01L 31/0488; H01L 31/0687; H01L 31/076

USPC ................... 136/244, 256, 252, 255
See application file for complete search history.

(56) References Cited

U.S. PATENT DOCUMENTS 3,976,508 A * 8/1976 Mlavsky ............ 136/246
4,913,744 A 4/1990 Hoegl et al.
(Continued)

FOREIGN PATENT DOCUMENTS

CN 001173241 A 2/1998
CN 001886447 A 12/2006
(Continued)

OTHER PUBLICATIONS

International Search Report, PCT Application No. PCT/JP2010/059057, dated Aug. 31, 2010, 2 pages.
(Continued)

*Primary Examiner* — Jonathan Johnson
*Assistant Examiner* — Bethany L Martin
(74) *Attorney, Agent, or Firm* — Fish & Richardson P.C.

(57) ABSTRACT

A multi-junction photoelectric conversion device that can be manufactured by a simple method is provided. In addition, a photoelectric conversion device whose mechanical strength is increased without complicating a manufacturing process is provided. A photoelectric conversion device includes a first cell having a photoelectric conversion function, a second cell having a photoelectric conversion function, and a structure body including a fibrous body, which firmly attaches and electrically connects the first cell and the second cell to each other. Accordingly, a multi-junction photoelectric conversion device in which semiconductor junctions are connected in series and sufficient electrical connection between p-i-n junctions is ensured can be provided.

12 Claims, 27 Drawing Sheets

(51) Int. Cl.
| | |
|---|---|
| *B60T 1/10* | (2006.01) |
| *H01L 31/0368* | (2006.01) |
| *H01L 31/0392* | (2006.01) |
| *H01L 31/048* | (2014.01) |
| *H01L 31/0687* | (2012.01) |
| *H01L 31/043* | (2014.01) |

(52) U.S. Cl.
CPC .............. *Y02E10/544* (2013.01); *Y02E 10/545* (2013.01); *Y02E 10/548* (2013.01); *Y02E 10/549* (2013.01)

(56) References Cited

U.S. PATENT DOCUMENTS

| | | | |
|---|---|---|---|
| 5,058,800 A | 10/1991 | Yoshizawa et al. | |
| 5,071,490 A | 12/1991 | Yokota et al. | |
| 5,075,166 A | 12/1991 | Sikorski et al. | |
| 5,130,833 A | 7/1992 | Mase | |
| 5,458,694 A * | 10/1995 | Nuyen | 136/249 |
| 5,597,631 A | 1/1997 | Furumoto et al. | |
| 5,660,646 A | 8/1997 | Kataoka et al. | |
| 5,757,456 A | 5/1998 | Yamazaki et al. | |
| 5,770,313 A | 6/1998 | Furumoto et al. | |
| 5,821,138 A | 10/1998 | Yamazaki et al. | |
| 5,879,502 A | 3/1999 | Gustafson | |
| 5,942,050 A | 8/1999 | Green et al. | |
| 6,114,005 A | 9/2000 | Nagai et al. | |
| 6,224,965 B1 | 5/2001 | Haas et al. | |
| 6,245,987 B1 * | 6/2001 | Shiomi et al. | 136/244 |
| 6,287,888 B1 | 9/2001 | Sakakura et al. | |
| 6,403,221 B1 | 6/2002 | Nakamura et al. | |
| 6,482,495 B1 | 11/2002 | Kohama et al. | |
| 6,530,147 B1 | 3/2003 | Haas et al. | |
| 6,531,711 B2 | 3/2003 | Sakakura et al. | |
| 6,780,493 B2 | 8/2004 | Noda et al. | |
| 6,805,958 B2 | 10/2004 | Nakamura et al. | |
| 6,809,252 B2 | 10/2004 | Winkeler | |
| 6,926,794 B2 | 8/2005 | Kohama et al. | |
| 7,049,178 B2 | 5/2006 | Kim et al. | |
| 7,061,083 B1 | 6/2006 | Usami et al. | |
| 7,067,392 B2 | 6/2006 | Yamazaki et al. | |
| 7,224,046 B2 | 5/2007 | Abe et al. | |
| 7,298,029 B2 | 11/2007 | Usami et al. | |
| 7,465,674 B2 | 12/2008 | Tamura et al. | |
| 7,485,489 B2 | 2/2009 | Björbell | |
| 7,488,890 B2 | 2/2009 | Takamoto et al. | |
| 7,495,256 B2 | 2/2009 | Yamazaki et al. | |
| 7,736,958 B2 | 6/2010 | Dozen et al. | |
| 7,737,368 B2 | 6/2010 | Kohara et al. | |
| 7,785,933 B2 | 8/2010 | Dozen et al. | |
| 7,906,847 B2 | 3/2011 | Ohtani et al. | |
| 7,968,427 B2 | 6/2011 | Sugiyama et al. | |
| 8,338,931 B2 | 12/2012 | Dozen et al. | |
| 8,552,418 B2 | 10/2013 | Sugiyama et al. | |
| 2001/0010272 A1 | 8/2001 | Otsuka et al. | |
| 2001/0045228 A1 | 11/2001 | Takada et al. | |
| 2002/0002992 A1 | 1/2002 | Kariya et al. | |
| 2002/0029799 A1 | 3/2002 | Yoda | |
| 2002/0045394 A1 | 4/2002 | Noda et al. | |
| 2002/0092558 A1 * | 7/2002 | Kim et al. | 136/244 |
| 2003/0032210 A1 | 2/2003 | Takayama et al. | |
| 2003/0079772 A1 * | 5/2003 | Gittings et al. | 136/251 |
| 2003/0173890 A1 | 9/2003 | Yamazaki | |
| 2004/0016118 A1 | 1/2004 | Haas et al. | |
| 2004/0144420 A1 | 7/2004 | Takeyama et al. | |
| 2005/0218503 A1 | 10/2005 | Abe et al. | |
| 2005/0233122 A1 | 10/2005 | Nishimura et al. | |
| 2006/0105153 A1 | 5/2006 | Jang et al. | |
| 2006/0110863 A1 | 5/2006 | Yamamoto et al. | |
| 2007/0004125 A1 | 1/2007 | Watanabe et al. | |
| 2007/0020932 A1 | 1/2007 | Maruyama et al. | |
| 2007/0054443 A1 | 3/2007 | Shimomura | |
| 2007/0128376 A1 | 6/2007 | Harada et al. | |
| 2007/0278563 A1 | 12/2007 | Takano et al. | |
| 2008/0012126 A1 | 1/2008 | Dozen et al. | |
| 2008/0083954 A1 | 4/2008 | Tokunaga | |
| 2008/0196756 A1 * | 8/2008 | Basol | 136/244 |
| 2008/0196761 A1 | 8/2008 | Nakano et al. | |
| 2008/0224940 A1 | 9/2008 | Sugiyama et al. | |
| 2008/0224941 A1 * | 9/2008 | Sugiyama et al. | 343/873 |
| 2008/0236661 A1 * | 10/2008 | Yao et al. | 136/256 |
| 2008/0242005 A1 | 10/2008 | Dozen et al. | |
| 2008/0264478 A1 | 10/2008 | Ahn et al. | |
| 2008/0303140 A1 * | 12/2008 | Ohtani et al. | 257/729 |
| 2008/0311706 A1 | 12/2008 | Dozen et al. | |
| 2009/0007955 A1 * | 1/2009 | Nakashima et al. | 136/244 |
| 2009/0057875 A1 | 3/2009 | Aoki et al. | |
| 2009/0065590 A1 | 3/2009 | Aoki et al. | |
| 2009/0085182 A1 | 4/2009 | Yamazaki et al. | |
| 2009/0152539 A1 | 6/2009 | Yamazaki et al. | |
| 2009/0223554 A1 * | 9/2009 | Sharps | 136/246 |
| 2009/0314527 A1 | 12/2009 | Hatano et al. | |
| 2010/0006141 A1 | 1/2010 | Oikawa et al. | |
| 2010/0031997 A1 * | 2/2010 | Basol | 136/244 |
| 2010/0171221 A1 | 7/2010 | Chida | |
| 2010/0307558 A1 | 12/2010 | Yamazaki et al. | |
| 2010/0307559 A1 * | 12/2010 | Yamazaki et al. | 136/244 |
| 2011/0233556 A1 | 9/2011 | Sugiyama et al. | |

FOREIGN PATENT DOCUMENTS

| | | |
|---|---|---|
| CN | 101266953 A | 9/2008 |
| EP | 1 092 739 A1 | 4/2001 |
| EP | 1 589 797 A2 | 10/2005 |
| EP | 1 970 951 A2 | 9/2008 |
| EP | 1 976 001 A2 | 10/2008 |
| EP | 2 133 924 A1 | 12/2009 |
| JP | 04-048658 A | 2/1992 |
| JP | 05-190582 A | 7/1993 |
| JP | 05-286065 A | 11/1993 |
| JP | 08-250745 A | 9/1996 |
| JP | 10-092980 A | 4/1998 |
| JP | 10-093122 A | 4/1998 |
| JP | 2001-068701 A | 3/2001 |
| JP | 2001-331120 A | 11/2001 |
| JP | 2003-049388 A | 2/2003 |
| JP | 2003-060214 A | 2/2003 |
| JP | 2003-251765 A | 9/2003 |
| JP | 2004-111557 A | 4/2004 |
| JP | 2004-153028 A | 5/2004 |
| JP | 2004-179560 A | 6/2004 |
| JP | 2004-362341 A | 12/2004 |
| JP | 2008-270562 A | 11/2008 |
| JP | 2008-270761 A | 11/2008 |
| TW | 536063 | 6/2003 |
| TW | 200845325 | 11/2008 |
| WO | 96/09158 A1 | 3/1996 |
| WO | 96/17388 A1 | 6/1996 |
| WO | 2008/099524 A1 | 8/2008 |

OTHER PUBLICATIONS

Written Opinion, PCT Application No. PCT/JP2010/059057, dated Aug. 31, 2010, 3 pages.

Office Action, Chinese Application No. 201080025869.1, dated Jan. 6, 2014, 23 pages with English translation.

Taiwanese Office Action (Application No. 099118174) Dated Apr. 16, 2015.

\* cited by examiner

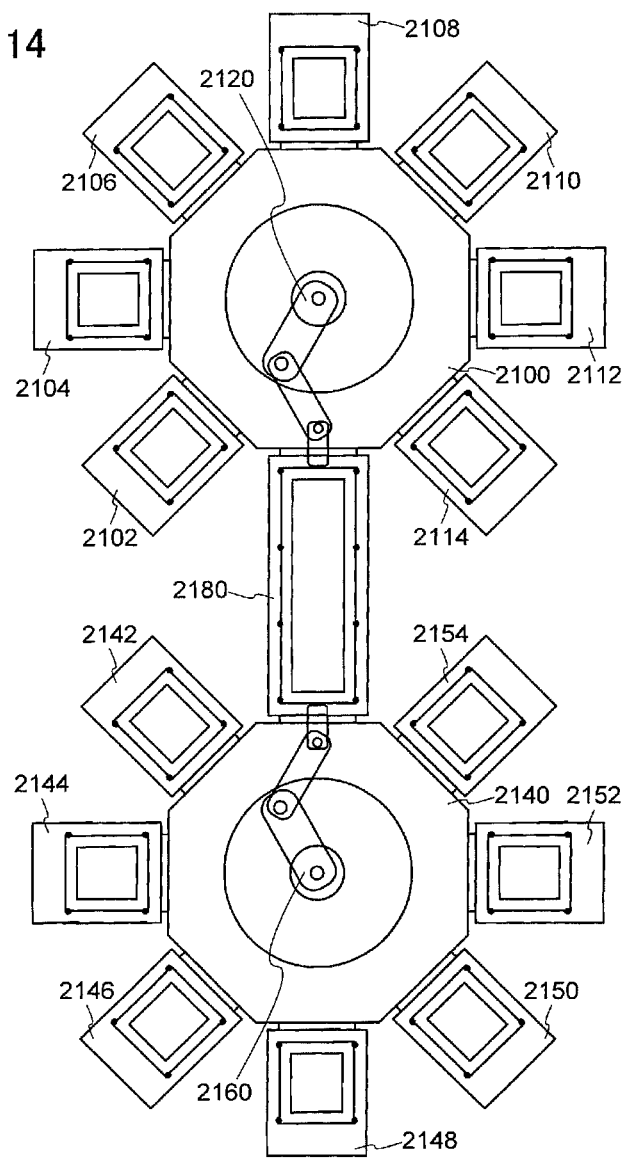

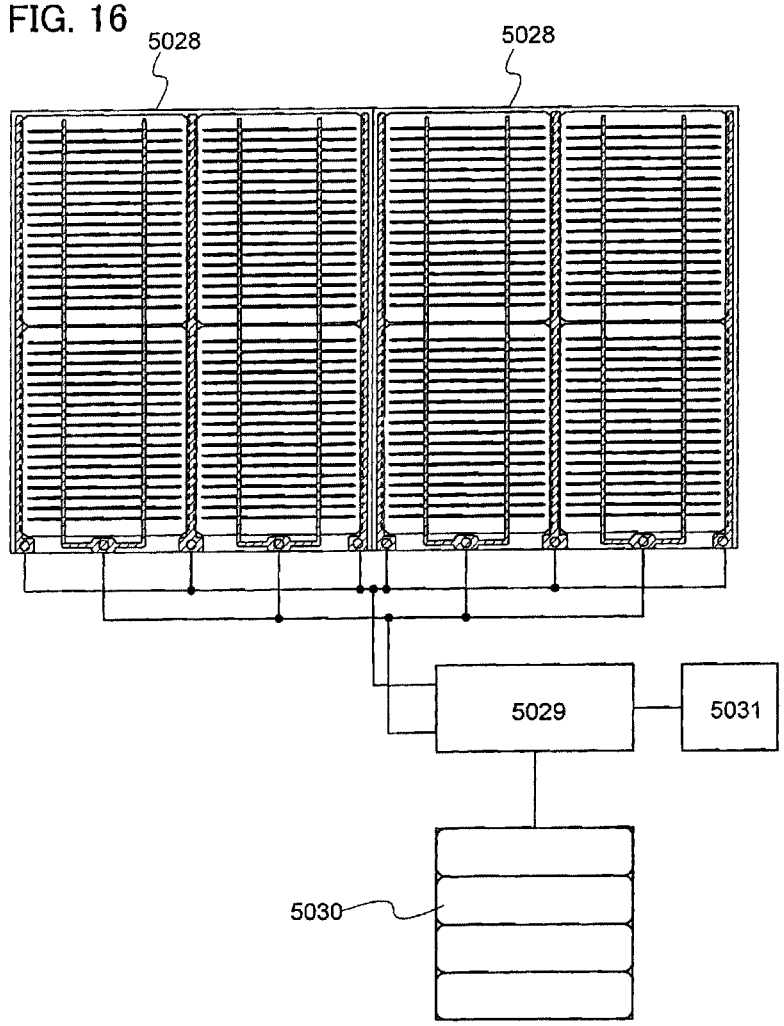

PHOTOELECTRIC CONVERSION DEVICE AND METHOD FOR MANUFACTURING THE SAME

TECHNICAL FIELD

The present invention relates to a photoelectric conversion device which can generate electric energy from light and a method for manufacturing the photoelectric conversion device.

BACKGROUND ART

A solar cell is one kind of photoelectric conversion device which, using a photovoltaic effect, directly converts received light into electric power and outputs the electric power. Unlike a conventional power generation system, a power generation system using the solar cell does not need energy conversion to thermal energy or kinetic energy in the process. Therefore, although fuel is consumed when solar cells are produced or set, the solar cells have an advantage in that the amount of greenhouse gas typified by carbon dioxide or of emission gas containing a toxic substance per electric power generated is remarkably smaller than that of an energy source based on fossil fuel. In addition, the energy of light from the sun which reaches the earth for one hour corresponds to energy that is consumed by humans for one year. Materials that are necessary for production of the solar cells are basically abundant, and for example, there are almost infinite reserves of silicon. Solar photovoltaic power generation has a high possibility to meet the world's energy demand and expected as alternative energy to fossil fuel whose reserves are finite.

A photoelectric conversion device with the use of a semiconductor junction such as a p-n junction or a p-i-n junction can be classified into a single junction type which has one semiconductor junction and a multi-junction type which has a plurality of semiconductor junctions. A multi-junction solar cell in which a plurality of semiconductor junctions whose band gaps are different from each other are disposed so as to overlap with each other in a travel direction of light can convert sunlight including light with a wide wavelength range from ultraviolet rays to infrared rays into electric energy with higher conversion efficiency without waste.

As a method for manufacturing a photoelectric conversion device, for example, a method is proposed in which two substrates each having a p-i-n junction (or a p-n junction) face each other and attached to each other such that the substrates are each located on the outer side, whereby a so-called mechanical stack structure is formed (e.g., Patent Document 1). With such a structure being adopted, a photoelectric conversion device which has no limitation of a manufacturing process due to a stack structure and which has high conversion efficiency can be realized.

REFERENCE

Patent Document

[Patent Document 1] Japanese Published Patent Application No. 2004-111557

DISCLOSURE OF INVENTION

However, it is difficult for the photoelectric conversion device described in Patent Document 1 to adopt a multi-junction stack structure in which semiconductor junctions are connected in series because one p-i-n junction and another p-i-n junction are attached to each other using an insulating resin. Therefore, it becomes difficult to adopt the above structure when larger electromotive force is required. In addition, it is also difficult that three or more semiconductor junctions are stacked so as to be connected in series and thus a further multi-layer structure is formed.

Moreover, the photoelectric conversion device disclosed in Patent Document 1 possibly has problems in the bonding strength or the mechanical strength. In particular, when a flexible substrate is used as a substrate over which a p-i-n junction is formed, it is very important to increase the mechanical strength.

In view of the foregoing problems, it is an object of an embodiment of the invention disclosed herein to provide a multi-junction photoelectric conversion device that can be manufactured by a simple method. In addition, it is another object to provide a photoelectric conversion device whose mechanical strength is increased without complicating a manufacturing process.

According to an embodiment of the invention disclosed herein, a photoelectric conversion device includes a first cell having a photoelectric conversion function; a second cell having a photoelectric conversion function; and a structure body including a fibrous body, which is configured to firmly attach and electrically connect the first cell and the second cell to each other.

According to another embodiment of the invention disclosed herein, a photoelectric conversion device includes a first cell having a photoelectric conversion function, formed over a first substrate; a second cell having a photoelectric conversion function, formed over a second substrate; and a structure body including a fibrous body, which is configured to firmly attach and electrically connect the first cell and the second cell to each other.

According to another embodiment of the invention disclosed herein, in the photoelectric conversion device, the first cell includes a first photoelectric conversion layer interposed between a first conductive film and a second conductive film, and the second cell includes a second photoelectric conversion layer interposed between a third conductive film and a fourth conductive film.

According to another embodiment of the invention disclosed herein, in the photoelectric conversion device, the first photoelectric conversion layer includes a first p-type semiconductor layer and a first n-type semiconductor layer, and the second photoelectric conversion layer includes a second p-type semiconductor layer and a second n-type semiconductor layer.

According to another embodiment of the invention disclosed herein, in the photoelectric conversion device, a first i-type semiconductor layer is provided between the first p-type semiconductor layer and the first n-type semiconductor layer, and a second i-type semiconductor layer is provided between the second p-type semiconductor layer and the second n-type semiconductor layer.

According to another embodiment of the invention disclosed herein, in the photoelectric conversion device, the first substrate and the second substrate are each a substrate having flexibility.

According to another embodiment of the invention disclosed herein, in the photoelectric conversion device, the first cell and the second cell are disposed so as to face each other and sandwich the structure body such that the first substrate and the second substrate are each located on the side opposite to the structure body.

According to another embodiment of the invention disclosed herein, in the photoelectric conversion device, the first cell or the second cell includes any one of amorphous silicon, crystalline silicon, and single crystal silicon.

According to another embodiment of the invention disclosed herein, a method for manufacturing a photoelectric conversion device includes: forming a first cell having a photoelectric conversion function, forming a second cell having a photoelectric conversion function, and firmly attaching and electrically connecting the first cell and the second cell to each other through a structure body including a conductive material and a fibrous body.

According to another embodiment of the invention disclosed herein, a method for manufacturing a photoelectric conversion device includes: forming a first cell having a photoelectric conversion function over a first substrate, forming a second cell having a photoelectric conversion function over a second substrate, and firmly attaching and electrically connecting the first cell and the second cell to each other through a structure body including a conductive material and a fibrous body.

According to another embodiment of the invention disclosed herein, in the method for manufacturing a photoelectric conversion device, a stack structure including a first conductive film, a first photoelectric conversion layer, and a second conductive film is formed as the first cell; and a stack structure including a third conductive film, a second photoelectric conversion layer, and a fourth conductive film is formed as the second cell.

According to another embodiment of the invention disclosed herein, in the method for manufacturing a photoelectric conversion device, the first photoelectric conversion layer is formed by stacking a first p-type semiconductor layer and a first n-type semiconductor layer, and the second photoelectric conversion layer is formed by stacking a second p-type semiconductor layer and a second n-type semiconductor layer.

According to another embodiment of the invention disclosed herein, in the method for manufacturing a photoelectric conversion device, a first i-type semiconductor layer is formed between the first p-type semiconductor layer and the first n-type semiconductor layer, and a second i-type semiconductor layer is formed between the second p-type semiconductor layer and the second n-type semiconductor layer.

According to another embodiment of the invention disclosed herein, in the method for manufacturing a photoelectric conversion device, the first cell is manufactured using the first substrate having flexibility and the second cell is manufactured using the second substrate having flexibility.

According to another embodiment of the invention disclosed herein, in the method for manufacturing a photoelectric conversion device, the first cell and the second cell are attached to each other so as to face each other and sandwich the structure body such that the first substrate and the second substrate are each located on the side opposite to the structure body.

According to another embodiment of the invention disclosed herein, in the method for manufacturing a photoelectric conversion device, the first cell or the second cell is formed using any one of amorphous silicon, crystalline silicon, and single crystal silicon.

According an embodiment of the invention disclosed herein, a multi-junction photoelectric conversion device in which semiconductor junctions are connected in series and sufficient electrical connection between p-i-n junctions is ensured can be provided by a simple method. Accordingly, the photoelectric conversion device can have high performance while its manufacturing cost is controlled.

In addition, according to an embodiment of the invention disclosed herein, one p-i-n junction and another p-i-n junction are attached to each other using a structure body in which a fibrous body is impregnated with an organic resin, that is, a so-called prepreg. Therefore, a photoelectric conversion device whose mechanical strength is increased can be achieved.

BRIEF DESCRIPTION OF DRAWINGS

FIG. 14 is a view illustrating a structure of an apparatus used for manufacturing a photoelectric conversion layer.

FIG. 16 is a view illustrating a structure of a solar photovoltaic system.

BEST MODE FOR CARRYING OUT THE INVENTION

Figure 1:
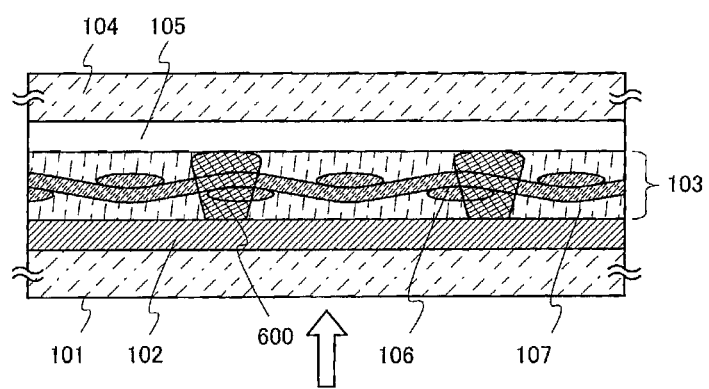
FIG. 1 is a cross-sectional view illustrating a photoelectric conversion device.

Hereinafter, embodiments will be described in detail with reference to the accompanying drawings. Note that the present invention is not limited to the following description, and it is easily understood by those skilled in the art that modes and details thereof can be changed in various ways without departing from the spirit and the scope of the present invention. Therefore, the present invention should not be interpreted as being limited to the following description of the embodiments.

Note that one or more solar cells which are connected to a terminal that is used to extract electric power to the outside correspond to a solar cell module or a solar cell panel. The solar cell module may be reinforced with a protective material such as a resin, tempered glass, or a metal frame in order to protect the cell from moisture, dirt, ultraviolet rays, physical stress, or the like. In addition, a plurality of solar cell modules which are connected in series in order to obtain desired electric power correspond to a solar cell string. Further, a plurality of solar cell strings which are arranged in parallel correspond to a solar cell array. A photoelectric conversion device of the present invention includes, in its category, the cell, the solar cell module, the solar cell string, and the solar cell array. In addition, a photoelectric conversion layer refers to a layer including a semiconductor layer which is used to obtain photoelectromotive force through light irradiation. That is, a photoelectric conversion layer refers to a semiconductor layer which has a photoelectric conversion function due to a semiconductor junction such as a p-n junction or a p-i-n junction.

Note that the size, a region, or the thickness of a layer in each of the structures illustrated in the drawings and the like in embodiments is exaggerated for simplicity in some cases. Therefore, embodiments of the present invention are not limited to such scales.

In this specification, ordinal numbers such as "first", "second", and "third" are used in order to avoid confusion among components, and the terms do not limit the components numerically. In addition, the ordinal numbers in this specification do not denote particular names which specify the present invention.

Embodiment 1

A photoelectric conversion device according to an embodiment of the present invention includes at least two cells. The cells each have a single-layer structure or a stack structure of a photoelectric conversion layer which is the minimum unit having a photoelectric conversion function. Further, the photoelectric conversion device has at least one structure body which is formed in such a manner that a fibrous body is impregnated with a resin and is interposed between the two cells. The structure of the photoelectric conversion device according to an embodiment of the present invention will be described with reference to FIG. 1.

A photoelectric conversion device illustrated in FIG. 1 includes a cell 102 (also referred to as a first cell) supported by a substrate 101 (also referred to as a first substrate), a structure body 103, and a cell 105 (also referred to as a second cell) supported by a substrate 104 (also referred to as a second substrate). The structure body 103 is interposed between the cell 102 and the cell 105. The cell 102 and the cell 105 each have one photoelectric conversion layer or a plurality of photoelectric conversion layers which are stacked. The photoelectric conversion layer included in the cell 102, the structure body 103, and the photoelectric conversion layer included in the cell 105 are sequentially disposed so as to overlap with each other in a travel direction of light which is indicated by an arrow.

The photoelectric conversion layer includes one semiconductor junction. Note that the photoelectric conversion layer which can be used in the photoelectric conversion device of the invention disclosed herein is not always needed to have a semiconductor junction. For example, a dye-sensitization photoelectric conversion layer which obtains photoelectromotive force using an organic dye that absorbs light may also be used.

The structure body 103 includes a fibrous body 106 formed of an organic compound or an inorganic compound. The fibrous body 106 is impregnated with an organic resin 107, so that the structure body 103 can be formed. In addition, the structure body 103 includes a conductive material. By providing a conductor 600 which is the conductive material in the organic resin 107, the cell 102 and the cell 105 can be electrically connected to each other. The structure body 103 including the fibrous body 106 and the conductor 600 is interposed between the cell 102 supported by the substrate 101 and the cell 105 supported by the substrate 104, and thermocompression bonding is performed, whereby the cell 102, the structure body 103, and the cell 105 can be firmly attached to each other. Alternatively, a layer for firmly attaching the cell 102 and the structure body 103 may be provided therebetween, and a layer for firmly attaching the structure body 103 and the cell 105 may be provided therebetween. Further alternatively, the cell 102, the structure body 103, and the cell 105 may be firmly attached to each other in such a manner that, after the fibrous body 106 is formed over one of the cell 102 and the cell 105, the fibrous body 106 is impregnated with the organic resin 107, and then, the conductor 600 is provided to form the structure body 103, and the other of the cell 102 and the cell 105 is formed over the structure body 103. Note that the cell 102 and the cell 105 are disposed so as to face each other and sandwich the structure body 103 such that the substrate 101 and the substrate 104 are each located on the outer side (the side opposite to the structure body 103), whereby a structure in which the cell 102 and the cell 105 are protected by the substrate 101 and the substrate 104, respectively, can be formed, which is preferable.

As the fibrous body 106, a woven fabric or a nonwoven fabric which uses a high-strength fiber of an organic compound or an inorganic compound can be used. A high-strength fiber is specifically a fiber with a high tensile modulus of elasticity or a fiber with a high Young's modulus. By using a high-strength fiber as the fibrous body 106, even when pressure is locally applied to the cell, the pressure is distributed to the entire fibrous body 106, and part of the cell being stretched can be prevented. That is, destruction of a wiring, the cell, or the like which is caused by partial stretching thereof, can be prevented. Further, as the organic resin 107, a thermoplastic resin or a thermosetting resin can be used.

For forming the conductor 600, for example, a conductive paste or the like is used. The conductive paste includes conductive particles in an organic resin which dissolves or distributes the conductive particles and a solvent which dissolves the organic resin 107 before being cured. The conductive paste dissolves the organic resin 107 in the structure body 103 to form the conductor 600. As the conductive particles, metal particles of one or more of silver (Ag), gold (Au), copper (Cu), nickel (Ni), platinum (Pt), palladium (Pd), tantalum (Ta), molybdenum (Mo), titanium (Ti), and the like; fine particles of silver halide; or dispersive nanoparticles can be used.

In FIG. 1, the structure body 103 includes the single layer fibrous body 106. However, a photoelectric conversion device of the invention disclosed herein is not limited to this structure, and two or more layers of fibrous bodies may be stacked in the structure body 103. In particular, when three or more layers of fibrous bodies are used for the structure body 103, reliability of the photoelectric conversion device in terms of resistance to external force, especially pressing force, can be improved in the case where flexible substrates are used for the substrate 101 and the substrate 104. Note that the effect of this structure has been confirmed by experimental results.

The thickness of the structure body 103 is from 10 μm to 100 μm inclusive, preferably from 10 μm to 30 μm inclusive. When flexible substrates are used for the substrate 101 and the substrate 104, by using the structure body 103 having the aforementioned thickness, a thin photoelectric conversion device which can be bent can be manufactured.

Then, the cell 102 supported by the substrate 101 and the cell 105 supported by the substrate 104 will be described. When the photoelectric conversion layers included in the cell 102 and the cell 105 each have a semiconductor junction, the semiconductor junction may be a p-i-n junction or a p-n junction. Each of FIGS. 2A and 2B illustrates an example of a cross-sectional view of a photoelectric conversion device in which a cell 102 and a cell 105 each have a p-i-n junction.

Figure 2A:
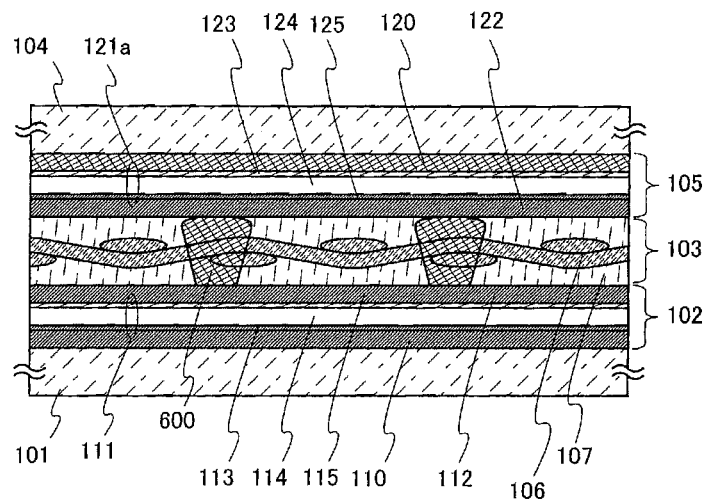
FIGS. 2A and 2B are cross-sectional views each illustrating a photoelectric conversion device.
Figure 2B:
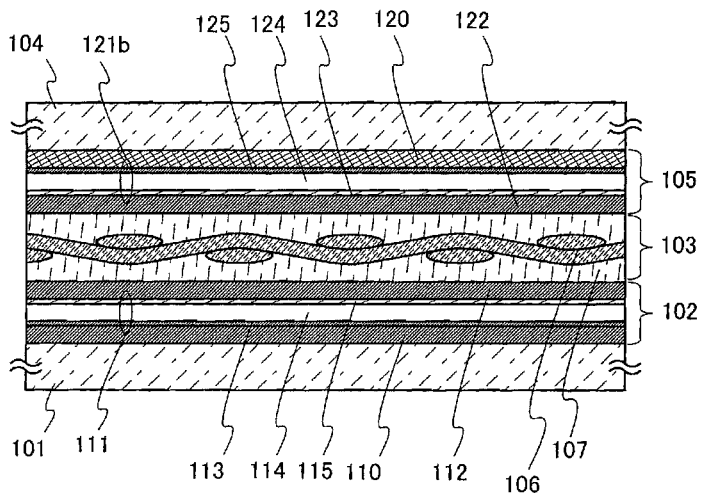

In the photoelectric conversion device illustrated in FIG. 2A, the cell 102 (a first cell) includes a conductive film 110 (also referred to as a first conductive film) serving as an electrode, a photoelectric conversion layer 111 (also referred to as a first photoelectric conversion layer), and a conductive film 112 (also referred to as a second conductive film) serving as an electrode. The conductive film 110, the photoelectric conversion layer 111, and the conductive film 112 are sequentially stacked from the substrate 101 side. The photoelectric conversion layer 111 includes a p-layer 113 (also referred to as a first p-type semiconductor layer), an i-layer 114 (also referred to as a first i-type semiconductor layer), and an n-layer 115 (also referred to as a first n-type semiconductor layer). The p-layer 113, the i-layer 114, and the n-layer 115 are sequentially stacked from the conductive film 110 side, so that a p-i-n junction is formed. In addition, the cell 105 (a second cell) includes a conductive film 120 (also referred to as a third conductive film) serving as an electrode, a photoelectric conversion layer 121a (also referred to as a second photoelectric conversion layer), and a conductive film 122 (also referred to as a fourth conductive layer) serving as an electrode. The conductive film 120, the photoelectric conversion layer 121a, and the conductive film 122 are sequentially stacked from the substrate 104 side. The photoelectric conversion layer 121a includes a p-layer 125 (also referred to as a second p-type semiconductor layer), an i-layer 124 (also referred to as a second i-type semiconductor layer), and an n-layer 123 (also referred to as a second n-type semiconductor layer). The n-layer 123, the i-layer 124, and the p-layer 125 are sequentially stacked from the conductive film 120 side, so that a p-i-n junction is formed.

Note that the p-layer refers to a p-type semiconductor layer, the i-layer refers to an i-type semiconductor layer, and the n-layer refers to an n-type semiconductor layer.

Accordingly, when attention is paid only to the photoelectric conversion layer 111 and the photoelectric conversion layer 121a, the photoelectric conversion device illustrated in FIG. 2A has a structure in which the p-layer 113, the i-layer 114, the n-layer 115, the p-layer 125, the i-layer 124, and the n-layer 123 are sequentially stacked from the substrate 101 side. Therefore, when sufficient electrical connection of the p-i-n junctions is secured through a conductor 600 in a structure body 103, a multi-junction photoelectric conversion device in which semiconductor junctions are connected in series can be obtained, which ensures high performance of the device while the manufacturing cost is controlled.

On the other hand, in the photoelectric conversion device illustrated in FIG. 2B, a p-layer 125, an i-layer 124, and an n-layer 123 included in a photoelectric conversion layer 121b are stacked in the reverse order to that of the photoelectric conversion layer 121a illustrated in FIG. 2A.

Specifically, in the photoelectric conversion device illustrated in FIG. 2B, a cell 102 includes a conductive film 110 serving as an electrode, a photoelectric conversion layer 111, and a conductive film 112 serving as an electrode. The conductive film 110, the photoelectric conversion layer 111, and the conductive film 112 are sequentially stacked from the substrate 101 side. The photoelectric conversion layer 111 includes a p-layer 113, an i-layer 114, and an n-layer 115. The p-layer 113, the i-layer 114, and the n-layer 115 are sequentially stacked from the conductive film 110 side, so that a p-i-n junction is formed. In addition, a cell 105 includes a conductive film 120 serving as an electrode, the photoelectric conversion layer 121b, and a conductive film 122 serving as an electrode. The conductive film 120, the photoelectric conversion layer 121b, and the conductive film 122 are sequentially stacked from the substrate 104 side. The photoelectric conversion layer 121b includes the p-layer 125, the i-layer 124, and the n-layer 123. The p-layer 125, the i-layer 124, and the n-layer 123 are sequentially stacked from the conductive film 120 side, so that a p-i-n junction is formed.

Accordingly, when attention is paid only to the photoelectric conversion layer 111 and the photoelectric conversion layer 121b, the photoelectric conversion device illustrated in FIG. 2B has a structure in which the p-layer 113, the i-layer 114, the n-layer 115, the n-layer 123, the i-layer 124, and the p-layer 125 are sequentially stacked from the substrate 101 side. Therefore, the photoelectric conversion device can have a structure in which the p-i-n junction of the cell 102 and the p-i-n junction of the cell 105 are arranged electrically in parallel without being electrically connected through a conductor 600 in a structure body 103. The structure body 103 includes a fibrous body 106, so that the mechanical strength of the photoelectric conversion device can be increased.

Note that in FIG. 2B, the p-layer 113 is closer to the substrate 101 than the n-layer 115, and the p-layer 125 is closer to the substrate 104 than the n-layer 123; however, the invention disclosed herein is not limited to this structure. In the photoelectric conversion device according to an embodiment of the invention disclosed herein, the n-layer 115 may be closer to the substrate 101 than the p-layer 113, and the n-layer 123 may be closer to the substrate 104 than the p-layer 125.

Note that in the photoelectric conversion devices illustrated in FIGS. 2A and 2B, light may enter from the substrate 101 side or may enter from the substrate 104 side. It is preferable that the p-layer 113 be closer to the light incident side than the n-layer 115. The lifetime of a hole as a carrier is as short as approximately half of the lifetime of an electron as a carrier. When light enters the photoelectric conversion layer 111 having the p-i-n junction, a large amount of electrons and holes are formed in the i-layer 114, and the electrons move to the n-layer 115 side and holes move to the p-layer 113 side, so that electromotive force can be obtained. When light enters from the p-layer 113 side, many electrons and holes are formed in the i-layer 114 in a region closer to the p-layer 113 than the n-layer 115. Accordingly, a distance to the p-layer 113 to which the holes having short lifetime move can be shortened; as a result, high electromotive force can be obtained. For the same reason, the p-layer 125 is preferably closer to the light incident side than the n-layer 123.

The case where the cell 102 and the cell 105 each include one photoelectric conversion layer in each of the photoelectric conversion devices illustrated in FIGS. 2A and 2B is described as an example; however, the invention disclosed herein is not limited to this structure. The cell 102 and the cell 105 may each have a plurality of photoelectric conversion layers or a single photoelectric conversion layer. Note that when the cell 102 has a plurality of photoelectric conversion layers, the plurality of photoelectric conversion layers are sequentially stacked from the substrate 101 side, and a p-layer, an i-layer, and an n-layer in each of the photoelectric conversion layers included in the cell 102 and the cell 105 are stacked in that order so as to be electrically connected in series.

Figure 3A:
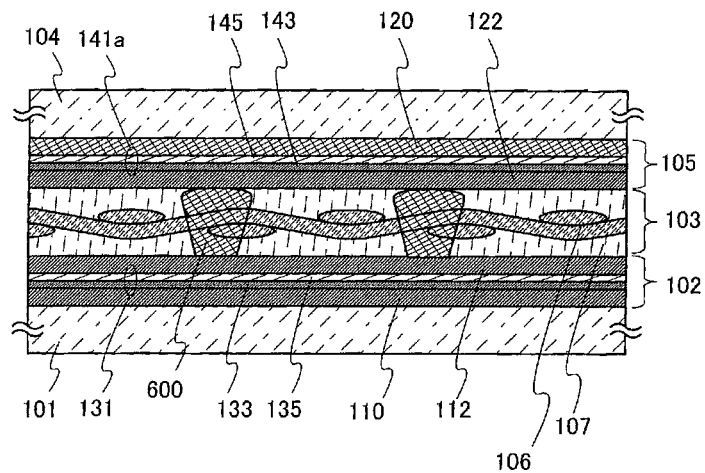
FIGS. 3A and 3B are cross-sectional views each illustrating a photoelectric conversion device.
Figure 3B:
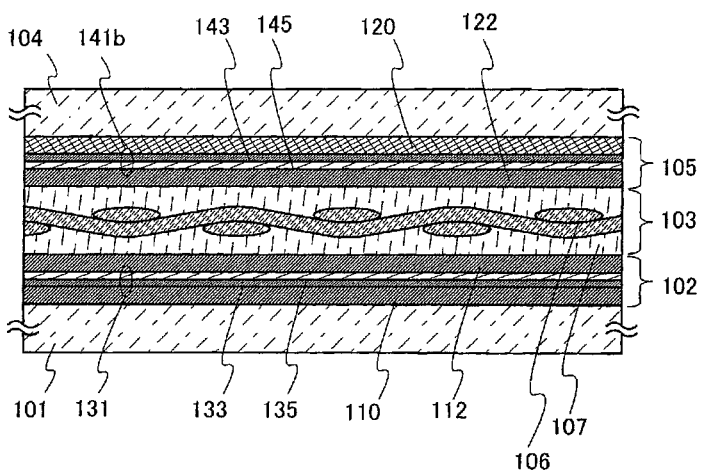

Next, each of FIGS. 3A and 3B illustrates an example of a cross-sectional view of a photoelectric conversion device in which a cell 102 and a cell 105 each have a p-n junction.

In the photoelectric conversion device illustrated in FIG. 3A, the cell 102 includes a conductive film 110 serving as an electrode, a photoelectric conversion layer 131, and a conductive film 112 serving as an electrode. The conductive film 110, the photoelectric conversion layer 131 (also referred to as a first photoelectric conversion layer), and the conductive film 112 are sequentially stacked from the substrate 101 side. The photoelectric conversion layer 131 includes a p-layer 133 and an n-layer 135. The p-layer 133 (also referred to as a first p-type semiconductor layer) and the n-layer 135 (also referred to as a first n-type semiconductor layer) are sequentially stacked from the conductive film 110 side, whereby a p-n junction is formed. In addition, the cell 105 includes a conductive film 120 serving as an electrode, a photoelectric conversion layer 141a (also referred to as a second photoelectric conversion layer), and a conductive film 122 serving as an electrode. The conductive film 120, the photoelectric conversion layer 141a, and the conductive film 122 are sequentially stacked from the substrate 104 side. The photoelectric conversion layer 141a includes a p-layer 143 (also referred to as a second p-type semiconductor layer) and an n-layer 145 (also referred to as a second n-type semiconductor layer). The n-layer 145 and the p-layer 143 are sequentially stacked from the conductive film 120 side, whereby a p-n junction is formed.

When attention is paid only to the photoelectric conversion layer 131 and the photoelectric conversion layer 141a, the photoelectric conversion device illustrated in FIG. 3A has a structure in which the p-layer 133, the n-layer 135, the p-layer 143, and the n-layer 145 are sequentially stacked from the substrate 101 side. Thus, when sufficient electrical connection of the p-n junctions is secured through a conductor 600 in a structure body 103, a multi-junction photoelectric conversion device in which semiconductor junctions are connected in series can be obtained, which ensures high performance of the device while the manufacturing cost is controlled.

On the other hand, in a photoelectric conversion device illustrated in FIG. 3B, a p-layer 143 and an n-layer 145 included in a photoelectric conversion layer 141b are stacked in the reversed order to that of the photoelectric conversion layer 141a illustrated in FIG. 3A.

Specifically, in the photoelectric conversion device illustrated in FIG. 3B, a cell 102 includes a conductive film 110 serving as an electrode, a photoelectric conversion layer 131, and a conductive film 112 serving as an electrode. The conductive film 110, the photoelectric conversion layer 131, and the conductive film 112 are sequentially stacked from the substrate 101 side. The photoelectric conversion layer 131 includes a p-layer 133 and an n-layer 135. The p-layer 133 and the n-layer 135 are sequentially stacked from the conductive film 110 side, so that a p-n junction is formed. In addition, a cell 105 includes a conductive film 120 serving as an electrode, the photoelectric conversion layer 141b, and a conductive film 122 serving as an electrode. The conductive film 120, the photoelectric conversion layer 141b, and the conductive film 122 are sequentially stacked from the substrate 104 side. The photoelectric conversion layer 141b includes a p-layer 143 and an n-layer 145. The p-layer 143 and the n-layer 145 are sequentially stacked from the conductive film 120 side, so that a p-n junction is formed.

Accordingly, when attention is paid only to the photoelectric conversion layer 131 and the photoelectric conversion layer 141b, the photoelectric conversion device illustrated in FIG. 3B has a structure in which the p-layer 133, the n-layer 135, the n-layer 145, and the p-layer 143 are sequentially stacked from the substrate 101 side. Therefore, the photoelectric conversion device can have a structure in which the p-n junction of the cell 102 and the p-n junction of the cell 105 are arranged electrically in parallel without being electrically connected through a conductor 600 in a structure body 103. The structure body 103 includes a fibrous body 106, so that the mechanical strength of the photoelectric conversion device can be increased.

Note that in FIG. 3B, the p-layer 133 is closer to the substrate 101 than the n-layer 135, and the p-layer 143 is closer to the substrate 104 than the n-layer 145; however, the invention disclosed herein is not limited to this structure. In the photoelectric conversion device according to an embodiment of the invention disclosed herein, the n-layer 135 may be closer to the substrate 101 than the p-layer 133, and the n-layer 145 may be closer to the substrate 104 than the p-layer 143.

Note that in the photoelectric conversion devices illustrated in FIGS. 3A and 3B, light may enter from the substrate 101 side or may enter from the substrate 104 side.

In the photoelectric conversion devices illustrated in FIGS. 3A and 3B, the case where the cell 102 and the cell 105 each include one photoelectric conversion layer is described as an example; however, the invention disclosed herein is not limited to this structure. The cell 102 and the cell 105 may each have a plurality of photoelectric conversion layers or a single photoelectric conversion layer. Note that when the cell 102 has a plurality of photoelectric conversion layers, the plurality of photoelectric conversion layers are sequentially stacked from the substrate 101 side, and a p-layer and an n-layer in each of the photoelectric conversion layers included in the cell 102 and the cell 105 are stacked in that order so as to be electrically connected in series.

Figure 4A:
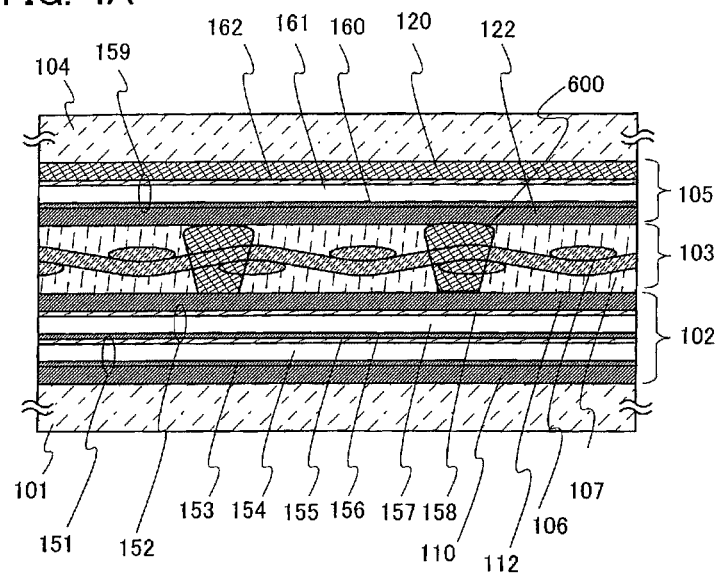
FIGS. 4A and 4B are cross-sectional views each illustrating a photoelectric conversion device.
Figure 4B:
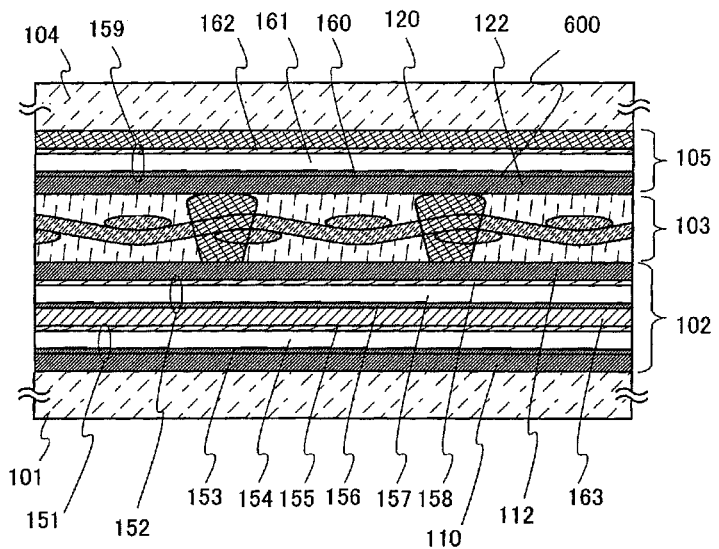

Next, each of FIGS. 4A and 4B illustrates an example of a cross-sectional view of a photoelectric conversion device in which a cell 102 has a plurality of p-i-n junctions.

In the photoelectric conversion device illustrated in FIG. 4A, the cell 102 includes a conductive film 110 serving as an electrode, a photoelectric conversion layer 151 (also referred to as a first photoelectric conversion layer), a photoelectric conversion layer 152 (also referred to as a second photoelectric conversion layer), and a conductive film 112 serving as an electrode. The conductive film 110, the photoelectric conversion layer 151, the photoelectric conversion layer 152, and the conductive film 112 are sequentially stacked from the substrate 101 side. The photoelectric conversion layer 151 includes a p-layer 153 (also referred to as a first p-type semiconductor layer), an i-layer 154 (also referred to as a first i-type semiconductor layer), and an n-layer 155 (also referred to as a first n-type semiconductor layer). The p-layer 153, the i-layer 154, and the n-layer 155 are sequentially stacked from the conductive film 110 side, so that a p-i-n junction is formed. The photoelectric conversion layer 152 includes a p-layer 156 (also referred to as a second p-type semiconductor layer), an i-layer 157 (also referred to as a second i-type semiconductor layer), and an n-layer 158 (also referred to as a second n-type semiconductor layer). The p-layer 156, the i-layer 157, and the n-layer 158 are sequentially stacked from the conductive film 110 side, so that a p-i-n junction is formed.

As described above, a multi-junction cell which includes two photoelectric conversion layers, that is, the photoelectric conversion layer 151 and the photoelectric conversion layer 152 which are stacked is used as the cell 102 in the photoelectric conversion device illustrated in FIG. 4A.

A cell 105 includes a conductive film 120 serving as an electrode, a photoelectric conversion layer 159 (also referred to as a third photoelectric conversion layer), and a conductive film 122 serving as an electrode. The conductive film 120, the photoelectric conversion layer 159, and the conductive film 122 are sequentially stacked from the substrate 104 side. The photoelectric conversion layer 159 includes a p-layer 160 (also referred to as a third p-type semiconductor layer), an i-layer 161 (also referred to as a third i-type semiconductor layer), and an n-layer 162 (also referred to as a third n-type semiconductor layer). The n-layer 162, the i-layer 161, and the p-layer 160 are sequentially stacked from the conductive film 120 side, so that a p-i-n junction is formed. Thus, when sufficient electrical connection of the p-i-n junctions is secured through a conductor 600 in a structure body 103, a multi-junction photoelectric conversion device in which semiconductor junctions are connected in series can be obtained, which ensures high performance of the device while the manufacturing cost is controlled.

Note that in the photoelectric conversion device illustrated in FIG. 4A, the photoelectric conversion layer 151 and the photoelectric conversion layer 152 are directly stacked; however, the invention disclosed herein is not limited to this structure. When the cell has a plurality of photoelectric conversion layers, an intermediate layer with conductivity may be provided between the photoelectric conversion layers.

FIG. 4B illustrates an example of a cross-sectional view of a photoelectric conversion device having an intermediate layer between a photoelectric conversion layer 151 and a photoelectric conversion layer 152. Specifically, in the photoelectric conversion device illustrated in FIG. 4B, a cell 102 includes a conductive film 110 serving as an electrode, a photoelectric conversion layer 151, an intermediate layer 163, a photoelectric conversion layer 152, and a conductive film 112 serving as an electrode. The conductive film 110, the photoelectric conversion layer 151, the intermediate layer 163, the photoelectric conversion layer 152, and the conductive film 112 are sequentially stacked from the substrate 101 side. The photoelectric conversion layer 151 includes a p-layer 153, an i-layer 154, and an n-layer 155. The p-layer 153, the i-layer 154, and the n-layer 155 are sequentially stacked from the conductive film 110 side, so that a p-i-n junction is formed. The photoelectric conversion layer 152 includes a p-layer 156, an i-layer 157, and an n-layer 158. The p-layer 156, the i-layer 157, and the n-layer 158 are sequentially stacked from the conductive film 110 side, so that a p-i-n junction is formed.

The intermediate layer 163 can be formed using a light-transmitting conductive film. Specifically, the intermediate layer 163 can be formed from zinc oxide, titanium oxide, magnesium zinc oxide, cadmium zinc oxide, cadmium oxide, an In—Ga—Zn—O-based amorphous oxide semiconductor such as $InGaO_3ZnO_5$, or the like. Alternatively, a conductive material containing a mixed material of zinc oxide and aluminum nitride (referred to as a Zn—O—Al—N-based conductive material, and there is no particular limitation on the component percentage of each element) may be used. Since the intermediate layer 163 has conductivity, the cell 102 included in the photoelectric conversion device illustrated in FIG. 4B also corresponds to a multi-junction cell which includes two photoelectric conversion layers, that is, the photoelectric conversion layer 151 and the photoelectric conversion layer 152 which are stacked, as illustrated in FIG. 4A. Thus, when sufficient electrical connection of the p-i-n junctions is secured through a conductor 600 in a structure body 103 and the intermediate layer 163, a multi-junction photoelectric conversion device in which semiconductor junctions are connected in series can be obtained, which ensures high performance of the device while the manufacturing cost is controlled.

When attention is paid only to the photoelectric conversion layer 151, the photoelectric conversion layer 152, and the photoelectric conversion layer 159, each of the photoelectric conversion devices illustrated in FIGS. 4A and 4B has a structure in which the p-layer 153, the i-layer 154, the n-layer 155, the p-layer 156, the i-layer 157, the n-layer 158, the p-layer 160, the i-layer 161, and the n-layer 162 are sequentially stacked from the substrate 101 side. However, the invention disclosed herein is not limited to this structure, and the p-layer 160, the i-layer 161, and the n-layer 162 included in the photoelectric conversion layer 159 may be stacked in the reverse order to that in the photoelectric conversion layer 159 illustrated in FIGS. 4A and 4B, in a manner similar to that of the photoelectric conversion devices illustrated in FIG. 2B and FIG. 3B. Alternatively, the p-layer 153, the i-layer 154, and the n-layer 155 included in the photoelectric conversion layer 151, and the p-layer 156, the i-layer 157, and the n-layer 158 included in the photoelectric conversion layer 152 may be stacked in the reverse order to that in the photoelectric conversion layers illustrated in FIGS. 4A and 4B.

Note that in the photoelectric conversion devices illustrated in FIGS. 4A and 4B, light may enter from the substrate 101 side or may enter from the substrate 104 side. It is preferable that the p-layer 153 be closer to the light incident side than the n-layer 155. The lifetime of a hole as a carrier is as short as approximately half of the lifetime of an electron as a carrier. When light enters the photoelectric conversion layer 151 having the p-i-n junction, a large amount of electrons and holes are formed in the i-layer 154, and the electrons move to the n-layer 155 side and holes move to the p-layer 153 side, so that electromotive force can be obtained. Accordingly, when light enters from the p-layer 153 side, many electrons and holes are formed in the i-layer 154 in a region closer to the p-layer 153 than the n-layer 155. Therefore, a distance to the p-layer 153 to which the holes having short lifetime move can be shortened; as a result, high electromotive force can be obtained. For the same reason, the p-layer 156 is preferably closer to the light incident side than the n-layer 158 and the p-layer 160 is preferably closer to the light incident side than the n-layer 162.

In each of FIGS. 4A and 4B, the case where the cell 102 has two photoelectric conversion layers is illustrated as an example; however, the cell 102 may have three or more photoelectric conversion layers. In each of FIGS. 4A and 4B, the case where the cell 105 has one photoelectric conversion layer is illustrated as an example; however, the cell 105 may have a plurality of photoelectric conversion layers in a manner similar to that of the cell 102. Note that a plurality of photoelectric conversion layers in each cell are sequentially stacked, and a p-layer, an i-layer, and an n-layer in each of the photoelectric conversion layers included in the cell 102 and the cell 105 are stacked in that order so as to be electrically connected in series. When a plurality of photoelectric conversion layers are connected in series in this manner, higher electromotive force can be obtained.

Note that light with a short wavelength has higher energy than light with a long wavelength. Accordingly, of the photoelectric conversion layer included in the cell 102 and the photoelectric conversion layer included in the cell 105 in each of the photoelectric conversion devices illustrated in FIG. 1, FIGS. 2A and 2B, FIGS. 3A and 3B, and FIGS. 4A and 4B, the photoelectric conversion layer which performs photoelectric conversion utilizing light in the short wavelength range is placed closer to the light incident side, so that a loss of light in the short wavelength range in the photoelectric conversion device can be suppressed and conversion efficiency can be increased.

In each of the photoelectric conversion devices illustrated in FIG. 1, FIGS. 2A and 2B, FIGS. 3A and 3B, and FIGS. 4A and 4B, the substrate 101 and the substrate 104 can be formed using a glass substrate of soda-lime glass, opaque glass, lead glass, tempered glass, ceramic glass, or the like. Further, a non-alkali glass substrate of aluminosilicate glass, barium borosilicate glass, aluminoborosilicate glass, or the like; a quartz substrate; a ceramic substrate; or a metal substrate of stainless steel or the like can be used as well. There is a tendency that a flexible substrate formed using a synthetic resin such as plastics generally has a lower upper temperature limit than the above substrates; however, such a substrate can also be used as long as it can withstand processing temperature in manufacturing steps. Note that an anti-reflective film may be provided on a light incident surface of the substrate 101 and the substrate 104. For example, a titanium oxide film or a titanium oxide film to which at least one metal element selected from copper, manganese, nickel, cobalt, iron, and zinc is added can be provided as the anti-reflective film. This anti-reflective film can be formed in such a manner that an organic solvent containing titanium oxide or containing the metal element and titanium oxide is applied to a glass substrate, and baking is performed at a temperature of from 60° C. to 300° C. in accordance with the kind of the substrate, so that a film with a surface having unevenness (also referred to as simply projections and depressions, an uneven portion, or a texture structure) in which the height difference between the top of the projection and the bottom of the depression is 10 nm to 20 nm can be formed. Such an anti-reflective film provided on a light incident surface of the glass substrate acts in such a way that reflection of incident light and adhesion of suspended particles (dust or the like) with a size of from approximately 2 μm to 10 μm are reduced and the conversion efficiency of the photoelectric conversion device is improved.

In addition, as a plastic substrate, a substrate including any of the following materials can be used: polyester typified by polyethylene terephthalate (PET), polyether sulfone (PES), polyethylene naphthalate (PEN), polycarbonate (PC), a polyamide synthetic resin, polyether etherketone (PEEK), polysulfone (PSF), polyether imide (PEI), polyarylate (PAR), polybutylene terephthalate (PBT), polyimide, an acrylonitrile butadiene styrene resin, poly vinyl chloride, polypropylene, poly vinyl acetate, an acrylic resin, and the like.

The p-layers, the i-layers, and the n-layers included in the photoelectric conversion layers may be formed using a semiconductor having crystallinity such as a single crystal semiconductor, a polycrystalline semiconductor, or a microcrystalline semiconductor, or may be formed using an amorphous semiconductor. Silicon, silicon germanium, germanium, silicon carbide, or the like can be used as the photoelectric conversion layers.

Note that a microcrystalline semiconductor is a semiconductor having an intermediate structure between amorphous and crystalline structures (including single crystal and polycrystal). The microcrystalline semiconductor is a semiconductor having a third state which is stable in terms of free energy. For example, the microcrystalline semiconductor is a semiconductor having a crystal grain with a size of from 2 nm to 200 nm inclusive, preferably from 10 nm to 80 nm inclusive, more preferably from 20 nm to 50 nm inclusive. The Raman spectrum of microcrystalline silicon, which is a typical example of a microcrystalline semiconductor, is shifted to a shorter wavelength side than 520 cm$^{-1}$, which represents the Raman spectrum of single crystal silicon. That is, the peak of the Raman spectrum of microcrystalline silicon is within the range of from 520 cm$^{-1}$ which represents single crystal silicon, to 480 cm$^{-1}$ which represents amorphous silicon. In addition, microcrystalline silicon contains hydrogen or halogen of at least 1 at. % in order to terminate a dangling bond. Moreover, the microcrystalline semiconductor may contain a rare gas element such as helium, argon, krypton, or neon to further promote lattice distortion, so that stability is increased and a favorable microcrystalline semiconductor can be obtained. Such a microcrystalline semiconductor has lattice distortion which changes the optical characteristics from the indirect transition of single crystal silicon into the direct transition. At least 10% of lattice distortion makes the optical characteristics change into the direct transition. When distortion exits locally, the optical characteristics in which the direct transition and the indirect transition are mixed can be obtained.

The semiconductor used for the i-layer is a semiconductor in which an impurity element imparting p-type or n-type conductivity is contained at a concentration of less than or equal to $1 \times 10^{20}/cm^3$, oxygen and nitrogen are contained at a concentration of less than or equal to $9 \times 10^{19}/cm^3$, and photoconductivity is at least 100 times as high as the dark conductivity, for example. The i-layer may contain boron at 1 ppm to 1000 ppm. The i-layer sometimes has weak n-type conductivity when an impurity element for controlling valence electrons is not added intentionally. This phenomenon remarkably appears when the i-layer is formed using an amorphous semiconductor. Accordingly, when a photoelectric conversion layer having a p-i-n junction is formed, an impurity element imparting p-type conductivity may be added to the i-layer at the same time as or after film formation. As the impurity element imparting p-type conductivity, boron can be typically used, and an impurity gas such as $B_2H_6$ or $BF_3$ may be mixed at 1 ppm to 1000 ppm into a semiconductor source gas. The concentration of boron may be, for example, from $1 \times 10^{14}/cm^3$ to $6 \times 10^{16}/cm^3$.

Alternatively, when the i-layer is formed after the p-layer is formed, the impurity element imparting p-type conductivity included in the p-layer can be diffused into the i-layer. With this structure, even when the impurity element imparting p-type conductivity is not added to the i-layer intentionally, valence electrons of the i-layer can be controlled.

It is preferable that a layer on the light incident side be formed using a material having a small light absorption coefficient. For example, silicon carbide has a smaller light absorption coefficient than silicon. Accordingly, when silicon carbide is used for the p-layer or the n-layer which is a layer closer to the light incident side, the amount of incident light which reaches the i-layer can be increased; as a result, electromotive force of a solar cell can be raised.

For the photoelectric conversion layers of the cell 102 and the cell 105, a material such as silicon or germanium can be used; however, the invention disclosed herein is not limited thereto. For example, as the cell 102 or the cell 105, a cell in which Cu, In, Ga, Al, Se, S, or the like is used for the photoelectric conversion layer and which is referred to as a CIS, GIGS, or chalcopyrite cell may be used. Alternatively, a CdTe—CdS cell with the use of a Cd compound for the photoelectric conversion layer may be used for the cell 102 or the cell 105. An organic-based cell with the use of an organic-based material for the photoelectric conversion layer like a dye-sensitization cell or an organic semiconductor cell may also be used for the cell 102 or the cell 105.

If light enters the photoelectric conversion device from the substrate 101 side, a transparent conductive material having a light-transmitting property, specifically, indium oxide, an alloy of indium tin oxide (ITO), zinc oxide, or the like is used for the conductive film 110 and the conductive film 112 in the cell 102 supported by the substrate 101. Alternatively, a Zn—O—Al—N-based conductive material may be used. In addition, as for the cell 105 supported by the substrate 104, a transparent conductive material having a light-transmitting property is used for the conductive film 122 which is closer to a light source than the conductive film 120, in a manner similar to that of the conductive film 110 and the conductive film 112. In the cell 105 supported by the substrate 104, a conductive material which easily reflects light, specifically, aluminum, silver, titanium, tantalum, or the like is used for the conductive film 120 which is more distant from the light source than the conductive film 122. Note that a transparent conductive material as described above may also be used for the conductive film 120. In this case, a film (a reflective film) with which light that passes through the cell 105 can be reflected to the cell 105 side is preferably formed on the substrate 104. For the reflective film, it is preferable to use a material which easily reflects light, such as aluminum, silver, titanium, or tantalum.

In the case where the conductive film 120 is formed using a conductive material which easily reflects light, by formation of unevenness on the surface which is in contact with the photoelectric conversion layer, light is reflected diffusely on the surface of the conductive film 120; therefore, the light absorptance of the photoelectric conversion layer can be increased and conversion efficiency can be raised. In a similar manner, in the case where a reflective film is formed, when the surface of the reflective film from which light enters is made uneven, conversion efficiency can be raised.

Note that as the transparent conductive material, a conductive high molecular material (also referred to as conductive polymer) can be used instead of metal oxide such as indium oxide. As the conductive high molecular material, a π-electron conjugated high molecule can be used. For example, polyaniline and/or a derivative thereof, polypyrrole and/or a derivative thereof, polythiophene and/or a derivative thereof, a copolymer of two or more kinds of those materials, and the like can be given.

In addition, the organic resin 107 in the structure body 103 has a light-transmitting property and is formed using a material which can ensure light transmittance between the cell 102 and the cell 105. As the organic resin 107, a thermosetting resin such as an epoxy resin, an unsaturated polyester resin, a polyimide resin, a bismaleimide-triazine resin, or a cyanate resin can be used, for example. Alternatively, a thermoplastic resin such as a polyphenylene oxide resin, a polyetherimide resin, or a fluorine resin can be used as the organic resin 107.

Further alternatively, a plurality of resins selected from the above-described thermosetting resin and thermoplastic resin may be used as the organic resin 107. When the above-described organic resin is used, the fibrous body 106 can be firmly attached to the cell 102 and the cell 105 by heat treatment. Note that as the glass transition point of the organic resin 107 is higher, the mechanical strength of the cell 102 and the cell 105 with respect to local pressing force can be increased, which is preferable.

High-thermal conductive filler may be dispersed in the organic resin 107 or yarn bundles of the fibrous body 106. As the high-thermal conductive filler, aluminum nitride, boron nitride, silicon nitride, alumina, and the like can be given. As the high-thermal conductive filler, a metal particle of silver, copper, or the like can also be given. When the conductive filler is included in the organic resin or the yarn bundles of fibers, heat generated in the cell 102 and the cell 105 can be easily released to the outside. Accordingly, thermal storage in the photoelectric conversion device can be suppressed, and thus, the photoelectric conversion efficiency can be prevented from being reduced and the photoelectric conversion device can be prevented from being damaged.

The fibrous body 106 is a woven fabric or a nonwoven fabric which uses a high-strength fiber of an organic compound or an inorganic compound and disposed so as to overlap with the cell 102 and the cell 105. A high-strength fiber is specifically a fiber with a high tensile modulus of elasticity or a fiber with a high Young's modulus. As typical examples of a high-strength fiber, a polyvinyl alcohol fiber, a polyester fiber, a polyamide fiber, a polyethylene fiber, an aramid fiber, a polyparaphenylenebenzobisoxazole fiber, a glass fiber, a carbon fiber, and the like can be given. As a glass fiber, there is a glass fiber using E glass, S glass, D glass, Q glass, or the like. Note that the fibrous body 106 may be formed using one or more of the above high-strength fibers.

Alternatively, the fibrous body 106 may be a woven fabric formed using bundles of fibers (single yarns) (hereinafter referred to as yarn bundles) for warp yarns and weft yarns, or a nonwoven fabric obtained by stacking yarn bundles of plural kinds of fibers in a random manner or in one direction. In the case of a woven fabric, a plain-woven fabric, a twilled fabric, a satin-woven fabric, or the like can be used as appropriate.

The yarn bundle may have a circular shape or an elliptical shape in cross section. As the yarn bundle of fibers, a yarn bundle of fibers may be used which has been subjected to fiber opening with a high-pressure water stream, high-frequency vibration using liquid as a medium, continuous ultrasonic vibration, pressing with a roller, or the like. A yarn bundle of fibers which has been subjected to fiber opening has a larger width, has a smaller number of single yarns in the thickness direction, and has an elliptical shape or a rectangular shape in cross section. Further, with the use of a loosely twisted yarn as the yarn bundle of fibers, the yarn bundle is easily flattened to have an elliptical shape or a rectangular shape in cross section. Using a yarn bundle having an elliptical shape or a rectangular shape in cross section in this manner can reduce the thickness of the fibrous body 106. Accordingly, the thickness of the structure body 103 can be reduced, and thus, a thin photoelectric conversion device can be manufactured. The diameter of the yarn bundle of fibers is set to from 4 μm to 400 μm inclusive (preferably from 4 μm to 200 μm inclusive), whereby the effect of sufficiently preventing destruction of the photoelectric conversion device due to pressing force can be obtained. Also when the diameter is much smaller, this effect can be obtained in principle. The specific diameter of the fiber is not limited to the above range of numeric values since it depends on the material of the fiber.

In the drawings, the fibrous body 106 is shown as a woven fabric which is plain-woven using a yarn bundle having an elliptical shape in cross section.

Figure 5A:
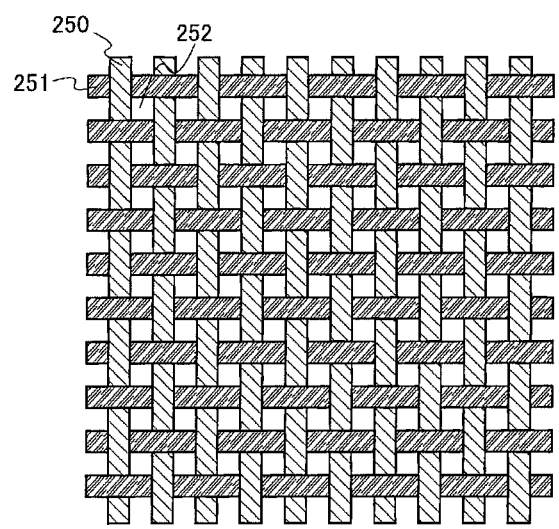
FIGS. 5A and 5B are top views each illustrating a fibrous body.
Figure 5B:
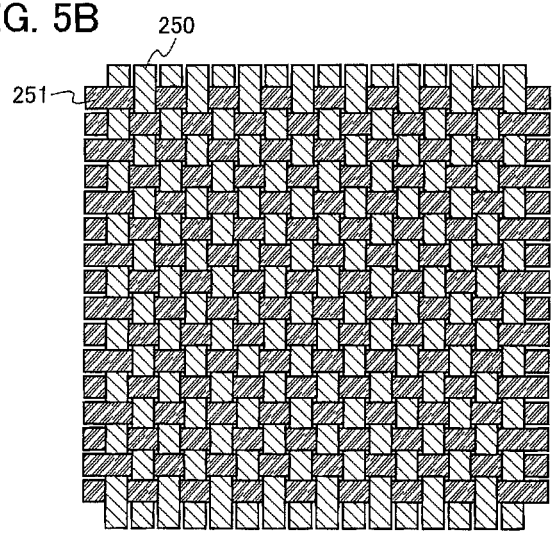

FIGS. 5A and 5B are each a top view of the fibrous body 106 which is a woven fabric formed using yarn bundles of fibers for the warp yarns and the weft yarns.

As illustrated in FIG. 5A, the fibrous body 106 is woven using warp yarns 250 spaced regularly and weft yarns 251 spaced regularly. Such a fibrous body 106 formed using the warp yarns 250 and the weft yarns 251 has regions (basket holes 252) without the warp yarns 250 and the weft yarns 251. Such a fibrous body 106 can be impregnated with the organic resin 107 with a higher percentage, so that the fibrous body 106, the cell 102, and the cell 105 can firmly adhere to each other.

As illustrated in FIG. 5B, in the fibrous body 106, the density of the warp yarns 250 and the weft yarns 251 may be high and the area of the basket hole 252 may be small. Typically, the basket hole 252 preferably has an area smaller than the area of a locally pressed portion and a rectangular shape having a side with a length of from 0.01 mm to 0.2 mm inclusive. When the basket hole 252 in the fibrous body 106 has such a small area, pressure can be absorbed by the entire fibrous body 106 even if the fibrous body 106 is pressed by a member with a sharp tip, whereby the mechanical strength of the cell can be effectively increased.

Further, in order to enhance permeability of the organic resin into the inside of the yarn bundle of fibers, the yarn bundle of fibers may be subjected to surface treatment. For example, as the surface treatment, corona discharge treatment, plasma discharge treatment, or the like for activating the surface of the fiber can be given. Further, surface treatment using a silane coupling agent or a titanate coupling agent can be given.

In the structure body 103 used in the invention disclosed herein, a high-strength fiber with a high tensile modulus of elasticity or a high Young's modulus is used as the fibrous body 106. Accordingly, even when local pressure such as point pressure or linear pressure is applied, pressing force is dispersed throughout the fibrous body 106. Therefore, crack and the like of the photoelectric conversion layer, the conductive film, and the intermediate layer included in the cell, a wiring connecting the cells, and the like are prevented, and thus, the mechanical strength of the photoelectric conversion device can be increased.

In the photoelectric conversion device according to an embodiment of the invention disclosed herein, the structure body in which the fibrous body is impregnated with the organic resin, that is, a so-called prepreg, is provided between the plurality of cells, whereby the mechanical strength of the photoelectric conversion device with respect to pressing force can be increased and the reliability thereof can be enhanced while entry of light into the cell is ensured. Further, by connecting the plurality of cells in series, the photoelectric conversion device can have higher electromotive force than in the case of using a single cell. When a plurality of cells which absorb light with various wavelengths are used, the photoelectric conversion device which can convert sunlight including light in a wide range of wavelengths from ultraviolet rays to infrared rays into electric energy with higher conversion efficiency without waste can be formed in a simpler process.

In addition, different kinds of cells which are hard to be successively formed over one substrate in terms of a process can be stacked in the travel direction of light in a simpler process. Thus, the photoelectric conversion device in which a plurality of cells which absorb light with various wavelengths can overlap with each other and which can convert sunlight including light in a wide range of wavelengths from ultraviolet rays to infrared rays into electric energy with higher conversion efficiency without waste can be formed in a simpler process. Therefore, a production cost of manufacturing photoelectric conversion devices can be controlled.

Embodiment 2

In this embodiment, a method for manufacturing a photoelectric conversion device of the invention disclosed herein will be described using the photoelectric conversion device illustrated in FIG. 2A as an example.

Figure 6A:
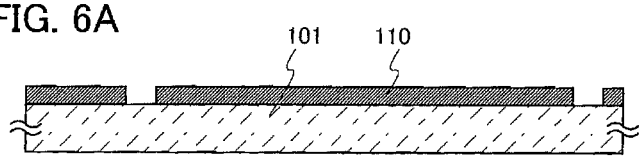
FIGS. 6A to 6D are views illustrating a method for manufacturing a photoelectric conversion device.

First, formation of the cell 102 over the substrate 101 will be described. As illustrated in FIG. 6A, the conductive film 110 which is patterned (processed in a predetermined shape) is formed over the substrate 101. In this embodiment, since the photoelectric conversion device in which light enters from the substrate 101 side is described as an example, it is preferable that the substrate 101 have a light-transmitting property with respect to visible light. For example, the substrate 101 can be formed using any of various commercial glass plates of soda-lime glass, opaque glass, lead glass, tempered glass, ceramic glass, and the like. Further, a non-alkali glass substrate of aluminosilicate glass, barium borosilicate glass, aluminoborosilicate glass, or the like; a quartz substrate; or a ceramic substrate can be used as well. There is a tendency that a flexible substrate (plastic substrate) formed using a synthetic resin such as plastics generally has a lower upper temperature limit than the above substrates; however, such a substrate can also be used as long as it can withstand processing temperature in manufacturing steps.

As a plastic substrate, polyester typified by polyethylene terephthalate (PET); polyethersulfone (PES); polyethylene naphthalate (PEN); polycarbonate (PC); a polyamide synthetic fiber; polyetheretherketone (PEEK); polysulfone (PSF); polyetherimide (PEI); polyarylate (PAR); polybutylene terephthalate (PBT); polyimide; an acrylonitrile butadiene styrene resin; polyvinyl chloride; polypropylene; polyvinyl acetate; an acrylic resin; and the like can be given.

In this embodiment, since the photoelectric conversion device in which light enters from the substrate 101 side is described as an example, the conductive film 110 can be formed using a light-transmitting conductive material with respect to visible light, for example, indium tin oxide (ITO), indium tin oxide containing silicon oxide (ITSO), organoimdium, organotin, zinc oxide (ZnO), indium oxide containing zinc oxide (indium zinc oxide (IZO)), ZnO doped with gallium (Ga), tin oxide ($SnO_2$), indium oxide containing tungsten oxide, indium zinc oxide containing tungsten oxide, indium oxide containing titanium oxide, or indium tin oxide containing titanium oxide. Alternatively, as the light-transmitting conductive material, a conductive high molecular material (also referred to as conductive polymer) can be used. As the conductive high molecular material, a π-electron conjugated high molecule can be used. For example, polyaniline and/or a derivative thereof, polypyrrole and/or a derivative thereof, polythiophene and/or a derivative thereof, a copolymer of two or more kinds of those materials, and the like can be given.

The conductive film 110 is formed so as to have a thickness of from 40 nm to 800 nm, preferably from 400 nm to 700 nm. In addition, the sheet resistance of the conductive film 110 may be approximately 20 Ω/square to 200 Ω/square.

In this embodiment, a substrate manufactured by Asahi Glass Co., Ltd. (product name: Asahi-U) in which a 150-nmthick silicon oxide film and an approximately-600-nm-thick conductive film whose surface has unevenness with the use of tin oxide are sequentially stacked over the substrate 101 of soda-lime glass having a thickness of 1.1 mm is used. Then, the conductive film is patterned, so that the conductive film 110 which electrically connects a plurality of photoelectric conversion layers formed later can be formed. Note that the conductive film 110 can be formed by an evaporation method with the use of a metal mask, a droplet discharge method, or the like, in addition to a method for patterning the conductive film using etching, a laser, or the like. Note that a droplet discharge method refers to a method in which droplets containing a predetermined composition are discharged or ejected from fine pores to form a predetermined pattern, and includes an ink-jet method and the like in its category.

When the surface of the conductive film 110 on the photoelectric conversion layer 111 side has unevenness, light is refracted or is reflected diffusely on the conductive film 110; therefore, light absorptance of the photoelectric conversion layer 111 can be increased and conversion efficiency can be raised.

Next, the photoelectric conversion layer 111 in which the p-layer 113, the i-layer 114, and the n-layer 115 are sequentially stacked is formed over the conductive film 110. Note that before the photoelectric conversion layer 111 is formed, brush cleaning, specifically, cleaning with the use of a polyvinyl alcohol (PVA)-based porous material or the like may be performed and a foreign substance may be removed in order to improve cleanliness of the surface of the conductive film 110. In addition, the surface may be cleaned using a chemical solution containing hydrofluoric acid or the like. In this embodiment, the surface of the conductive film 110 is cleaned using the polyvinyl alcohol (PVA)-based porous material, and then, the surface of the conductive film 110 is cleaned using a hydrogen fluoride solution of 0.5%.

The p-layer 113, the i-layer 114, and the n-layer 115 can be formed using an amorphous semiconductor, a polycrystalline semiconductor, a microcrystalline semiconductor, or the like by a sputtering method, an LPCVD method, a plasma CVD method, or the like. It is preferable that the p-layer 113, the i-layer 114, and the n-layer 115 be formed in succession without being exposed to the atmosphere in order to prevent dust or the like from being attached to their interfaces.

Alternatively, single crystal semiconductor thin films formed using an SOI method may be used as the p-layer 113, the i-layer 114, and the n-layer 115. When a single crystal semiconductor thin film is used, the photoelectric conversion layer 111 has a small number of crystal defects which become a factor for inhibiting transport of carriers; therefore, conversion efficiency can be raised.

In this embodiment, an amorphous semiconductor containing silicon carbide, an amorphous semiconductor containing silicon, and a microcrystalline semiconductor containing silicon are used for the p-layer 113, the i-layer 114, and the n-layer 115, respectively.

The amorphous semiconductor containing silicon carbide can be obtained by glow discharge decomposition of a gas containing carbon and a gas containing silicon. As the gas containing carbon, $CH_4$, $C_2H_6$, and the like can be given. As the gas containing silicon, $SiH_4$, $Si_2H_6$, and the like can be given. The gas containing silicon may be diluted with hydrogen or hydrogen and helium. When boron, for example, is used as an impurity element imparting p-type conductivity, borane, diborane, boron trifluoride, or the like is added to the gas containing carbon and the gas containing silicon, so that the amorphous semiconductor can have p-type conductivity. Specifically in this embodiment, the p-layer 113 having a thickness of 10 nm is formed using a p-type amorphous semiconductor containing silicon carbide by a plasma CVD method under the following conditions: the flow rates of methane, monosilane, hydrogen, and diborane are 18 sccm, 6 sccm, 150 sccm, and 40 sccm, respectively; the reaction pressure is 67 Pa; the substrate temperature is 250° C.; and a high frequency of 13.56 MHz is used.

The amorphous semiconductor containing silicon can be obtained by glow discharge decomposition of the aforementioned gas containing silicon. Specifically in this embodiment, the i-layer 114 having a thickness of 60 nm is formed using an amorphous semiconductor containing silicon by a plasma CVD method under the following conditions: the flow rates of monosilane and hydrogen are each 25 sccm; the reaction pressure is 40 Pa; the substrate temperature is 250° C.; and a high frequency of 60 MHz is used.

Note that before the i-layer 114 is formed, plasma treatment using hydrogen is performed on the surface of the p-layer 113, whereby the number of crystal defects at the interface between the p-layer 113 and the i-layer 114 can be reduced and conversion efficiency can be raised. Specifically in this embodiment, plasma treatment is performed on the surface of the p-layer 113 under the following conditions: the flow rate of hydrogen is 175 sccm, the reaction pressure is 67 Pa, the substrate temperature is 250° C., and a high frequency of 13.56 MHz is used. In the plasma treatment, argon may be added to hydrogen. When argon is added, the flow rate thereof can be 60 sccm, for example.

The microcrystalline semiconductor containing silicon can be formed by a high-frequency plasma CVD method with a frequency of several tens to several hundreds of megahertz or a microwave plasma CVD apparatus with a frequency of greater than or equal to 1 GHz. Typically, when silicon hydride such as silane or disilane, silicon fluoride, or silicon chloride is diluted with hydrogen and used as a source gas, a microcrystalline semiconductor film can be formed. Further, silicon hydride, silicon fluoride, or silicon chloride may be diluted with hydrogen and one or more kinds of rare gases selected from helium, argon, krypton, and neon. The flow rate ratio of hydrogen to the compound containing silicon, such as silicon hydride, is set to be 5:1 to 200:1, preferably 50:1 150:1, more preferably 100:1. When phosphorus, for example, is used as an impurity element imparting n-type conductivity, phosphine or the like may be added to a silicon-containing gas, so that a microcrystalline semiconductor can have n-type conductivity. Specifically in this embodiment, the n-layer 115 having a thickness of 10 nm is formed using an amorphous semiconductor containing silicon by a plasma CVD method under the following conditions: the flow rates of monosilane, hydrogen, and phosphine are 5 sccm, 950 sccm, and 40 sccm, respectively; the reaction pressure is 133 Pa; the substrate temperature is 250° C.; and a high frequency of 13.56 MHz is used.

Note that in the case where indium tin oxide is used for the conductive film 110, when the p-layer 113 which is an amorphous semiconductor is directly formed over the conductive film 110, hydrogen reduces indium tin oxide in the conductive film 110 when the p-layer 113 is formed, which could lead to deterioration of film quality of the conductive film 110. When indium tin oxide is used for the conductive film 110, in order to prevent indium tin oxide from being reduced, a film in which a conductive film with a thickness of several tens of nanometers using tin oxide or using a conductive material containing a mixed material of zinc oxide and aluminum nitride is stacked over the conductive film using indium tin oxide is preferably used as the conductive film 110.

As a semiconductor material used for the photoelectric conversion layer 111, germanium, or a compound semiconductor such as gallium arsenide, indium phosphide, zinc selenide, gallium nitride, or silicon germanium can be used, in addition to silicon or silicon carbide.

The photoelectric conversion layer 111 using a polycrystalline semiconductor can be formed by crystallizing an amorphous semiconductor film or a microcrystalline semiconductor film by a laser crystallization method, a thermal crystallization method, a thermal crystallization method in which a catalytic element which promotes crystallization, such as nickel, is used, or the like alone, or by any of the above methods in combination. Alternatively, a polycrystalline semiconductor may be formed directly by a sputtering method, a plasma CVD method, a thermal CVD method, or the like.

Figure 6B:
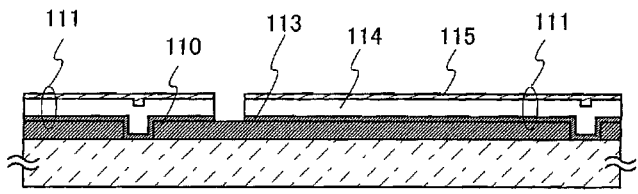

Then, as illustrated in FIG. 6B, the photoelectric conversion layer 111 in which the p-layer 113, the i-layer 114, and the n-layer 115 are sequentially stacked is patterned using etching, a laser, or the like. A plurality of the photoelectric conversion layers 111 which are patterned and separated are each electrically connected to at least one conductive film 110 on the p-layer 113 side.

Figure 6C:
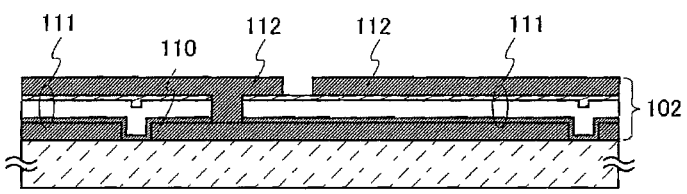

Next, as illustrated in FIG. 6C, the conductive film 112 which is patterned is formed over the photoelectric conversion layer 111. In this embodiment, since the photoelectric conversion device in which light enters from the substrate 101 side is described as an example, it is preferable that the light-transmitting conductive material with respect to visible light be used for the conductive film 112, in a manner similar to that of the conductive film 110. The conductive film 112 is formed so as to have a thickness of from 40 nm to 800 nm, preferably from 400 nm to 700 nm. In addition, the sheet resistance of the conductive film 112 may be from approximately 20 Ω/square to 200 Ω/square. In this embodiment, the conductive film 112 having a thickness of approximately 600 nm is formed using tin oxide.

Note that the conductive film 112 which is patterned can be formed in such a way that the conductive film is formed over the photoelectric conversion layer 111, and then the conductive film is patterned. Note that the conductive film 112 can also be formed by an evaporation method with the use of a metal mask, a droplet discharge method, or the like, in addition to a method for patterning the conductive film using etching, a laser, or the like. The conductive film 112 is electrically connected to at least one of the plurality of the photoelectric conversion layers 111 which are patterned and separated on the n-layer 115 side. Then, the conductive film 110 which is electrically connected on the p-layer 113 side to one photoelectric conversion layer 111 is electrically connected to the conductive film 112 which is electrically connected on the n-layer 115 side to the photoelectric conversion layer 111 which is different from the one photoelectric conversion layer 111.

Note that the surface of the conductive film 112, which is opposite to the photoelectric conversion layer 111, may have unevenness. With this structure, light is refracted or is reflected diffusely on the conductive film 112; therefore, light absorptance of the photoelectric conversion layer 111 and the photoelectric conversion layer 121a to be formed later can be increased and conversion efficiency can be raised.

Figure 6D:
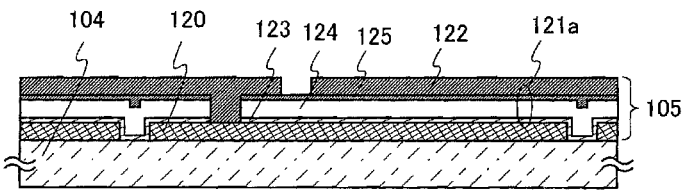

Next, formation of the cell 105 over the substrate 104 will be described. As illustrated in FIG. 6D, the conductive film 120 which is patterned is formed over the substrate 104. In this embodiment, since the photoelectric conversion device in which light enters from the substrate 101 side is described as an example, a substrate having a low light-transmitting property such as a metal substrate having an insulating surface, in addition to the aforementioned substrate which can be used for the substrate 101, can also be used for the substrate 104.

A conductive material which easily reflects light, specifically, aluminum, silver, titanium, tantalum, or the like is used for the conductive film 120. Note that the aforementioned light-transmitting conductive material may also be used for the conductive film 120. In this case, a material with which light is easily reflected is preferably used for the substrate 104 or a film (a reflective film) with which light that passes through the cell 105 can be reflected to the cell 105 side is preferably formed over the substrate 104. The reflective film can be formed using aluminum, silver, titanium, tantalum, or the like.

In the case where the conductive film 120 is formed using a conductive material which easily reflects light, when unevenness is formed on the surface which is in contact with the photoelectric conversion layer 121a, light is reflected diffusely on the surface of the conductive film 120. Therefore, the light absorptance of the photoelectric conversion layer 111 and the photoelectric conversion layer 121a can be increased and conversion efficiency can be raised. In a similar manner, in the case where a reflective film is formed, when the surface of the reflective film from which light enters is made uneven, conversion efficiency can be raised.

The conductive film 120 is formed so as to have a thickness of from 40 nm to 800 nm, preferably from 400 nm to 700 nm. In addition, the sheet resistance of the conductive film 120 may be approximately from 20 Ω/square to 200 Ω/square. Specifically in this embodiment, a conductive film having a thickness of 300 nm with the use of aluminum, a conductive film having a thickness of 100 nm with the use of silver, and a conductive film having a thickness of 60 nm with the use of zinc oxide containing aluminum are stacked by a sputtering method to be used as the conductive film 120.

The conductive film 120 which is patterned can be formed in such a way that the conductive film is formed over the substrate 104, and then the conductive film is patterned. Note that the conductive film 120 can be formed by an evaporation method with the use of a metal mask, a droplet discharge method, or the like, in addition to a method for patterning the conductive film using etching, a laser, or the like, in a manner similar to that of the conductive film 110 and the conductive film 112. Through the patterning, the conductive film 120 which electrically connects a plurality of photoelectric conversion layers formed later can be formed.

Next, the photoelectric conversion layer 121a in which the n-layer 123, the i-layer 124, and the p-layer 125 are sequentially stacked is formed over the conductive film 120. Note that before the photoelectric conversion layer 121a is formed, brush cleaning, or cleaning with the use of a polyvinyl alcohol (PVA)-based porous material or the like may be performed and a foreign substance may be removed in order to improve cleanliness of the surface of the conductive film 120. In addition, the surface may be cleaned using a chemical solution containing hydrofluoric acid or the like. In this embodiment, the surface of the conductive film 120 is cleaned using the polyvinyl alcohol (PVA)-based porous material, and then, the surface of the conductive film 120 is cleaned using a hydrogen fluoride solution of 0.5%.

The n-layer 123, the i-layer 124, and the p-layer 125 are stacked in the reverse order to that of the n-layer 115, the i-layer 114, and the p-layer 113 which are stacked; however, the n-layer 123, the i-layer 124, and the p-layer 125 can be formed in a manner similar to that of the n-layer 115, the i-layer 114, and the p-layer 113, respectively. That is, the n-layer 123, the i-layer 124, and the p-layer 125 can be formed using an amorphous semiconductor, a polycrystalline semiconductor, a microcrystalline semiconductor, or the like by a sputtering method, an LPCVD method, a plasma CVD method, or the like. It is preferable that the n-layer 123, the i-layer 124, and the p-layer 125 be formed in succession without being exposed to the atmosphere in order to prevent dust or the like from being attached to their interfaces.

Alternatively, single crystal semiconductor thin films formed using an SOI method may be used as the n-layer 123, the i-layer 124, and the p-layer 125. When a single crystal semiconductor thin film is used, the photoelectric conversion layer 121a has a small number of crystal defects which become a factor for inhibiting transport of carriers; therefore, conversion efficiency can be raised. In this embodiment, an amorphous semiconductor containing silicon carbide, an amorphous semiconductor containing silicon, and a microcrystalline semiconductor containing silicon are used for the p-layer 125, the i-layer 124, and the n-layer 123, respectively.

Plasma treatment is performed on the surface of the p-layer 113 using hydrogen before the i-layer 114 is formed in the case where the photoelectric conversion layer 111 is formed; however, it is preferable that plasma treatment be performed using hydrogen on the surface of the i-layer 124 after the i-layer 124 is formed, and then the p-layer 125 be formed in the case where the photoelectric conversion layer 121a is formed. With this structure, the number of crystal defects at the interface between the p-layer 125 and the i-layer 124 can be reduced, and conversion efficiency can be raised. Specifically in this embodiment, plasma treatment is performed on the surface of the i-layer 124 under the following conditions: the flow rate of hydrogen is 175 sccm, the reaction pressure is 67 Pa, the substrate temperature is 250° C., and a high frequency of 13.56 MHz is used. In the plasma treatment, argon may be added to hydrogen. When argon is added, the flow rate thereof can be 60 sccm, for example.

In this embodiment, light enters from the substrate 101 side; therefore, the thickness of the i-layer 114 included in the photoelectric conversion layer 111, which is near a light source, is smaller than the thickness of the i-layer 124 included in the photoelectric conversion layer 121a, which is distant from the light source. In this embodiment, over the conductive film 120, the n-layer 123 with a thickness of 10 nm, the i-layer 124 with a thickness of 300 nm, and the p-layer 125 with a thickness of 10 nm are sequentially stacked using an amorphous semiconductor containing silicon, an amorphous semiconductor containing silicon, and a p-type amorphous semiconductor containing silicon carbide, respectively.

Note that when the i-layer 114 is formed using an amorphous semiconductor containing silicon, the thickness of the i-layer 114 is approximately from 20 nm to 100 nm, preferably from 50 nm to 70 nm. When the i-layer 114 is formed using a microcrystalline semiconductor containing silicon, the thickness of the i-layer 114 is approximately from 100 nm to 400 nm, preferably from 150 nm to 250 nm. When the i-layer 114 is formed using a single crystal semiconductor containing silicon, the thickness of the i-layer 114 is approximately from 200 nm to 500 nm, preferably from 250 nm to 350 nm.

When the i-layer 124 is formed using an amorphous semiconductor containing silicon, the thickness of the i-layer 124 is approximately from 200 nm to 500 nm, preferably from 250 nm to 350 nm. When the i-layer 124 is formed using a microcrystalline semiconductor containing silicon, the thickness of the i-layer 124 is approximately from 0.7 µm to 3 µm, preferably from 1 µm to 2 µm. When the i-layer 124 is formed using a single crystal semiconductor containing silicon, the thickness of the i-layer 124 is approximately from 1 µm to 100 µm, preferably from 8 µm to 12 µm.

Then, as illustrated in FIG. 6D, the photoelectric conversion layer 121a in which the n-layer 123, the i-layer 124, and the p-layer 125 are sequentially stacked is patterned using etching, a laser, or the like. A plurality of the photoelectric conversion layers 121a which are patterned and separated are each electrically connected to at least one conductive film 120 on the n-layer 123 side.

Next, the conductive film 122 which is patterned is formed over the photoelectric conversion layer 121a. In this embodiment, since the photoelectric conversion device in which light enters from the substrate 101 side is described as an example, it is preferable that the conductive material having a light-transmitting property with respect to visible light be used for the conductive film 122, in a manner similar to that of the conductive film 110 and the conductive film 112. The conductive film 122 is formed so as to have a thickness of from 40 nm to 800 nm, preferably from 400 nm to 700 nm. In addition, the sheet resistance of the conductive film 122 may be approximately from 20 Ω/square to 200 Ω/square. In this embodiment, the conductive film 122 having a thickness of approximately 600 nm is formed using tin oxide.

Note that the conductive film 122 which is patterned can be formed in such a way that the conductive film is formed over the photoelectric conversion layer 121a, and then the conductive film is patterned. The conductive film 122 can also be formed by an evaporation method with the use of a metal mask, a droplet discharge method, or the like, in addition to a method for patterning the conductive film using etching, a laser, or the like. The conductive film 122 is electrically connected to at least one of the plurality of the photoelectric conversion layers 121a which are patterned and separated on the p-layer 125 side. Then, the conductive film 120 which is electrically connected on the n-layer 123 side to one photoelectric conversion layer 121a is electrically connected to the conductive film 122 which is electrically connected on the p-layer 125 side to the photoelectric conversion layer 121a which is different from the one photoelectric conversion layer 121a.

Figure 7A:
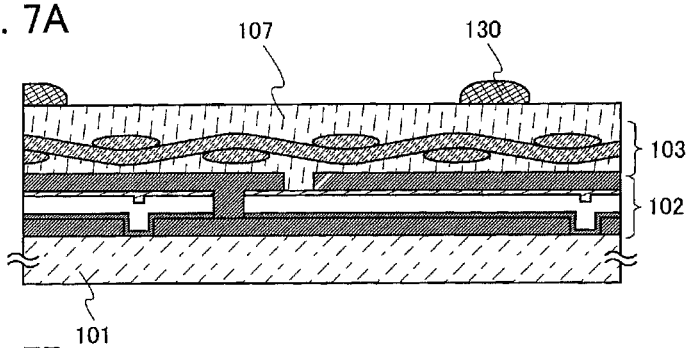
FIGS. 7A to 7C are views illustrating a method for manufacturing a photoelectric conversion device.
Figure 7B:
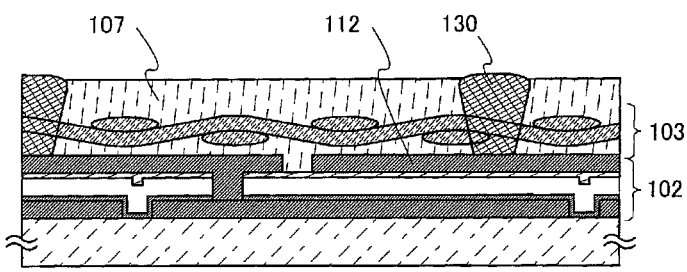
Figure 7C:
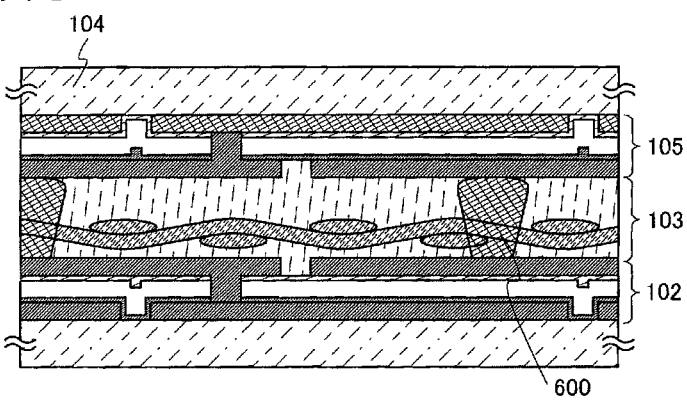

Next, after the structure body 103 is formed over the cell 102 as illustrated in FIG. 7A, the conductor 600 is formed in the structure body 103. Specifically, before the organic resin 107 is cured, a paste 130 having a conductor is selectively formed over a surface (a first surface) of the organic resin 107. Then, as illustrated in FIG. 7B, at least part of the paste 130 is made to permeate the organic resin 107. After that, the organic resin 107 is cured after the structure body 103 and the substrate 104 are stacked such that the cell 102 and the cell 105 face each other with the structure body 103 interposed therebetween, as illustrated in FIG. 7C. As a result, the conductor 600 can be provided in the organic resin 107.

Note that the paste 130 is formed over the surface of the organic resin 107 in a region overlapping with one of the conductive films 112 included in the cell 102 and made to permeate the structure body 103 to reach the conductive film 112. With this structure, the conductor 600 which is in contact with the first surface and a second surface of the organic resin 107 can be formed without providing a through hole in the fibrous body 106 (without breaking the fibrous body 106). Therefore, the strength of the prepreg can be maintained also when the conductor 600 is provided in the organic resin 107, whereby the resistance of the photoelectric conversion device with respect to external stress can be improved. The conductor 600 functions as a contact conductor.

The paste 130 including a conductor can be selectively formed over the organic resin 107 by a droplet discharge method or a printing method such as a screen printing method. In this embodiment, a plurality of the pastes 130 which are separated from each other are formed over the organic resin 107. The paste 130 is formed in a region overlapping with at least one conductive film 112.

As the paste 130 including a conductor, a conductive paste including at least conductive particles, an organic resin which dissolves or disperses the conductive particles, and a solvent which dissolves the organic resin 107 before being cured, can be used. By using the solvent which dissolves the organic resin 107 before being cured and is included in the paste 130, the paste 130 can effectively permeate the organic resin 107.

As the conductive particles, metal particles of one or more of silver (Ag), gold (Ag), copper (Cu), nickel (Ni), platinum (Pt), palladium (Pd), tantalum (Ta), molybdenum (Mo), titanium (Ti), and the like; fine particles of silver halide; or dispersive nanoparticles can be used.

In addition, as the organic resin included in the paste 130, one or more organic resins each serving as a binder, a solvent, a dispersant, or a coating of the metal particles can be used.

As the solvent which dissolves the organic resin 107 before being cured, esters such as butyl acetate, alcohols such as isopropyl alcohol, an organic solvent such as acetone, or the like may be selected as appropriate in consideration of a material for the organic resin 107.

Further, after the paste 130 is made to permeate the organic resin 107, the paste is preferably cured by performing baking at the same time as curing of the organic resin 107, before curing of the organic resin 107, or after curing of the organic resin 107.

For example, in the case where an epoxy resin, which is a thermosetting resin, is used as the organic resin 107, silver paste (silver powder, 2-(2-butoxyethoxy)ethyl acetate, and an epoxy resin) can be used as the paste 130. In this case, by forming the paste 130 over the organic resin 107 before being cured (in a temporarily cured state), the organic resin 107 before being cured is dissolved by 2-(2-butoxyethoxy)ethyl acetate included in the paste 130, so that the paste 130 can permeate the organic resin 107. After that, heat treatment is performed, whereby the organic resin 107 is cured and silver included in the paste 130 is cured. Thus, the fibrous body 106 including silver can be provided in the organic resin 107.

In the case where a thermosetting resin is used as the organic resin 107 as described above, curing of the organic resin 107 and baking of the paste 130 can be concurrently performed by the heat treatment; therefore, a process can be simplified. Note that at the time of performing heat treatment, pressure may be applied.

In this embodiment, the method for manufacturing the photoelectric conversion device illustrated in FIG. 2A is described as an example; however, the invention disclosed herein is not limited thereto. The photoelectric conversion devices illustrated in FIG. 2B, FIGS. 3A and 3B, and FIGS. 4A and 4B can also be formed by the manufacturing method described in this embodiment.

Embodiment 3

In this embodiment, a structure in which a cell including a photoelectric conversion layer is formed over and attached to a plastic substrate (a flexible substrate) will be described. Specifically, an example of the following structure will be described. In the structure, after a layer to be separated including a photoelectric conversion layer is formed over a supporting substrate having high heat resistance such as a glass substrate or a ceramic substrate with a separation layer and an insulating layer interposed therebetween, the supporting substrate and the layer to be separated are separated from each other using the separation layer, and the layer to be separated which is separated is attached to a plastic substrate to form a cell over the plastic substrate. In this embodiment, fabrication of a cell which is placed on the side opposite to the light incident side (a bottom cell) will be described. When a cell formed by a manufacturing method described in this embodiment is used as a cell placed on the light incident side (a top cell), the order of stacking electrodes and layers included in a photoelectric conversion layer may be changed as appropriate.

A photoelectric conversion layer in this embodiment refers to a layer including semiconductor layers for producing photoelectromotive force through light irradiation. That is to say, the photoelectric conversion layer refers to semiconductor layers in which a semiconductor junction typified by a p-n junction or a p-i-n junction is formed.

A photoelectric conversion layer is formed as a layer to be separated over a supporting substrate. In the photoelectric conversion layer, a first semiconductor layer (e.g., a p-type semiconductor layer), a second semiconductor layer (e.g., an i-type semiconductor layer), and a third semiconductor layer (e.g., an n-type semiconductor layer) are stacked over a conductive film serving as one electrode (a back electrode). Alternatively, in the photoelectric conversion layer, a first semiconductor layer (e.g., a p-type semiconductor layer) and a third semiconductor layer (e.g., an n-type semiconductor layer) may be stacked. As a semiconductor layer included in the photoelectric conversion layer, a semiconductor layer using amorphous silicon, microcrystalline silicon, or the like which can be formed without high heat treatment can be used. Also, a semiconductor layer using a crystalline semiconductor layer which needs a certain degree of heating or laser treatment, such as crystalline silicon, can be used by using a supporting substrate having high heat resistance. Therefore, since semiconductor layers with different spectral sensitivity characteristics can be formed over a plastic substrate, conversion efficiency can be improved and portability can be improved along with a reduction in weight of the substrate.

As a typical example of an impurity element which is introduced to a semiconductor layer to convert the semiconductor layer into an n-type semiconductor layer, phosphorus, arsenic, antimony, and the like, which are elements belonging to Group 15 of the periodic table, are given. In addition, as a typical example of an impurity element which is introduced to a semiconductor layer to convert the semiconductor layer into a p-type semiconductor layer, boron, aluminum, and the like, which are elements belonging to Group 13 of the periodic table, are given.

In this embodiment, the first semiconductor layer, the second semiconductor layer, and the third semiconductor layer are illustrated with the same number and the same shape in a cross-sectional view of the photoelectric conversion layer which is shown as an example. However, when the conductivity type of the second semiconductor layer is either p-type or n-type, a p-n junction is formed either between the first semiconductor layer and the second semiconductor layer or between the second semiconductor layer and the third semiconductor layer. The area of the p-n junction is preferably large so that carriers induced by light can move to the p-n junction without being recombined. Therefore, it is not necessary that the number and the shape of the first semiconductor layer and those of the third semiconductor layer are the same. In addition, also when the conductivity type of the second semiconductor layer is i-type, the area of the p-i junction is preferably large because the lifetime of a hole is shorter than that of an electron; thus, it is not necessary that the number and the shape of the first semiconductor layer and those of the third semiconductor layer are the same as in the case of the p-n junction.

FIGS. 8A to 8E illustrate an example of a manufacturing process of a cell including a photoelectric conversion layer.

Figure 8A:
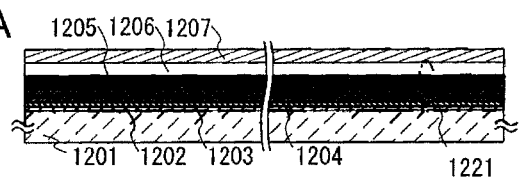
FIGS. 8A to 8E are views illustrating a method for manufacturing a photoelectric conversion device.

First, over a supporting substrate 1201 having an insulating surface, an insulating layer 1203, a conductive film 1204, and a photoelectric conversion layer 1221 including a first semiconductor layer 1205 (e.g., a p-type semiconductor layer), a second semiconductor layer 1206 (e.g., an i-type semiconductor layer), a third semiconductor layer 1207 (e.g., an n-type semiconductor layer), and the like are formed, with a separation layer 1202 interposed therebetween (FIG. 8A).

As the supporting substrate 1201, a glass substrate, a quartz substrate, a sapphire substrate, a ceramic substrate, a metal substrate provided with an insulating layer on the surface, or the like, which is a substrate having high heat resistance can be used.

The separation layer 1202 is formed with a single layer or stacked layers by a sputtering method, a plasma CVD method, a coating method, a printing method, or the like using an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), and silicon (Si), or an alloy material or a compound material containing such an element as its main component. The crystal structure of a layer containing silicon may be amorphous, microcrystalline, or polycrystalline. Note that a coating method includes a spin-coating method, a droplet discharge method, a dispensing method, a nozzle-printing method, and a slot die coating method in its category here.

When the separation layer 1202 has a single-layer structure, it is preferable to form a tungsten layer, a molybdenum layer, or a layer containing a mixture of tungsten and molybdenum. Alternatively, a layer containing an oxide or an oxynitride of tungsten, a layer containing an oxide or an oxynitride of molybdenum, or a layer containing an oxide or an oxynitride of a mixture of tungsten and molybdenum is formed. Note that the mixture of tungsten and molybdenum corresponds to an alloy of tungsten and molybdenum, for example.

When the separation layer 1202 has a stack structure, it is preferable to form, as a first layer, a tungsten layer, a molybdenum layer, or a layer containing a mixture of tungsten and molybdenum, and to form, as a second layer, a layer of an oxide, a nitride, an oxynitride, or a nitride oxide of tungsten, molybdenum, or a mixture of tungsten and molybdenum.

When the separation layer 1202 is formed with a stack structure of a layer containing tungsten and a layer containing an oxide of tungsten, by formation of a layer containing tungsten and an insulating layer formed using an oxide thereover, a layer containing an oxide of tungsten is formed at the interface between the tungsten layer and the insulating layer. Alternatively, the surface of the layer containing tungsten may be subjected to thermal oxidation treatment, oxygen plasma treatment, treatment using a strong oxidizing solution such as ozone water, or the like, whereby a layer containing an oxide of tungsten may be formed. Plasma treatment or heat treatment may be performed in an atmosphere of oxygen, dinitrogen monoxide, or a mixed gas of such a gas and another gas. The same can be applied to the case of forming a layer containing a nitride, an oxynitride, or a nitride oxide of tungsten. After a layer containing tungsten is formed, a silicon nitride layer, a silicon oxynitride layer, or a silicon nitride oxide layer may be formed thereover.

The insulating layer 1203 serving as a base can be formed with a single layer or plural layers by using an inorganic insulating film such as a silicon oxide film, a silicon nitride film, a silicon oxynitride film, or a silicon nitride oxide film.

In this specification, silicon oxynitride refers to a substance that contains a larger amount of oxygen than that of nitrogen. For example, silicon oxynitride contains oxygen, nitrogen, silicon, and hydrogen at concentrations ranging from 50 at. % to 70 at. % inclusive, from 0.5 at. % to 15 at. % inclusive, from 25 at. % to 35 at. % inclusive, and from 0.1 at. % to 10 at. % inclusive, respectively. In addition, silicon nitride oxide refers to a substance that contains a larger amount of nitrogen than that of oxygen. For example, silicon nitride oxide contains oxygen, nitrogen, silicon, and hydrogen at concentrations ranging from 5 at. % to 30 at. % inclusive, from 20 at. % to 55 at. % inclusive, from 25 at. % to 35 at. % inclusive, and from 10 at. % to 25 at. % inclusive, respectively. Note that the percentages of oxygen, nitrogen, silicon, and hydrogen fall within the aforementioned ranges in the case where measurement is performed using Rutherford backscattering spectrometry (RBS) or hydrogen forward scattering (HFS). Moreover, the total of the percentages of the constituent elements does not exceed 100 at. %.

It is preferable to form the conductive film 1204 using a metal film having high reflectivity, such as aluminum, silver, titanium, or tantalum. Note that an evaporation method or a sputtering method can be used to form the conductive film 1204. In addition, the conductive film 1204 may be formed using a plurality of layers. For example, a buffer layer or the like for improving the adhesiveness between the conductive film 1204 and the first semiconductor layer 1205 may be formed and stacked using a metal film, a metal oxide film, a metal nitride film, or the like. Furthermore, the surface of the conductive film 1204 may be processed by etching treatment or the like to have a texture structure. When the surface of the conductive film 1204 has a texture structure, reflection of light can be diffused, so that incident light can be efficiently converted into electric energy. Note that the texture structure refers to an uneven structure which prevents reflection of incident light and with which the amount of light which enters the photoelectric conversion layer can be increased by diffusing reflection of light and the conversion efficiency can be improved.

The first semiconductor layer 1205, the second semiconductor layer 1206, and the third semiconductor layer 1207 can be formed using any of the following materials: an amorphous semiconductor formed by a vapor-phase growth method using a semiconductor source gas typified by silane or germane or a sputtering method; a polycrystalline semiconductor formed by crystallizing the amorphous semiconductor with the use of light energy or thermal energy; a microcrystalline (also referred to as semiamorphous or microcrystal) semiconductor; and the like. The semiconductor layer can be formed by a sputtering method, an LPCVD method, a plasma CVD method, or the like.

A microcrystalline semiconductor film has a metastable state of an intermediate structure between an amorphous structure and a single crystal structure when Gibbs free energy is considered. That is, the microcrystalline semiconductor film includes a semiconductor having a third state which is stable in terms of free energy and has a short range order and lattice distortion. Columnar-like or needle-like crystals grow in a normal direction with respect to the substrate surface. The Raman spectrum of microcrystalline silicon, which is a typical example of the microcrystalline semiconductor, is shifted to a shorter wavenumber than 520 cm$^{-1}$ which represents single crystal silicon. That is, the peak of the Raman spectrum of microcrystalline silicon exists between 520 cm$^{-1}$ which represents single crystal silicon and 480 cm$^{-1}$ which represents amorphous silicon. In addition, microcrystalline silicon contains hydrogen or halogen of at least 1 at. % in order to terminate a dangling bond. Moreover, a microcrystalline semiconductor contains a rare gas element such as helium, argon, krypton, or neon to further promote lattice distortion, so that stability is increased and a favorable microcrystalline semiconductor film can be obtained.

Typical examples of an amorphous semiconductor include hydrogenated amorphous silicon, while typical examples of a crystalline semiconductor include polysilicon. Examples of polysilicon (polycrystalline silicon) include so-called high-temperature polysilicon which contains polysilicon as a main component and is formed at a process temperature of greater than or equal to 800° C., so-called low-temperature polysilicon that contains polysilicon as a main component and is formed at a process temperature of less than or equal to 600° C., polysilicon obtained by crystallizing amorphous silicon by using an element promoting crystallization or the like, and the like. It is needless to say that a microcrystalline semiconductor or a semiconductor partly including a crystalline phase can also be used as described above.

In addition, the first semiconductor layer 1205, the second semiconductor layer 1206, and the third semiconductor layer 1207 can also be formed using, in addition to silicon and silicon carbide, germanium or a compound semiconductor such as gallium arsenide, indium phosphide, zinc selenide, gallium nitride, or silicon germanium.

In the case of using a crystalline semiconductor layer for the semiconductor layer, the crystalline semiconductor layer may be formed by any of various methods such as a laser crystallization method and a thermal crystallization method. The amorphous semiconductor layer may be crystallized by using a combination of heat treatment and laser light irradiation. The heat treatment or the laser light irradiation may be carried out several times, separately.

The crystalline semiconductor layer may be directly formed over a substrate by a plasma CVD method. Alternatively, the crystalline semiconductor layer may be selectively formed over a substrate by a plasma CVD method. Note that the crystalline semiconductor layer is preferably formed over the supporting substrate 1201 so as to have a columnar structure in which crystals grow into a columnar shape.

Note that an impurity element imparting a first conductivity type (e.g., p-type conductivity) is introduced to one of the first semiconductor layer 1205 and the third semiconductor layer 1207, and an impurity element imparting a second conductivity type (e.g., n-type conductivity) is introduced to the other. In addition, preferably, the second semiconductor layer 1206 is either an intrinsic semiconductor layer or a layer to which the impurity element imparting the first or second conductivity type is introduced. In this embodiment, an example in which three semiconductor layers are stacked to form a p-i-n junction as the photoelectric conversion layer is described; however, plural semiconductor layers may also be stacked to form other junction such as a p-n junction.

Through the foregoing process, over the separation layer 1202 and the insulating layer 1203, the conductive film 1204 and the photoelectric conversion layer 1221 including the first semiconductor layer 1205, the second semiconductor layer 1206, the third semiconductor layer 1207, and the like can be formed.

Figure 8B:
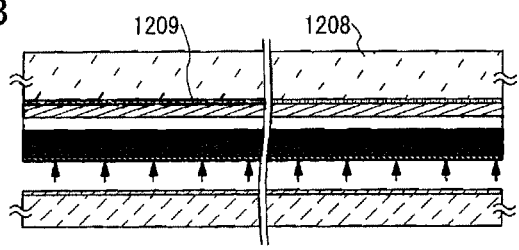

Then, the layer to be separated which includes the conductive film 1204, the first semiconductor layer 1205, the second semiconductor layer 1206, and the third semiconductor layer 1207 over the insulating layer 1203 is attached to a temporary supporting substrate 1208 using an adhesive 1209 for separation, and the layer to be separated is separated from the supporting substrate 1201 using the separation layer 1202. By this process, the layer to be separated is placed on the temporary supporting substrate 1208 side (FIG. 8B).

As the temporary supporting substrate 1208, a glass substrate, a quartz substrate, a sapphire substrate, a ceramic substrate, a metal substrate, or the like can be used. In addition, a plastic substrate having heat resistance to withstand the processing temperature in this embodiment, or a flexible substrate such as a film may also be used.

In addition, as the adhesive 1209 for separation which is used here, an adhesive which is soluble in water or a solvent, an adhesive which is capable of being plasticized upon irradiation with UV light or the like is used so that the temporary supporting substrate 1208 and the layer to be separated can be chemically or physically separated from each other when necessary.

The above process of transferring the layer to be separated to the temporary supporting substrate, which is shown as an example, may also be carried out by another method. For example, any of the following methods can be used as appropriate: a method in which a separation layer is formed between a substrate and a layer to be separated, a metal oxide film is provided between the separation layer and the layer to be separated, and the metal oxide film is weakened by crystallization to carry out separation of the layer to be separated; a method in which an amorphous silicon film containing hydrogen is provided between a highly heat-resistant supporting substrate and a layer to be separated, and the amorphous silicon film is removed by laser light irradiation or etching to carry out separation of the layer to be separated; a method in which a separation layer is formed between a supporting substrate and a layer to be separated, a metal oxide film is provided between the separation layer and the layer to be separated, the metal oxide film is weakened by crystallization, and part of the separation layer is etched away using a solution or a halogen fluoride gas such as $NF_3$, $BrF_3$, or $ClF_3$ to carry out separation at the weakened metal oxide film; a method in which a supporting substrate provided with a layer to be separated is mechanically removed or is etched away using a solution or a halogen fluoride gas such as $NF_3$, $BrF_3$, or $ClF_3$; and the like. In addition, it is also possible to use a method in which a film containing nitrogen, oxygen, hydrogen, or the like (e.g., an amorphous silicon film containing hydrogen, a film of an alloy containing hydrogen, or a film of an alloy containing oxygen) is used as a separation layer, which is irradiated with laser light, so that nitrogen, oxygen, or hydrogen contained in the separation layer is released as a gas to promote separation between a layer to be separated and a substrate.

When a plurality of the above-described separation methods are combined, the transfer process can be conducted easily. That is, the separation can be performed with physical force (by a machine or the like) after performing laser light irradiation; etching on the separation layer with a gas, a solution, or the like; or mechanical removal with a sharp knife, scalpel, or the like so as to make a condition where the separation layer and the layer to be separated can be easily separated from each other.

Further, the layer to be separated may also be separated from the supporting substrate after liquid is made to permeate the interface between the separation layer and the layer to be separated, or while liquid such as water or ethanol is poured on this interface.

Furthermore, when the separation layer 1202 is formed using tungsten, it is preferable that the separation be performed while etching the separation layer using a mixed solution of ammonium water and a hydrogen peroxide solution.

Figure 8C:
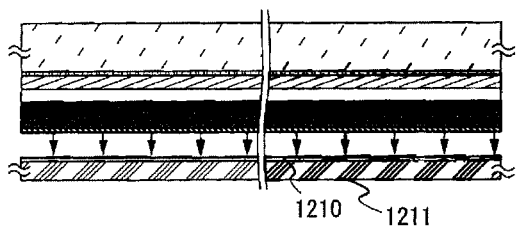

Next, the layer to be separated which is separated from the supporting substrate 1201 and in which the separation layer 1202 or the insulating layer 1203 is exposed is attached to a plastic substrate 1211 using an adhesive layer 1210 (FIG. 8C).

As a material for the adhesive layer 1210, any of a variety of curable adhesives, such as a reactive curable adhesive, a thermal curable adhesive, a photo curable adhesive such as an ultraviolet curable adhesive, and an anaerobic adhesive can be used.

As the plastic substrate 1211, any of a variety of substrates having flexibility and a light-transmitting property with respect to visible light can be used, and a film of an organic resin or the like is preferably used. As the organic resin, for example, an acrylic resin, a polyester resin such as polyethylene terephthalate (PET) or polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, a polyvinylchloride resin, or the like can be used.

Over the plastic substrate 1211, a protective layer having low permeability, such as a film containing nitrogen and silicon, e.g., silicon nitride or silicon oxynitride, or a film containing nitrogen and aluminum such as aluminum nitride may be formed in advance.

Figure 8D:
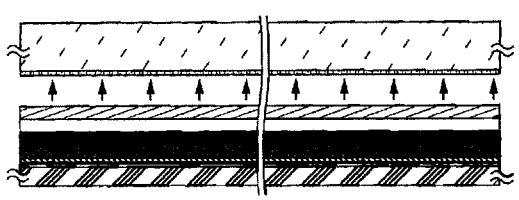
Figure 8E:
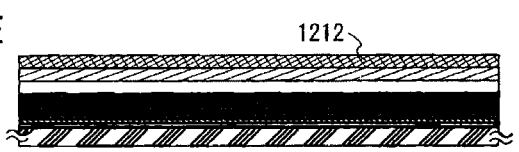

After that, the temporary supporting substrate 1208 is removed by dissolving or plasticizing the adhesive 1209 for separation (FIG. 8D). Then, after performing processing of the photoelectric conversion layer 1221 into a desired shape and the like, a conductive film 1212 which serves as the other electrode (surface electrode) is formed over the third semiconductor layer 1207 (FIG. 8E).

In the foregoing manner, the cell including the photoelectric conversion layer can be transferred to a substrate such as a plastic substrate. The cell including the photoelectric conversion layer in this embodiment may be attached to a cell including another photoelectric conversion layer using a structure body (prepreg) in which a fibrous body is impregnated with an organic resin and which is partly conductive as described in the above embodiment, whereby a photoelectric conversion device can be manufactured.

Note that the conductive film 1212 can be formed by a photo-sputtering method or a vacuum evaporation method. The conductive film 1212 is preferably formed using a material that transmits light sufficiently. Examples of the above material include indium tin oxide (ITO), indium tin oxide containing silicon oxide (ITSO), organoimdium, organotin, zinc oxide (ZnO), indium oxide containing zinc oxide (indium zinc oxide (IZO)), ZnO doped with gallium (Ga), tin oxide ($SnO_2$), indium oxide containing tungsten oxide, indium zinc oxide containing tungsten oxide, indium oxide containing titanium oxide, and indium tin oxide containing titanium oxide. In addition, as the conductive material having a light-transmitting property, a conductive high molecular material (also referred to as conductive polymer) can be used. As the conductive high molecular material, $\pi$ electron conjugated conductive high molecule can be used. For example, polyaniline and/or a derivative thereof, polypyrrole and/or a derivative thereof, polythiophene and/or a derivative thereof, a copolymer of two or more kinds of those materials, and the like can be given.

Note that this embodiment can be combined with any of other embodiments as appropriate.

Embodiment 4

This embodiment relates to a method for forming a cell including a photoelectric conversion layer by bonding a single crystal semiconductor substrate to a supporting substrate made of glass, ceramic, or the like, and one example thereof will be described. In this embodiment, fabrication of a cell which is placed on the side opposite to the light incident side (a bottom cell) will be described. When a cell formed by a manufacturing method described in this embodiment is used as a cell placed on the light incident side (a top cell), the order of stacking electrodes and layers included in a photoelectric conversion layer may be changed as appropriate.

A fragile layer is formed in a single crystal semiconductor substrate which is to be attached to a supporting substrate. Over the single crystal semiconductor substrate, a conductive film serving as one electrode (a back electrode), a photoelectric conversion layer in which a first semiconductor layer, a second semiconductor layer, and a third semiconductor layer are stacked, and an insulating layer to be bonded to the supporting substrate are formed in advance. Then, the supporting substrate and the insulating layer are closely attached to each other, and then, separation is carried out around the fragile layer, whereby a photoelectric conversion device in which a single crystal semiconductor layer is used as a semiconductor layer in the photoelectric conversion layer can be manufactured over the supporting substrate. Accordingly, a cell including a photoelectric conversion layer with fewer crystal defects which could inhibit carrier transfer can be manufactured, and the photoelectric conversion device can have excellent conversion efficiency.

In this embodiment, the first semiconductor layer, the second semiconductor layer, and the third semiconductor layer are illustrated with the same number and the same shape in a cross-sectional view of the photoelectric conversion layer which is shown as an example. However, when the conductivity type of the second semiconductor layer is either p-type or n-type, a p-n junction is formed either between the first semiconductor layer and the second semiconductor layer or between the second semiconductor layer and the third semiconductor layer. The area of the p-n junction is preferably large so that carriers induced by light can move to the p-n junction without being recombined. Therefore, it is not necessary that the number and the shape of the first semiconductor layer and those of the third semiconductor layer are the same. In addition, also when the conductivity type of the second semiconductor layer is i-type, the area of the p-i junction is preferably large because the lifetime of a hole is shorter than that of an electron; thus, it is not necessary that the number and the shape of the first semiconductor layer and those of the third semiconductor layer are the same as in the case of the p-n junction.

Note that an impurity element imparting a first conductivity type (e.g., p-type conductivity) is introduced to one of the first semiconductor layer and the third semiconductor layer, and an impurity element imparting a second conductivity type (e.g., n-type conductivity) is introduced to the other. In addition, preferably, the second semiconductor layer is either an intrinsic semiconductor layer or a layer to which the impurity element imparting the first or second conductivity type is introduced. In this embodiment, an example in which three semiconductor layers are stacked as the photoelectric conversion layer is described; however, plural semiconductor layers may also be stacked to form other junction such as a p-n junction.

Note that the term "fragile layer" in this specification refers to a region at which a single crystal semiconductor substrate is separated into a single crystal semiconductor layer and a separation substrate (a single crystal semiconductor substrate) in a separation step, and its vicinity. The state of the fragile layer depends on a means for forming the fragile layer. For example, the fragile layer refers to a layer which is weakened by local disorder of the crystal structure. Note that there may be a case where a region ranging from one surface of a single crystal semiconductor substrate to the fragile layer is weakened to some extent; however, the fragile layer in this specification refers to a region at which separation is carried out later and its vicinity.

Note that a single crystal semiconductor herein refers to a semiconductor in which crystal faces and crystal axes are aligned, and constituent atoms or molecules are aligned in a spatially ordered manner. Note that a single crystal semiconductor also includes a disordered semiconductor such as a semiconductor partly having a lattice defect in which the alignment of atoms or molecules is disordered or a semiconductor having intended or unintended lattice distortion.

FIGS. 9A to 9G illustrate an example of a manufacturing process of a cell including a photoelectric conversion layer in this embodiment.

Figure 9A:
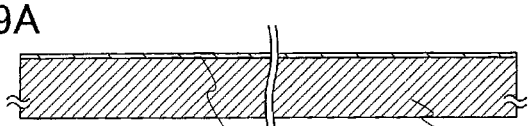
FIGS. 9A to 9G are views illustrating a method for manufacturing a photoelectric conversion device.
Figure 9B:
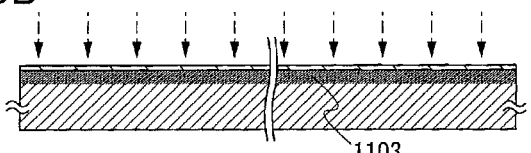

First, a protective layer 1102 is formed over one surface of a single crystal semiconductor substrate 1101 having a first conductivity type (FIG. 9A). Then, an impurity element imparting the first conductivity type is introduced through the surface of the protective layer 1102, thereby forming a first semiconductor layer 1103 to which the impurity element imparting the first conductivity type is introduced (FIG. 9B).

Although the above description shows that the single crystal semiconductor substrate 1101 has the first conductivity type, the conductivity type of the single crystal semiconductor substrate 1101 is not particularly limited thereto. It is preferable that the concentration of the impurity element introduced to the single crystal semiconductor substrate 1101 be lower than the concentration of an impurity element imparting a conductivity type which is introduced to the first semiconductor layer and the third semiconductor layer which are formed later.

As the single crystal semiconductor substrate 1101, a semiconductor wafer of silicon, germanium, or the like; a compound semiconductor wafer of gallium arsenide, indium phosphide, or the like; and the like can be used. In particular, a single crystal silicon wafer is preferably used. The planar shape of the single crystal semiconductor substrate 1101 is not limited to a particular shape but is desirably a rectangular shape in the case where a supporting substrate to which the single crystal semiconductor substrate 1101 is fixed later has a rectangular shape. Further, the surface of the single crystal semiconductor substrate 1101 is desirably polished to be a mirror surface.

Figure 10A:
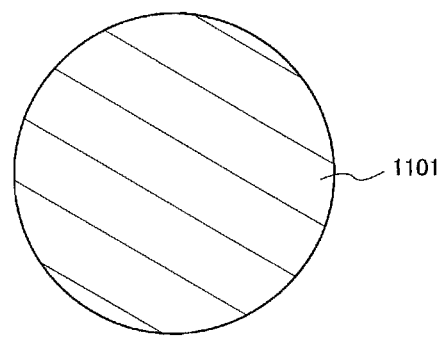
FIGS. 10A to 10C are views illustrating a method for processing a single crystal silicon wafer.

Many of single crystal silicon wafers on the market are circular in shape. When such a circular wafer is used, it may be processed to have a rectangular shape or a polygonal shape. For example, as illustrated in FIGS. 10A to 10C, a single crystal semiconductor substrate 1101a with a rectangular shape (FIG. 10B) or a single crystal semiconductor substrate 1101b with a polygonal shape (FIG. 10C) can be cut out from a circular single crystal semiconductor substrate 1101 (FIG. 10A).

Figure 10B:
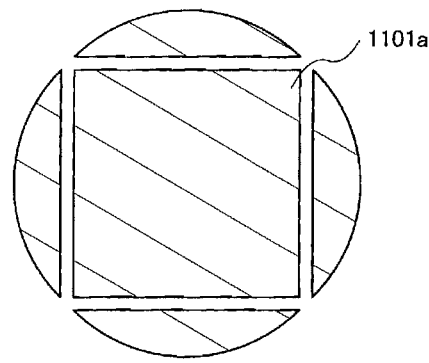
Figure 10C:
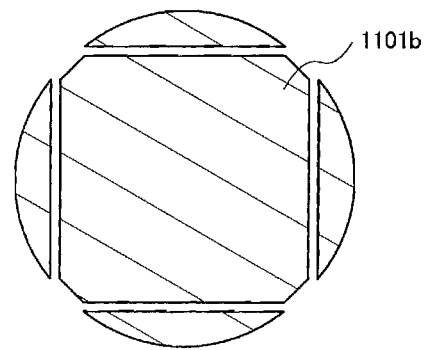

Note that FIG. 10B illustrates the case where the single crystal semiconductor substrate 1101a is cut out to have a rectangular shape of the maximum size, which is inscribed in the circular single crystal semiconductor substrate 1101. Here, the angle of each corner of the single crystal semiconductor substrate 1101a is about 90 degrees. FIG. 10C illustrates the case where the single crystal semiconductor substrate 1101b is cut out so that the distance between the opposing lines is longer than that of the single crystal semiconductor substrate 1101a. In that case, the angle of each corner of the single crystal semiconductor substrate 1101b is not 90 degrees, and the single crystal semiconductor substrate 1101b does not have a rectangular shape but has a polygonal shape.

As the protective layer 1102, silicon oxide or silicon nitride is preferably used. As a method for forming the protective layer 1102, a plasma CVD method, a sputtering method, or the like may be employed, for example. In addition, the protective layer 1102 can also be formed by oxidizing the single crystal semiconductor substrate 1101 with oxidizing chemicals or oxygen radicals. Further, the protective layer 1102 may be formed by oxidizing the surface of the single crystal semiconductor substrate 1101 by a thermal oxidation method. By the formation of the protective layer 1102, it is possible to prevent the substrate surface from being damaged at the time of forming the fragile layer in the single crystal semiconductor substrate 1101 or adding the impurity element imparting one conductivity type to the single crystal semiconductor substrate 1101.

The first semiconductor layer 1103 is formed by introducing the impurity element imparting the first conductivity type to the single crystal semiconductor substrate 1101. Since the protective layer 1102 is formed over the single crystal semiconductor substrate 1101, the impurity element imparting the first conductivity type is introduced to the single crystal semiconductor substrate 1101 through the protective layer 1102.

As the impurity element imparting the first conductivity type, an element belonging to Group 13 of the periodic table, for example, boron is used. Consequently, the first semiconductor layer 1103 having p-type conductivity can be formed. Note that the first semiconductor layer 1103 can also be formed by a thermal diffusion method. Note that a thermal diffusion method should be performed before the formation of the fragile layer because high-temperature treatment with a temperature of about 900° C. or more is performed.

The first semiconductor layer 1103 formed by the foregoing method is disposed on the side opposite to the light incident side. Here, in the case of using a p-type substrate as the single crystal semiconductor substrate 1101, the first semiconductor layer 1103 is a high-concentration p-type region. Accordingly, the high-concentration p-type region and a low-concentration p-type region are sequentially disposed from the side opposite to the light incident side, so that a back surface field (BSF) is formed. That is, electrons cannot enter the high-concentration p-type region and thus recombination of carriers generated by photoexcitation can be reduced.

Figure 9C:
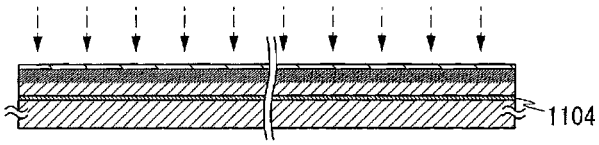

Next, ion irradiation is performed through the surface of the protective layer 1102, so that a fragile layer 1104 is formed in the single crystal semiconductor substrate 1101 (FIG. 9C). Here, as the ions, ions generated using a source gas containing hydrogen (in particular, $H^+$ ions, $H_2^+$ ions, $H_3^+$ ions, or the like) are preferably used. Note that the depth at which the fragile layer 1104 is formed is controlled by an acceleration voltage at the time of ion irradiation. Further, the thickness of a single crystal semiconductor layer to be separated from the single crystal semiconductor substrate 1101 depends on the depth at which the fragile layer 1104 is formed.

The depth at which the fragile layer 1104 is formed is less than or equal to 500 nm, preferably less than or equal to 400 nm, more preferably from 50 nm to 300 nm inclusive from the surface of the single crystal semiconductor substrate 1101 (to be exact, from the surface of the first semiconductor layer 1103). By forming the fragile layer 1104 at a shallower depth, the single crystal semiconductor substrate after the separation can be thick; therefore, the number of times of reusing the single crystal semiconductor substrate can be increased.

The aforementioned ion irradiation can be performed with the use of an ion doping apparatus or an ion implantation apparatus. Since mass separation is not performed generally in an ion doping apparatus, even when the single crystal semiconductor substrate 1101 is enlarged, the entire surface of the single crystal semiconductor substrate 1101 can be evenly irradiated with ions. In order to increase the thickness of the separated single crystal semiconductor layer in the case of forming the fragile layer 1104 in the single crystal semiconductor substrate 1101 by ion irradiation, the acceleration voltage of an ion doping apparatus or an ion implantation apparatus may be increased.

Note that an ion implantation apparatus refers to an apparatus in which ions produced from a source gas are mass-separated and delivered to an object, so that an element of the ion is added to the object. Further, an ion doping apparatus refers to an apparatus in which ions produced from a source gas are delivered to an object without mass separation, so that an element of the ion is added to the object.

After the fragile layer 1104 is formed, the protective layer 1102 is removed and a conductive film 1105 which serves as one electrode is formed over the first semiconductor layer 1103.

Here, it is preferable that the conductive film 1105 can resist heat treatment in a step performed later. For example, titanium, molybdenum, tungsten, tantalum, chromium, nickel, or the like can be used for the conductive film 1105. Further, a stack structure of any of the above metal materials and a nitride thereof may be employed. For example, a stack structure of a titanium nitride layer and a titanium layer, a stack structure of a tantalum nitride layer and a tantalum layer, a stack structure of a tungsten nitride layer and a tungsten layer, and the like can be used. In the case of the stack structure including a nitride as described above, the nitride is preferably formed in contact with the first semiconductor layer 1103. By the formation of the nitride, the conductive film 1105 and the first semiconductor layer 1103 can firmly adhere to each other. Note that the conductive film 1105 can be formed by an evaporation method or a sputtering method.

Figure 9D:
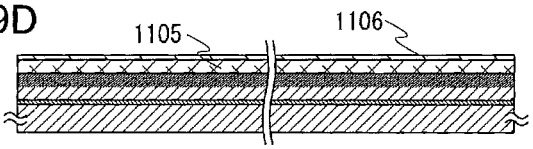

Next, an insulating layer 1106 is formed over the conductive film 1105 (FIG. 9D). The insulating layer 1106 may have a single-layer structure or a stack structure of two or more layers. In any case, the surface of the insulating layer 1106 is preferably highly smooth. In addition, the outermost surface thereof is desirably hydrophilic. For example, a silicon oxide layer, a silicon nitride layer, a silicon oxynitride layer, a silicon nitride oxide layer, or the like can be formed as the insulating layer 1106. As a method for forming the insulating layer 1106, a CVD method such as a plasma CVD method, a photo CVD method, or a thermal CVD method can be employed. In particular, by employing a plasma CVD method, the insulating layer 1106 which is smooth and has an average surface roughness ($R_a$) of less than or equal to 0.5 nm (preferably less than or equal to 0.3 nm) can be formed.

Note that as the insulating layer 1106, in particular, a silicon oxide layer formed by a chemical vapor deposition method using organosilane is preferably used. For organosilane, tetraethoxysilane (TEOS: $Si(OC_2H_5)_4$), trimethylsilane (TMS: $(CH_3)_3SiH$), tetramethylcyclotetrasiloxane (TMCTS), octamethylcyclotetrasiloxane (OMCTS), hexamethyldisilazane (HMDS), triethoxysilane ($SiH(OC_2H_5)_3$), tris (dimethylamino)silane ($SiH(N(CH_3)_2)_3$), or the like can be used. It is needless to say that silicon oxide, silicon oxynitride, silicon nitride, silicon nitride oxide, or the like may be formed using inorganic silane such as monosilane, disilane, or trisilane.

Further, in the case where the insulating layer 1106 has a stack structure, it preferably includes a silicon insulating layer containing nitrogen, such as a silicon nitride layer or a silicon nitride oxide layer. In this manner, the semiconductor can be prevented from being contaminated by alkali metal or alkaline earth metal from the supporting substrate.

Note that in the case where the conductive film 1105 has a surface with an appropriate smoothness, specifically, in the case where the conductive film 1105 has a surface with an average surface roughness ($R_a$) of less than or equal to 0.5 nm (preferably, less than or equal to 0.3 nm), bonding can be performed without formation of the insulating layer 1106 in some cases. In that case, the insulating layer 1106 is not necessarily formed.

Figure 9E:
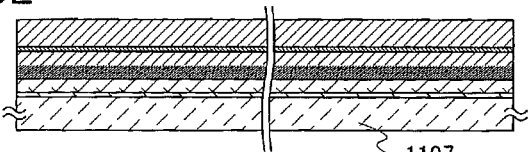

Next, pressure is applied to a surface of the insulating layer 1106 and a surface of a supporting substrate 1107 which are closely attached to each other, whereby the supporting substrate 1107 and the stack structure over the single crystal semiconductor substrate 1101 are bonded to each other (FIG. 9E).

Before the above bonding, the surfaces to be bonded (here, the surface of the insulating layer 1106 and the surface of the supporting substrate 1107 which are attached to each other) are cleaned sufficiently. This is because possibility of bonding failure would increase when the surfaces to be bonded include microscopic dust or the like. Note that in order to reduce bonding failure, the surfaces to be bonded may be activated in advance. For example, one or both of the surfaces to be bonded are irradiated with an atomic beam or an ion beam so that the surfaces to be bonded can be activated. Alternatively, the surfaces to be bonded may be activated by plasma treatment, chemical treatment, or the like. Such activation of the surfaces to be bonded enables favorable bonding even at a temperature of less than or equal to 400° C.

Note that a structure may be employed in which a silicon insulating layer containing nitrogen, such as a silicon nitride layer or a silicon nitride oxide layer, is formed over the supporting substrate 1107 and closely attached to the insulating layer 1106. Also in that case, the semiconductor can be prevented from being contaminated by alkali metal or alkaline earth metal from the supporting substrate 1107.

Next, heat treatment is performed to strengthen the bonding. The temperature of the heat treatment should be set so that separation is not promoted at the fragile layer 1104. For example, a temperature of less than 400° C., more preferably less than or equal to 300° C. can be employed. There is no particular limitation on heat treatment time, and an optimal condition may be set as appropriate in accordance with a relationship between processing speed and bonding strength. For example, heat treatment at about 200° C. for about two hours can be employed. Here, local heat treatment can also be performed by irradiating only a region to be bonded with microwaves. Note that, in the case where there is no problem with bonding strength, the aforementioned heat treatment may be omitted.

Figure 9F:
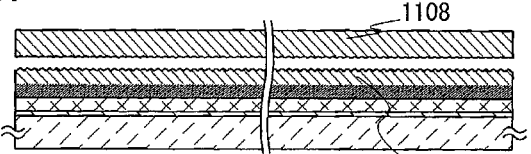

Next, the single crystal semiconductor substrate 1101 is separated at the fragile layer 1104 into a separation substrate 1108 and a second semiconductor layer 1109 formed of a single crystal semiconductor (FIG. 9F). The separation of the single crystal semiconductor substrate 1101 is performed by heat treatment. The temperature of the heat treatment can be set in accordance with the upper temperature limit of the supporting substrate 1107. For example, in the case where a glass substrate is used as the supporting substrate 1107, heat treatment is preferably performed at a temperature of from 400° C. to 650° C. inclusive. Note that heat treatment may also be performed at a temperature of from 400° C. to 700° C. inclusive as long as being performed for a short time. It is needless to say that in the case where the upper temperature limit of the glass substrate is greater than 700° C., the temperature of the heat treatment may be set to greater than 700° C.

By performing the heat treatment as described above, the volume of microvoids formed in the fragile layer 1104 is changed, and then the fragile layer 1104 is cracked. As a result, the single crystal semiconductor substrate 1101 is separated along the fragile layer 1104. Since the insulating layer 1106 is bonded to the supporting substrate 1107, the second semiconductor layer 1109 which is formed of a single crystal semiconductor separated from the single crystal semiconductor substrate 1101 remains over the supporting substrate 1107. Further, since the interface for bonding the insulating layer 1106 to the supporting substrate 1107 is heated by this heat treatment, a covalent bond is formed at the interface for bonding, so that the bonding force between the supporting substrate 1107 and the insulating layer 1106 is further improved.

Note that the total thickness of the second semiconductor layer 1109 and the first semiconductor layer 1103 substantially corresponds to the depth at which the fragile layer 1104 is formed.

When the single crystal semiconductor substrate 1101 is separated at the fragile layer 1104, the separation surface (division surface) of the second semiconductor layer 1109 is uneven in some cases. Crystallinity and planarity of such a surface are damaged due to ions in some cases. Thus, it is preferable that crystallinity and planarity of the surface be recovered so that the second semiconductor layer 1109 can function as a seed layer in epitaxy later. For example, crystallinity may be recovered by laser treatment or a damaged layer may be removed by etching, and a process for making the surface smooth again may be carried out. Note that at this time, heat treatment is conducted in combination with the laser treatment, which can lead to crystallinity recovery or damage repairing. The heat treatment is preferably conducted at higher temperature and/or for a longer time by using a heating furnace, RTA, or the like, compared to the heat treatment for separating the single crystal semiconductor substrate 1101 at the fragile layer 1104. Needless to say, the heat treatment is conducted at a temperature that does not exceed the strain point of the supporting substrate 1107.

Through the aforementioned steps, the second semiconductor layer 1109 formed using a single crystal semiconductor which is fixed to the supporting substrate 1107 can be obtained. Note that the separation substrate 1108 can be reused after a recycling process. The separation substrate 1108 that has been subjected to the recycling process may be reused as a substrate from which a single crystal semiconductor layer is separated (corresponding to the single crystal semiconductor substrate 1101 in this embodiment), or may be used for any other purpose. In the case where the separation substrate 1108 is reused as a substrate from which a single crystal semiconductor layer is separated, a plurality of photoelectric conversion devices can be manufactured from one single crystal semiconductor substrate.

Figure 9G:
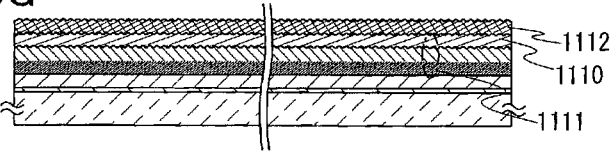

Then, a third semiconductor layer 1110 is formed over the second semiconductor layer 1109, so that a photoelectric conversion layer 1111 including the first semiconductor layer 1103, the second semiconductor layer 1109, and the third semiconductor layer 1110 is formed. Then, after performing processing of the photoelectric conversion layer 1111 into a desired shape and the like, a conductive film 1112 which serves as the other electrode (surface electrode) is formed over the third semiconductor layer 1110 (FIG. 9G).

In the foregoing manner, the cell including the photoelectric conversion layer formed using a single crystal semiconductor layer can be manufactured. The cell including the photoelectric conversion layer in this embodiment may be attached to a cell including another photoelectric conversion layer using a structure body (prepreg) in which a fibrous body is impregnated with an organic resin and which is partly conductive as described in the above embodiment, whereby a photoelectric conversion device can be manufactured.

Since single crystal silicon which is a typical example of a single crystal semiconductor is an indirect transition semiconductor, its light absorption coefficient is lower than that of amorphous silicon which is a direct transition semiconductor. Accordingly, a photoelectric conversion layer using single crystal silicon should be several or more times as thick as a photoelectric conversion layer using amorphous silicon in order to absorb sufficient sunlight.

The second semiconductor layer 1109 formed using a single crystal semiconductor is thickened as follows. For example, after a non-single-crystal semiconductor layer is formed so as to cover and fill depressions of the second semiconductor layer 1109, heat treatment is performed, so that the non-single-crystal semiconductor layer is grown using the second semiconductor layer 1109 as a seed layer by solid phase epitaxy. Alternatively, the non-single-crystal semiconductor layer is grown by vapor phase epitaxy by a plasma CVD method or the like. Heat treatment for solid phase epitaxy can be conducted with a heat treatment apparatus such as an RTA apparatus, a furnace, or a high-frequency generation apparatus.

Note that the conductive film 1112 can be formed by a photo-sputtering method or a vacuum evaporation method. Further, the conductive film 1112 is preferably formed using a material that transmits light sufficiently. Examples of the above material include indium tin oxide (ITO), indium tin oxide containing silicon oxide (ITSO), organoimdium, organotin, zinc oxide (ZnO), indium oxide containing zinc oxide (indium zinc oxide (IZO)), ZnO doped with gallium (Ga), tin oxide ($SnO_2$), indium oxide containing tungsten oxide, indium zinc oxide containing tungsten oxide, indium oxide containing titanium oxide, and indium tin oxide containing titanium oxide. In addition, as the conductive material having a light-transmitting property, a conductive high molecular material (also referred to as conductive polymer) can be used. As the conductive high molecular material, $\pi$ electron conjugated conductive high molecule can be used. For example, polyaniline and/or a derivative thereof, polypyrrole and/or a derivative thereof, polythiophene and/or a derivative thereof, a copolymer of two or more kinds of those materials, and the like can be given.

Note that this embodiment can be combined with any of other embodiments as appropriate.

Embodiment 5

This embodiment relates to a method for manufacturing a cell including a photoelectric conversion layer formed using a single crystal semiconductor substrate and one example thereof will be described. In this embodiment, fabrication of a cell which is placed on the side opposite to the light incident side (a bottom cell) will be described. When a cell formed by a manufacturing method described in this embodiment is used as a cell placed on the light incident side (a top cell), the order of stacking electrodes and layers included in a photoelectric conversion layer may be changed as appropriate.

A photoelectric conversion layer formed using a single crystal semiconductor substrate has a semiconductor junction in the single crystal semiconductor substrate, for example. Over a conductive film serving as one electrode (a back electrode), the photoelectric conversion layer in which a first semiconductor layer, a second semiconductor layer, and a third semiconductor layer are stacked is formed. Then, a surface of the photoelectric conversion layer is made to have a texture structure (an uneven structure) and an electrode is formed over the photoelectric conversion layer, whereby a cell manufactured using the single crystal semiconductor substrate can be obtained.

Note that an impurity element imparting a first conductivity type (e.g., n-type conductivity) is introduced to one of the first semiconductor layer and the third semiconductor layer and an impurity element imparting a second conductivity type (e.g., p-type conductivity) is introduced to the other. Further, the second semiconductor layer is preferably an intrinsic semiconductor layer or a layer to which the impurity element imparting the first or second conductivity type is introduced. Although the example in which three semiconductor layers are stacked to form the photoelectric conversion layer is described in this embodiment, plural semiconductor layers may be stacked to form other junction such as a p-n junction.

In this embodiment, the first semiconductor layer, the second semiconductor layer, and the third semiconductor layer are illustrated with the same number in a cross-sectional view of a photoelectric conversion layer which is illustrated as an example. In the case where the conductivity type of the second semiconductor layer is either p-type or n-type, a p-n junction is formed either between the first semiconductor layer and the second semiconductor layer or between the second semiconductor layer and the third semiconductor layer. The area of the p-n junction is preferably large so that carriers induced by light can move to the p-n junction without being recombined. Thus, it is not necessary that the number and the shape of the first semiconductor layer and those of the third semiconductor layer are the same. In addition, also in the case where the conductivity type of the second semiconductor layer is i-type, the area of the p-i junction is preferably large because the lifetime of a hole is shorter than that of an electron. Thus, it is not necessary that the number and the shape of the first semiconductor layer and those of the third semiconductor layer are the same as in the case of the p-n junction.

Note that a single crystal semiconductor here refers to a semiconductor in which crystal faces and crystal axes are aligned, and constituent atoms or molecules are aligned in a spatially ordered manner. Note that a single crystal semiconductor also includes a disordered semiconductor such as a semiconductor partly having a lattice defect in which the alignment of atoms or molecules is disordered or a semiconductor having intended or unintended lattice distortion.

Figure 11A:
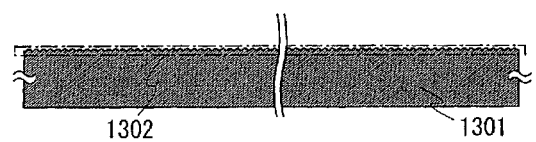
FIGS. 11A to 11C are views illustrating a method for manufacturing a photoelectric conversion device.
Figure 11B:
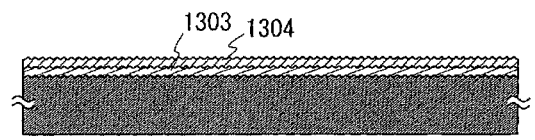
Figure 11C:
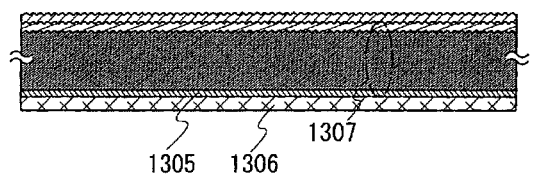

FIGS. 11A to 11C illustrate an example of a manufacturing process of a cell including a photoelectric conversion layer of this embodiment.

First, one surface of a single crystal semiconductor substrate 1301 having a first conductivity type is processed by etching or the like, whereby a texture structure (an uneven structure) 1302 is formed (FIG. 11A). When the surface of the single crystal semiconductor substrate 1301 is made to have the texture structure, light can be diffusely reflected. Thus, light which is incident on a semiconductor junction to be formed later can be efficiently converted into electric energy.

Note that the conductivity type of the single crystal semiconductor substrate 1301 is not particularly limited to the first conductivity type (e.g., p-type). It is preferable that the concentration of an impurity element which is introduced to the single crystal semiconductor substrate 1301 be lower than the concentration of an impurity element imparting a conductivity type which is introduced to a first semiconductor layer and a third semiconductor layer which are formed later.

As the single crystal semiconductor substrate 1301, a semiconductor wafer of silicon, germanium, or the like; a compound semiconductor wafer of gallium arsenide, indium phosphide, or the like; or the like can be used. In particular, a single crystal silicon wafer is preferably used.

Many of single crystal silicon wafers on the market are circular in shape. In the case where such a circular wafer is used, the circular wafer may be processed to be rectangular or polygonal in shape as described in the above embodiment with reference to FIGS. 10A to 10C.

Next, a first semiconductor layer 1303 is formed over the texture structure 1302 of the single crystal semiconductor substrate 1301. The first semiconductor layer 1303 may be formed in such a manner that an impurity element imparting a second conductivity type is introduced to the single crystal semiconductor substrate 1301 by a thermal diffusion method or the like, or may be deposited over the single crystal semiconductor substrate 1301 in which the texture structure 1302 is formed. Note that an element belonging to Group 15 of the periodic table, for example, phosphorus may be used as the impurity element imparting the second conductivity type.

Next, a conductive film 1304 serving as a surface electrode is formed over the first semiconductor layer 1303 (FIG. 11B). Note that another film such as an anti-reflective film may be formed between the first semiconductor layer 1303 and the conductive film 1304.

Note that the conductive film 1304 can be formed by a photo-sputtering method or a vacuum evaporation method. Further, the conductive film 1304 is preferably formed using a material which sufficiently transmits light. The conductive film 1304 can be formed using, for example, indium tin oxide (ITO), indium tin oxide containing silicon oxide (ITSO), organoimdium, organotin, zinc oxide (ZnO), indium oxide containing zinc oxide (indium zinc oxide (IZO)), ZnO doped with gallium (Ga), tin oxide ($SnO_2$), indium oxide containing tungsten oxide, indium zinc oxide containing tungsten oxide, indium oxide containing titanium oxide, or indium tin oxide containing titanium oxide. As a conductive material with a light-transmitting property, a conductive high molecular material (also referred to as a conductive polymer) can be used. As the conductive high molecular material, a π electron conjugated conductive high molecule can be used. For example, polyaniline and/or a derivative thereof, polypyrrole and/or a derivative thereof, polythiophene and/or a derivative thereof, a copolymer of two or more kinds of those materials, and the like can be given.

The conductive film 1304 may be formed by application and printing of a solvent containing a metal such as a silver paste by a printing method such as a screen printing method. A surface on which the conductive film 1304 is formed serves as a light-receiving surface. For that reason, the conductive film is not formed on the entire surface but is formed in a net-like shape so that light can be sufficiently transmitted.

Next, a third semiconductor layer 1305 and a conductive film 1306 serving as a back electrode are formed on a surface opposite to a surface where the texture structure 1302 of the single crystal semiconductor substrate 1301 and the conductive film 1304 are provided (FIG. 11C). The third semiconductor layer 1305 may be formed in such a manner that an impurity element imparting a first conductivity type is introduced to the single crystal semiconductor substrate 1301 by a thermal diffusion method or the like or may be deposited to be in contact with the single crystal semiconductor substrate 1301. As the impurity element imparting the first conductivity type, for example, an element belonging to Group 13 of the periodic table, such as boron, may be used.

Further, a metal film with high light reflectivity is preferably used as the conductive film 1306. For example, aluminum, silver, titanium, tantalum, or the like can be used. The conductive film 1306 can be formed by an evaporation method or a sputtering method. The conductive film 1306 may be formed of plural layers. For example, a buffer layer or the like for improving adhesion between the conductive film 1306 and the third semiconductor layer 1305 may be formed of a metal film, a metal oxide film, a metal nitride film, or the like, and those layers may be stacked. The conductive film 1306 may be formed of a stacked layer of a metal film with high light reflectivity and a metal film with low light reflectivity.

Through the above steps, a photoelectric conversion layer 1307 which includes the first semiconductor layer 1303, the single crystal semiconductor substrate 1301 serving as the second semiconductor layer, and the third semiconductor layer 1305 and which is interposed between the conductive film 1304 and the conductive film 1306 can be obtained, and a cell including the photoelectric conversion layer formed using the single crystal semiconductor substrate can be manufactured. In this embodiment, when the cell including the photoelectric conversion layer is attached to a cell including another photoelectric conversion layer with a structure body (prepreg) in which a fibrous body is impregnated with an organic resin and which is partly conductive as described in the above embodiment, a photoelectric conversion device can be manufactured.

Note that this embodiment can be combined with any of other embodiments as appropriate.

Embodiment 6

Figure 12:
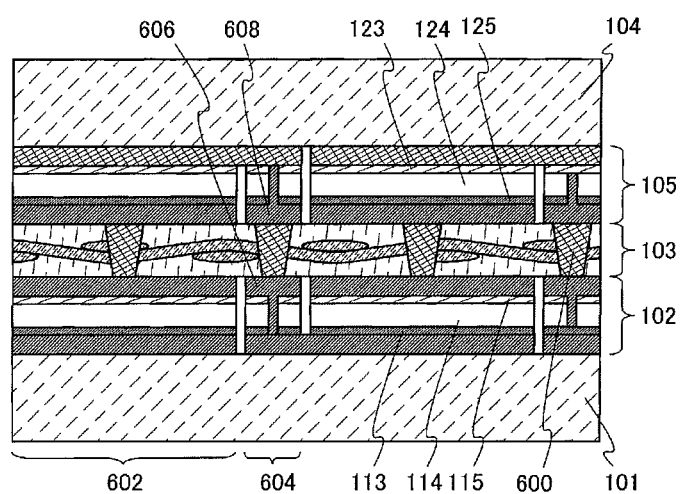
FIG. 12 is a cross-sectional view illustrating a photoelectric conversion device.

In this embodiment, an example of a photoelectric conversion device in which cells are connected in series will be described (FIG. 12).

The photoelectric conversion device illustrated in FIG. 12 has a structure in which a cell 102 supported by a substrate 101 and a cell 105 supported by a substrate 104 are electrically connected to each other through a conductor 600 included in a structure body 103.

Specifically, in a photoelectric conversion region 602, photoelectric conversion layers are electrically connected to each other in a vertical direction (a direction perpendicular to the substrate) to be connected in series. In addition, in a terminal region 604, conductive layers in adjacent regions are electrically connected to each other through a connection terminal 606 and a connection terminal 608, whereby the photoelectric conversion layers in the adjacent regions can be connected in series.

Although there is no particular limitation on the manufacturing method, for example, a method described below can be employed. A first conductive layer with a predetermined pattern is formed over the substrate 101, a photoelectric conversion layer is formed, the photoelectric conversion layer is patterned to form a contact hole reaching the first conductive layer, a second conductive layer is formed so as to cover the photoelectric conversion layer, and at least the photoelectric conversion layer and the second conductive layer are patterned, whereby the cell 102 is formed over the substrate 101. The cell 105 is formed over the substrate 104 by a method similar to the above-described method. The cell 102 and the cell 105 are attached to each other with the structure body 103 including the conductor 600, whereby a photoelectric conversion device is completed. Note that the aforementioned embodiment may be referred to for detailed description of each step.

The above described structure enables a large number of photoelectric conversion layers to be connected in series. In other words, a photoelectric conversion device capable of supplying sufficient voltage also for use which requires a large amount of voltage can be provided.

Note that this embodiment can be combined with any of other embodiments as appropriate.

Embodiment 7

In this embodiment, an example of an apparatus that can be used for manufacture of a photoelectric conversion device will be described with reference to the drawings.

Figure 13:
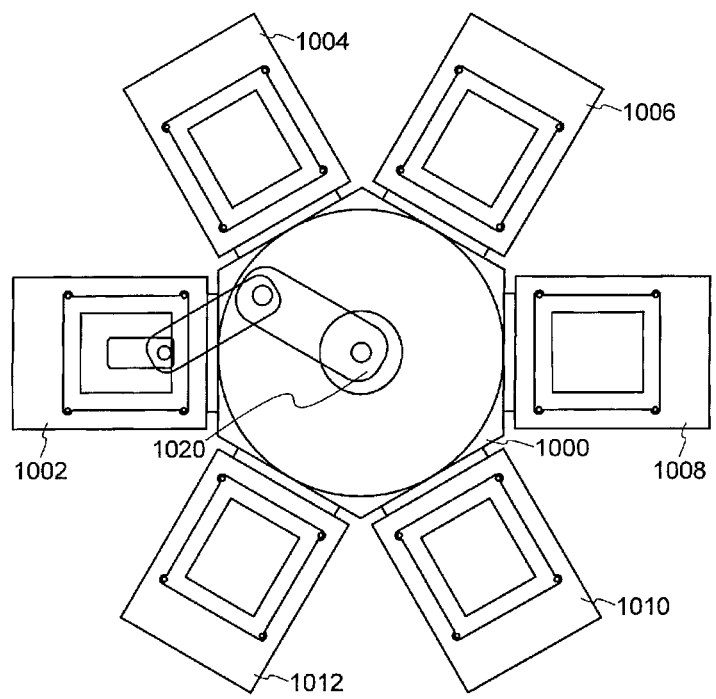
FIG. 13 is a view illustrating a structure of an apparatus used for manufacturing a photoelectric conversion layer.

FIG. 13 illustrates an example of an apparatus that can be used for manufacture of a photoelectric conversion device, especially, a photoelectric conversion layer. The apparatus illustrated in FIG. 13 is equipped with a transfer chamber 1000, a load/unload chamber 1002, a first deposition chamber 1004, a second deposition chamber 1006, a third deposition chamber 1008, a fourth deposition chamber 1010, a fifth deposition chamber 1012, and a transfer robot 1020.

A substrate is transferred between the load/unload chamber 1002 and the deposition chambers by the transfer robot 1020 provided in the transfer chamber 1000. In each deposition chamber, a semiconductor layer included in a photoelectric conversion layer is formed. Hereinafter, an example of a deposition process of a photoelectric conversion layer with the apparatus is described.

First, a substrate introduced into the load/unload chamber 1002 is transferred to the first deposition chamber 1004 by the transfer robot 1020. It is desirable that a conductive film serving as an electrode or a wiring be formed over the substrate in advance. The material, shape (pattern), and the like of the conductive film can be changed as appropriate in accordance with required optical characteristics or electrical characteristics. Note that the case where a glass substrate is used as the substrate, a conductive film with a light-transmitting property is formed as the conductive film, and light enters a photoelectric conversion layer from the conductive film is described here as an example.

In the first deposition chamber 1004, a first semiconductor layer which is to be in contact with the conductive film is formed. Here, the case where a semiconductor layer (a p-layer) to which an impurity element imparting p-type conductivity is added is formed as the first semiconductor layer is described. However, an embodiment of the invention disclosed herein is not limited thereto. A semiconductor layer (an n-layer) to which an impurity element imparting n-type conductivity is added may be formed. A CVD method and the like can be given as a typical example of a deposition method; however, an embodiment of the invention disclosed herein is not limited thereto. The first semiconductor layer may be formed by, for example, a sputtering method. Note that in the case where the first semiconductor layer is formed by a CVD method, the deposition chamber can also be called a "CVD chamber".

Next, the substrate over which the first semiconductor layer is formed is transferred to any of the second deposition chamber 1006, the third deposition chamber 1008, or the fourth deposition chamber 1010. In the second deposition chamber 1006, the third deposition chamber 1008, or the fourth deposition chamber 1010, a second semiconductor layer (an i-layer) to which an impurity element imparting conductivity type is not added is formed so as to be in contact with the first semiconductor layer.

Three deposition chambers of the second deposition chamber 1006, the third deposition chamber 1008, and the fourth deposition chamber 1010 are prepared for forming the second semiconductor layer because the second semiconductor layer needs to be formed to have a larger thickness than the first semiconductor layer. In the case where the second semiconductor layer is formed to have a larger thickness than the first semiconductor layer, the time needed for the formation process of the second semiconductor layer is longer than that needed for the formation process of the first semiconductor layer in view of the deposition rates of the first semiconductor layer and the second semiconductor layer. Therefore, in the case where the second semiconductor layer is formed in only one deposition chamber, the deposition process of the second semiconductor layer is a rate-controlling factor. For the above reason, the apparatus illustrated in FIG. 13 has a structure in which three deposition chambers are provided for formation of the second semiconductor layer. Note that the structure of the apparatus which can be used for formation of the photoelectric conversion layer is not limited thereto. Although a CVD method or the like can also be used for forming the second semiconductor layer similarly to the case of the first semiconductor layer, an embodiment of the invention disclosed herein is not limited thereto.

Next, the substrate over which the second semiconductor layer is formed is transferred to the fifth deposition chamber 1012. In the fifth deposition chamber 1012, a third semiconductor layer to which an impurity element imparting a different conductivity type from the first semiconductor layer is added is formed so as to be in contact with the second semiconductor layer. Here, the case where a semiconductor layer (an n-layer) to which an impurity element imparting n-type conductivity is added is formed as the third semiconductor layer is described. However, an embodiment of the invention disclosed herein is not limited thereto. Although a CVD method or the like can be used for forming the third semiconductor layer similarly to the case of the first semiconductor layer, an embodiment of the invention disclosed herein is not limited thereto.

Through the above steps, a photoelectric conversion layer having a structure in which the first semiconductor layer, the second semiconductor layer, and the third semiconductor layer are stacked can be formed over the conductive film.

The apparatus equipped with the load/unload chamber 1002; the first deposition chamber 1004 for forming the first semiconductor layer; the second deposition chamber 1006, the third deposition chamber 1008, and the fourth deposition chamber 1010 for forming the second semiconductor layer; and the fifth deposition chamber 1012 for forming the third semiconductor layer is described with reference to FIG. 13. However, the structure of the apparatus that can be used for manufacture of the photoelectric conversion device of the invention disclosed herein is not limited to this structure. For example, the fourth deposition chamber 1010 may be used for formation of the third semiconductor layer.

The example of the apparatus equipped with six chambers is described with reference to FIG. 13; however, the apparatus that can be used for manufacture of the photoelectric conversion device of the invention disclosed herein is not limited to this structure. The apparatus may be equipped with, for example, a deposition chamber for forming a conductive film, a surface treatment chamber for performing various kinds of surface treatment, an analysis chamber for analyzing film quality, or the like.

FIG. 14 illustrates an example of an apparatus that can be used for formation of a structure in which a plurality of photoelectric conversion layers are stacked. The apparatus illustrated in FIG. 14 is equipped with a transfer chamber 2100, an analysis chamber 2102, a surface treatment chamber 2104, a first deposition chamber 2106, a load chamber 2108, a second deposition chamber 2110, a third deposition chamber 2112, a fourth deposition chamber 2114, a transfer robot 2120, a transfer chamber 2140, a first deposition chamber 2142, a second deposition chamber 2144, a third deposition chamber 2146, an unload chamber 2148, a fourth deposition chamber 2150, a fifth deposition chamber 2152, a sixth deposition chamber 2154, and a transfer robot 2160. The apparatus has a structure in which the transfer chamber 2100 and the transfer chamber 2140 are connected to each other with a connection chamber 2180.

A substrate is transferred between the load chamber 2108, the analysis chamber 2102, the surface treatment chamber 2104, and the deposition chambers around the transfer chamber 2100 by the transfer robot 2120 provided in the transfer chamber 2100. In addition, a substrate is transferred between the unload chamber 2148 and the deposition chambers around the transfer chamber 2140 by the transfer robot 2160 provided in the transfer chamber 2140. In the deposition chambers, semiconductor layers included in a photoelectric conversion layer, a conductive film of a photoelectric conversion device, and the like are formed. Hereinafter, an example of a deposition process of the photoelectric conversion layer with the apparatus is described.

First, a substrate introduced into the load chamber 2108 is transferred to the first deposition chamber 2106 by the transfer robot 2120. A conductive film serving as an electrode or a wiring is formed over the substrate in the first deposition chamber 2106. The material, shape (pattern), and the like of the conductive film can be changed as appropriate in accordance with required optical characteristics or electrical characteristics. A sputtering method can typically be used as a deposition method of the conductive film; however, an embodiment of the invention disclosed herein is not limited thereto. For example, an evaporation method or the like may be used. In the case where the conductive film is formed by a sputtering method, the deposition chamber can also be called a "sputtering chamber". Note that the case where a glass substrate is used as the substrate, a conductive film with a light-transmitting property is formed as the conductive film, and light enters a photoelectric conversion layer from the conductive film is described here as an example.

Next, the substrate over which the conductive film is formed is transferred to the surface treatment chamber 2104. In the surface treatment chamber 2104, treatment for making a surface of the conductive film have an uneven shape (a texture structure) is performed. This realizes confinement of light in the photoelectric conversion layer; therefore, photoelectric conversion efficiency of the photoelectric conversion device can be increased. Etching treatment can be given as an example of a formation method of the uneven shape; however, an embodiment of the invention disclosed herein is not limited thereto.

Next, the substrate is transferred to the second deposition chamber 2110. In the second deposition chamber 2110, a first semiconductor layer of a first photoelectric conversion layer which is to be in contact with the conductive film is formed. Here, the case where a semiconductor layer (a p-layer) to which an impurity element imparting p-type conductivity is added is formed as the first semiconductor layer is described. However, an embodiment of the invention disclosed herein is not limited thereto. A semiconductor layer (an n-layer) to which an impurity element imparting n-type conductivity is added may be formed. A CVD method or the like can be given as a typical example of a deposition method; however, an embodiment of the invention disclosed herein is not limited thereto. The first semiconductor layer may be formed by, for example, a sputtering method.

Next, the substrate over which the first semiconductor layer is formed is transferred to the third deposition chamber 2112. In the third deposition chamber 2112, a second semiconductor layer (an i-layer) to which an impurity element imparting conductivity type is not added is formed so as to be in contact with the first semiconductor layer. A CVD method and the like can be given as an example of a formation method of the second semiconductor layer similarly to the case of the first semiconductor layer. However, an embodiment of the invention disclosed herein is not limited thereto.

Next, the substrate over which the second semiconductor layer is formed is transferred to the fourth deposition chamber 2114. In the fourth deposition chamber 2114, a third semiconductor layer to which an impurity element imparting a different conductivity type from the first semiconductor layer is added is formed so as to be in contact with the second semiconductor layer. Here, the case where a semiconductor layer (an n-layer) to which an impurity element imparting n-type conductivity is added is formed as the third semiconductor layer is described. However, an embodiment of the invention disclosed herein is not limited thereto. Although a CVD method or the like can be used for formation of the third semiconductor layer similarly to the case of the first semiconductor layer, an embodiment of the invention disclosed herein is not limited thereto.

Through the above steps, a first photoelectric conversion layer having a structure in which the first semiconductor layer, the second semiconductor layer, and the third semiconductor layer are stacked can be formed over the conductive film.

Next, the substrate over which the first photoelectric conversion layer is formed is again transferred to the first deposition chamber 2106. In the first deposition chamber 2106, an intermediate layer with conductivity is formed over the first photoelectric conversion layer. Although the material, shape (pattern), and the like of the intermediate layer can be changed as appropriate in accordance with required optical characteristics or electrical characteristics, the intermediate layer desirably has a similar structure to the conductive film in view of the manufacturing process.

Next, the substrate over which the intermediate layer is formed is delivered to the transfer robot 2160 through the connection chamber 2180. The transfer robot 2160 transfers the substrate to the first deposition chamber 2142. In the first deposition chamber 2142, a first semiconductor layer of a second photoelectric conversion layer which is to be in contact with the intermediate layer is formed. Here, the case where a semiconductor layer (a p-layer) to which an impurity element imparting p-type conductivity is added is formed as the first semiconductor layer is described. However, an embodiment of the invention disclosed herein is not limited thereto. Although a CVD method or the like can be given as a typical example of a deposition method, an embodiment of the invention disclosed herein is not limited thereto.

Next, the substrate over which the first semiconductor layer is formed is transferred to any of the fourth deposition chamber 2150, the fifth deposition chamber 2152, and the sixth deposition chamber 2154. In the fourth deposition chamber 2150, the fifth deposition chamber 2152, and the sixth deposition chamber 2154, a second semiconductor layer (an i-layer) to which an impurity element imparting conductivity type is not added is formed so as to be in contact with the first semiconductor layer. Although a CVD method or the like can be given as an example of a deposition method similarly to the case of the first semiconductor layer, an embodiment of the invention disclosed herein is not limited thereto.

Three deposition chambers of the fourth deposition chamber 2150, the fifth deposition chamber 2152, and the sixth deposition chamber 2154 are prepared for formation of the second semiconductor layer for the reason similar to that for the apparatus illustrated in FIG. 13. In other words, the second semiconductor layer (the i-layer) in the second photoelectric conversion layer is formed to have a larger thickness than the second semiconductor layer (the i-layer) in the first photoelectric conversion layer. Note that the structure of the apparatus that can be used for formation of the photoelectric conversion layer is not limited thereto. Although a CVD method or the like can be used for formation of the second semiconductor layer similarly to the case of the first semiconductor layer, an embodiment of the invention disclosed herein is not limited thereto.

Next, the substrate over which the second semiconductor layer is formed is transferred to the second deposition chamber 2144. In the second deposition chamber 2144, a third semiconductor layer to which an impurity element imparting a different conductivity type from the first semiconductor layer is added is formed so as to be in contact with the second semiconductor layer. Here, the case where a semiconductor layer (an n-layer) to which an impurity element imparting n-type conductivity is added is formed as the third semiconductor layer is described. However, an embodiment of the invention disclosed herein is not limited thereto. Although a CVD method or the like can be used for formation of the third semiconductor layer similarly to the case of the first semiconductor layer, an embodiment of the invention disclosed herein is not limited thereto.

Through the above steps, the second photoelectric conversion layer having a structure in which the first semiconductor layer, the second semiconductor layer, and the third semiconductor layer are stacked can be formed over the intermediate layer.

Next, the substrate over which the second photoelectric conversion layer is formed is transferred to the third deposition chamber 2146. In the third deposition chamber 2146, a conductive film serving as an electrode or a wiring is formed over the second photoelectric conversion layer. The material, shape (pattern), and the like of the conductive film can be changed as appropriate in accordance with required optical characteristics or electrical characteristics. A sputtering method can typically be used as a deposition method of the conductive film; however, an embodiment of the invention disclosed herein is not limited thereto. For example, an evaporation method or the like may be used. In the case where the conductive film is formed by a sputtering method, the deposition chamber can also be called a "sputtering chamber". Note that, although the case where a conductive film with light reflectivity is formed as the conductive film is described here, an embodiment of the invention disclosed herein is not limited thereto. For example, a conductive film with a light-transmitting property and a conductive film with light reflectivity may be stacked to form the conductive film.

After that, the substrate is taken out of the unload chamber 2148.

Through the above steps, a photoelectric conversion device having a structure in which the conductive film, the first photoelectric conversion layer, the intermediate layer, the second photoelectric conversion layer, and the conductive film are stacked in that order over the substrate can be manufactured.

Note that the structures of the chambers connected to the transfer chamber 2100 and the transfer chamber 2140 are not limited to the structures illustrated in FIG. 14. The number of chambers can be increased or decreased.

Note that the timing or the number of surface treatment for the conductive films or the like is not limited to that described above. For example, surface treatment may be performed after the formation of the conductive film. Etching treatment for pattern formation, or the like may be performed before or after the formation of each layer.

This embodiment can be combined with any of other embodiments as appropriate.

Embodiment 8

Figure 15A:
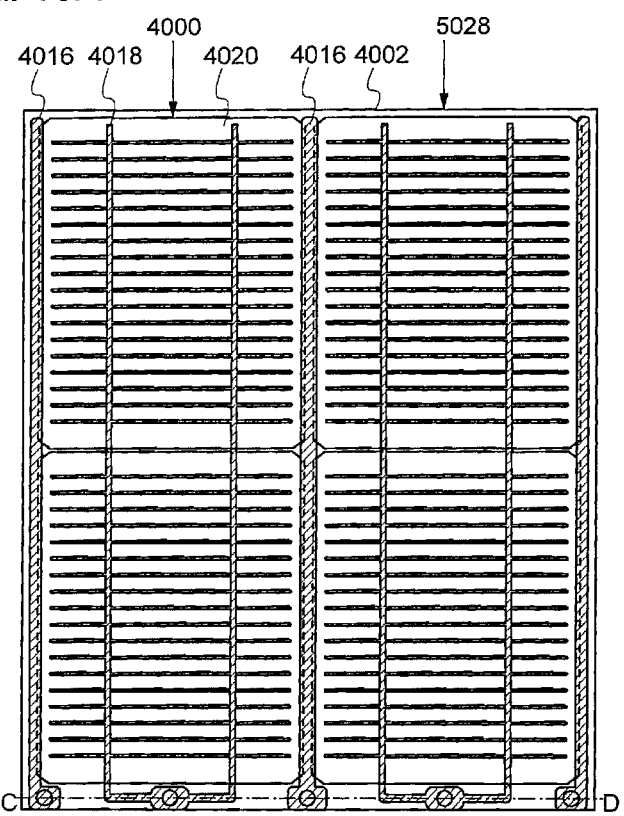
FIGS. 15A and 15B are views illustrating a structure of a solar photovoltaic module.

A solar photovoltaic module can be manufactured using the photoelectric conversion device obtained by any of Embodiments 1 to 7 and the like. In this embodiment, an example of a solar photovoltaic module in which the photoelectric conversion device described in Embodiment 7 is used is illustrated in FIG. 15A. A solar photovoltaic module 5028 includes a photoelectric conversion layer 4020 provided over a supporting substrate 4002. Between the supporting substrate 4002 and the photoelectric conversion layer 4020, an insulating layer and a first electrode are sequentially provided from the supporting substrate 4002 side. Further, the first electrode is connected to an auxiliary electrode 4016.

Figure 15B:
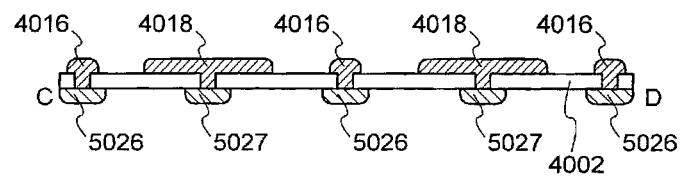

The auxiliary electrode 4016 and a second electrode 4018 are formed on one surface side of the supporting substrate 4002 (the side where the photoelectric conversion layer 4020 is formed) and are connected to a back electrode 5026 and a back electrode 5027 which are used for an external terminal connector, respectively, at end portions of the supporting substrate 4002. FIG. 15B is a cross-sectional view taken along line C-D of FIG. 15A. In FIG. 15B, the auxiliary electrode 4016 and the second electrode 4018 are connected to the back electrode 5026 and the back electrode 5027, respectively, through penetration openings of the supporting substrate 4002.

Note that this embodiment can be combined with any of other embodiments as appropriate.

Embodiment 9

FIG. 16 illustrates an example of a solar photovoltaic system in which the solar photovoltaic module 5028 described in Embodiment 8 is used. A charge control circuit 5029 provided with a DC-DC converter or the like controls electric power supplied from one or a plurality of solar photovoltaic modules 5028 to charge a storage battery 5030. Further, in the case where the storage battery 5030 is sufficiently charged, the charge control circuit 5029 controls electric power supplied from one or a plurality of solar photovoltaic modules 5028 so that the electric power is directly output to a load 5031.

When an electric double layer capacitor is used as the storage battery 5030, the storage battery 5030 does not need chemical reaction in charging; thus, the storage battery 5030 can be charged rapidly. Further, the lifetime can be increased by about 8 times and charging and discharging efficiency can be increased by about 1.5 times compared to those of a lead storage battery or the like which uses chemical reaction. The solar photovoltaic system described in this embodiment can be used for various types of loads 5031 which use electric power, such as lighting or an electronic device.

Note that this embodiment can be combined with any of other embodiments as appropriate.

Embodiment 10

Figure 17A:
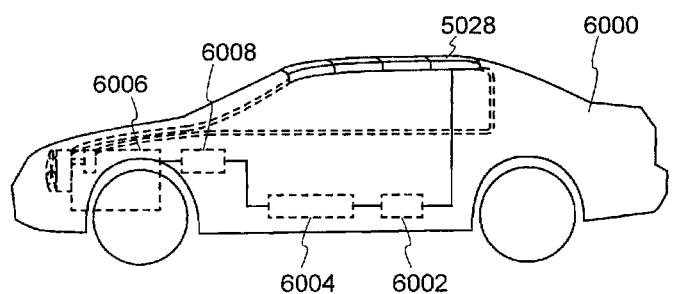
FIGS. 17A and 17B are views illustrating a structure of a vehicle using a solar photovoltaic module.
Figure 17B:
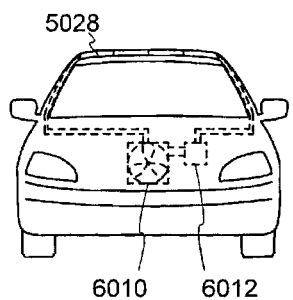

FIGS. 17A and 17B illustrate an example of a vehicle (car) 6000 in which the solar photovoltaic module 5028 described in Embodiment 8 is used for its roof portion. The solar photovoltaic module 5028 is connected to a battery or a capacitor 6004 through a converter 6002. In other words, the battery or the capacitor 6004 is charged with electric power supplied from the solar photovoltaic module 5028. Charge or discharge may be selected in accordance with operation condition of an engine 6006 which is monitored by a monitor 6008.

The photoelectric conversion efficiency of the solar photovoltaic module 5028 tends to be decreased by heat. In order to suppress such a decrease in photoelectric conversion efficiency, liquid for cooling or the like may be circulated in the solar photovoltaic module 5028. For example, cooling water in a radiator 6010 may be circulated by a circulation pump 6012. Needless to say, an embodiment of the invention disclosed herein is not limited to the structure in which the liquid for cooling is shared by the solar photovoltaic module 5028 and the radiator 6010. In the case where a decrease in photoelectric conversion efficiency is not serious, the liquid does not need to be circulated.

Note that this embodiment can be combined with any of other embodiments as appropriate.

Embodiment 11

Figure 18:
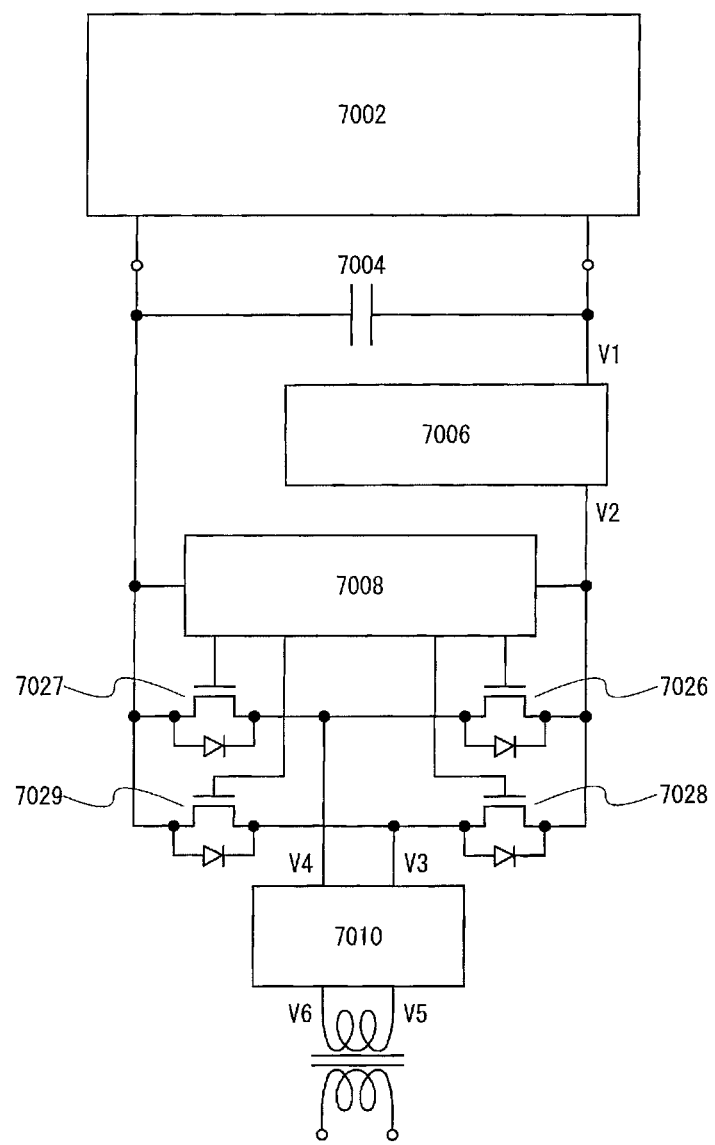
FIG. 18 is a diagram illustrating an embodiment of an inverter.

FIG. 18 illustrates one mode of an inverter capable of stably extracting AC power from an output of a photoelectric conversion device of an embodiment without using an external power source.

Since the output of the photoelectric conversion device varies depending on the amount of incident light, stable output cannot be obtained in some cases when an output voltage is used without any change. The inverter which is illustrated in FIG. 18 as an example is provided with a capacitor 7004 for stabilization and a switching regulator 7006 to operate so as to produce a stable DC voltage.

For example, a stable DC voltage of 30 V can be produced by the switching regulator 7006 when the output voltage of the photoelectric conversion device 7002 is 10 V to 15 V.

Figure 19:
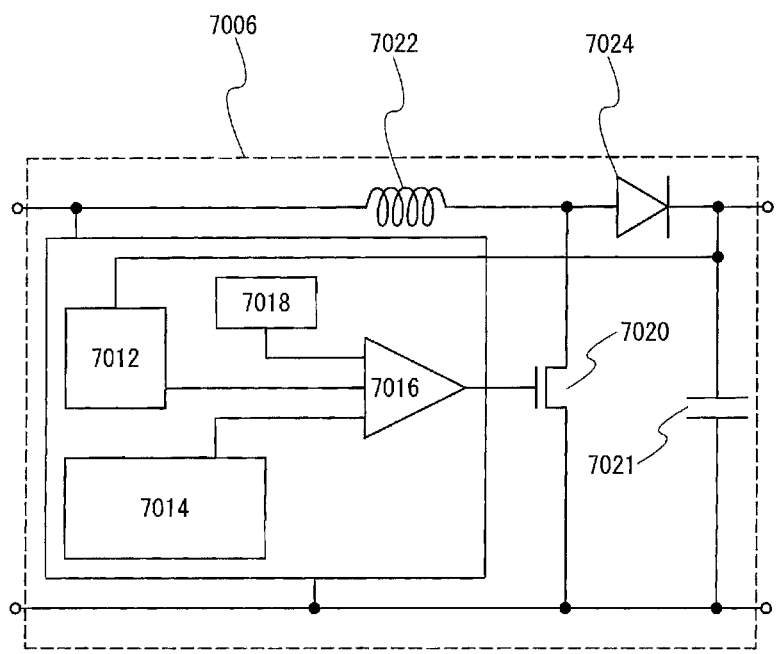
FIG. 19 is a block diagram of a switching regulator.

FIG. 19 is a block diagram of the switching regulator 7006. The switching regulator 7006 includes an attenuator 7012, a triangle wave generation circuit 7014, a comparator 7016, a switching transistor 7020, and a smoothing capacitor 7021.

When a signal of the triangle wave generation circuit 7014 is input to the comparator 7016, the switching transistor 7020 is turned on, whereby energy is stored in an inductor 7022. Thus, a voltage V2 that is greater than or equal to an output voltage V1 of the photoelectric conversion device 7002 is produced at an output of the switching regulator 7006. This voltage returns to the comparator 7016 via the attenuator 7012, and a produced voltage is controlled so as to be equal to a reference voltage 7018.

For example, with a reference voltage of 5 V and adjustment with the attenuator (⅙), the voltage V2 is controlled so as to be 30 V.

A diode 7024 is provided for backflow prevention. The output voltage of the switching regulator 7006 is smoothed by the smoothing capacitor 7021.

In FIG. 18, a pulse width modulation circuit 7008 is operated using the output voltage V2 of the switching regulator 7006. In the pulse width modulation circuit 7008, a pulse width modulation wave can be digitally generated by a microcomputer or may be generated in an analog manner.

Outputs of the pulse width modulation circuit 7008 are input to switching transistors 7026 to 7029, whereby pulse width modulation waves V3 and V4 are generated. The pulse width modulation waves V3 and V4 are converted into sine waves through a band pass filter 7010.

Figure 20:
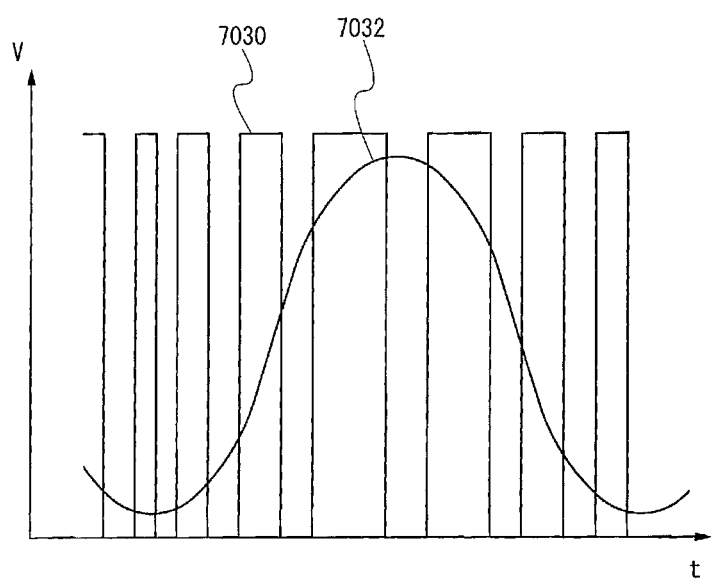
FIG. 20 is a graph showing output voltage from a photoelectric conversion device.

In other words, as illustrated in FIG. 20, a pulse width modulation wave 7030 is a rectangular wave the duty cycle of which is changed in a given cycle, and the pulse width modulation wave 7030 is passed through the band path filter 7010, so that a sin wave 7032 can be obtained.

As described above, AC power V5 and V6 can be generated using the output of the photoelectric conversion device 7002, without using an external power source.

Note that this embodiment can be combined with any of other embodiments as appropriate.

Embodiment 12

Figure 21:
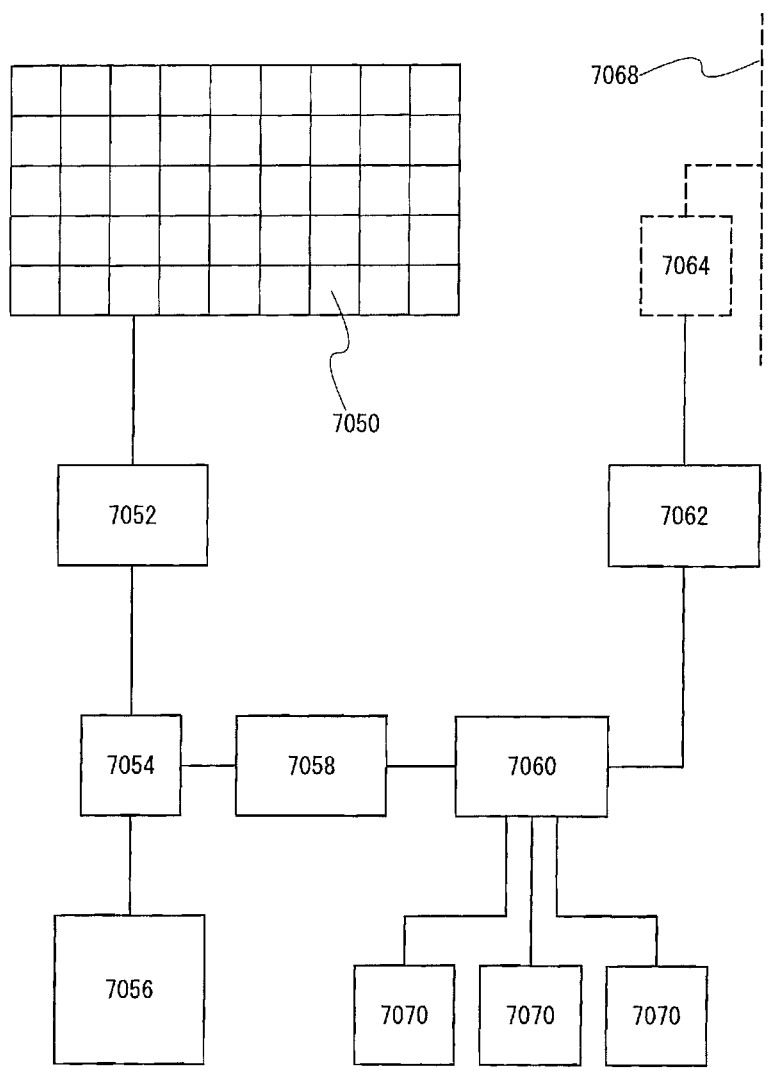
FIG. 21 is a diagram illustrating one example of a photovoltaic system.

In this embodiment, an example of a photovoltaic system will be described with reference to FIG. 21. A structure in which this photovoltaic system is installed on a house or the like will be described.

This photovoltaic system has a structure in which electric power generated in a photoelectric conversion device 7050 is used for charging of a power storage device 7056, or electric power generated can be consumed as AC power in an inverter 7058. Surplus electric power generated in the photoelectric conversion device 7050 is sold to an electric power company or the like. On the other hand, at night time or at the time of rain when electric power is insufficient, electric power is supplied from an electric grid 7068 to a house or the like.

Consumption of electric power generated in the photoelectric conversion device 7050 and reception of electric power from the electric grid 7068 are switched by a DC switch 7052 connected to the photoelectric conversion device 7050 side and an AC switch 7062 connected to the electric grid 7068 side.

A charge control circuit 7054 controls charging of the power storage device 7056 and controls supply of electric power from the power storage device 7056 to the inverter 7058.

The power storage device 7056 includes a secondary battery such as a lithium-ion battery or a capacitor such as a lithium-ion capacitor. A secondary battery or a capacitor utilizing sodium instead of lithium as an electrode material may be used in such a power storage unit.

AC power output from the inverter 7058 is used as electric power for operating various types of electric devices 7070.

Surplus electric power generated in the photoelectric conversion device 7050 can be transmitted through the electric grid 7068 to be sold to an electric power company. The AC switch 7062 is provided for selection of connection or disconnection between the electric grid 7068 and a distribution board 7060 through a transformer 7064.

As described above, the photovoltaic system of this embodiment is capable of providing a house or the like having few environmental load with use of the photoelectric conversion device of an embodiment of the invention disclosed herein.

Note that this embodiment can be combined with any of other embodiments as appropriate.

Embodiment 13

Figure 22:
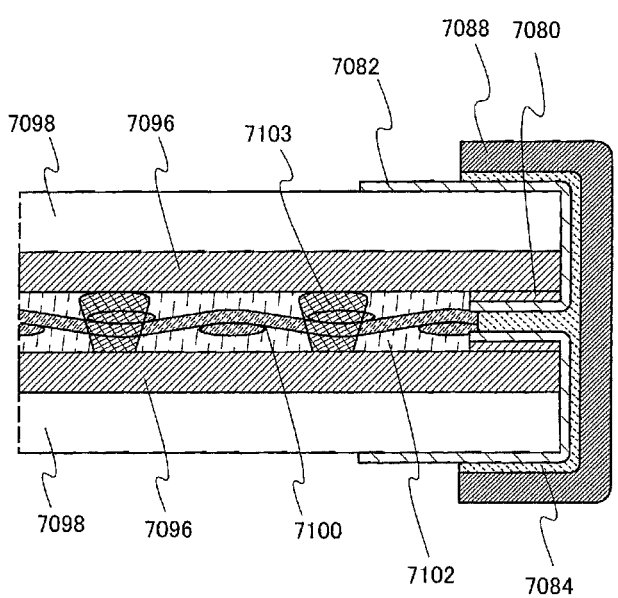
FIG. 22 is a view illustrating a peripheral portion of a photoelectric conversion module.

As illustrated in FIG. 22, a frame 7088 is provided in a peripheral portion of a pair of substrates 7098 which overlap so as to sandwich a fibrous body 7100 and an organic resin 7102 therebetween with their first surfaces provided with cells 7096 facing inward so that a photoelectric conversion device can have a mechanical strength. A pair of the cells 7096 are electrically connected to each other through a conductor 7103.

The inside of the frame 7088 is filled with a sealing resin 7084 so that entry of water can be prevented. A conductive member 7080 such as a solder or a conductive paste is provided for a contact portion of a terminal portion of each cell 7096 with a wiring member 7082 so that the bonding strength can be increased. The wiring member 7082 is led from the first surface side of the substrate 7098 to a second surface side inside the frame 7088.

A pair of the cells 7096 are bonded so that the substrates 7098 which serve as supporting members of the cells 7096 are provided outside and can serve as a two-side sealing member, and a reduction in thickness of a photoelectric conversion device can be achieved while increasing the amount of power generation by 1.5 times, ideally, 2 times.

Figure 23:
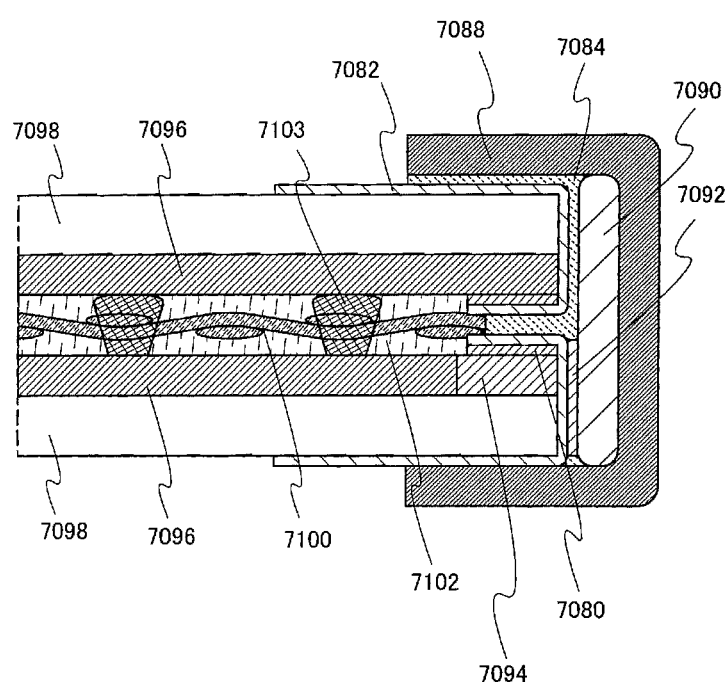
FIG. 23 is a view illustrating a peripheral portion of a photoelectric conversion module.

FIG. 23 illustrates a structure in which a power storage device 7090 is provided inside a frame 7088 of a photoelectric conversion device. A terminal 7092 of the power storage device 7090 is provided so as to be in contact with at least one of wiring members 7082. In that case, a backflow prevention diode 7094 formed using a semiconductor layer and a conductive film which are included in a cell 7096 is preferably formed between the cell 7096 and the power storage device 7090.

Note that as the power storage device 7090, a secondary battery such as a nickel-hydrogen battery or a lithium-ion battery, a capacitor such as a lithium-ion capacitor, or the like can be used. A secondary battery or a capacitor utilizing sodium instead of lithium as an electrode material may also be used in such a power storage unit. When the power storage device 7090 is formed in a film form, reductions in thickness and weight can be achieved. The frame 7088 can also function as a reinforcement member of the power storage device 7090.

Note that this embodiment can be combined with any of other embodiments as appropriate.

Embodiment 14

In this embodiment, improvement in photoelectric conversion efficiency by a plurality of photoelectric conversion layers was confirmed. Specifically, the dependence of photoelectric conversion efficiency (quantum efficiency) of a photoelectric conversion layer using amorphous silicon and a photoelectric conversion layer using single crystal silicon on wavelengths was obtained by computer calculation. The device simulator Atlas manufactured by Silvaco, Inc. was used as calculation software.

The photoelectric conversion layer used for the calculation had a p-i-n junction structure. As for the photoelectric conversion layer using amorphous silicon, the thicknesses of a p-layer, an i-layer, and an n-layer were 10 nm, 200 nm, and 10 nm, respectively. As for the photoelectric conversion layer using single crystal silicon, the thicknesses of a p-layer, an i-layer, and an n-layer were 10 nm, 30 µm, and 10 nm, respectively. Note that the concentrations of impurity elements in the p-layer and the n-layer were both $1\times10^{19}$ $(cm^{-3})$, and the calculation was performed under the condition where all the impurity elements were activated. In addition, reflection, scattering, absorption, and the like of light at a conductive layer serving as an electrode or an intermediate layer or at an interface between the conductive layer and the photoelectric conversion layer were not considered.

In this embodiment, for simplicity, the quantum efficiency of each photoelectric conversion layer was individually calculated under the condition where the amount of light which enters the photoelectric conversion layer using amorphous silicon and the amount of light which enters the photoelectric conversion layer using single crystal silicon are the same.

Figure 24:
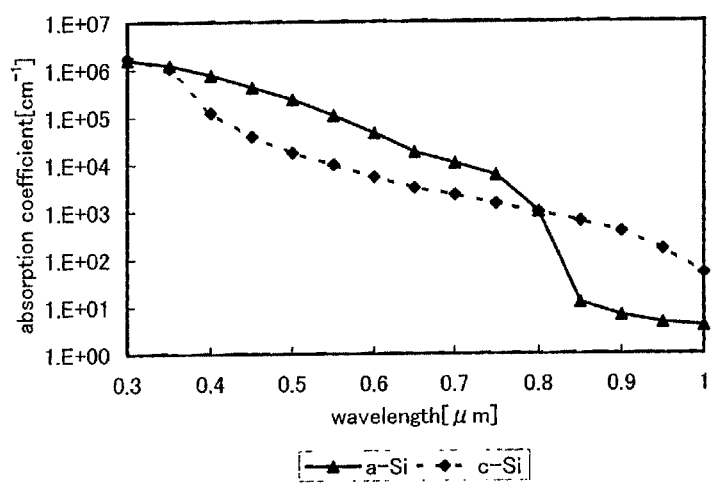
FIG. 24 is a graph showing the dependence of absorption coefficients of amorphous silicon (a-Si) and single crystal silicon (c-Si) on wavelengths.

FIG. 24 shows the light absorption coefficients $(cm^{-1})$ of amorphous silicon (a-Si) and single crystal silicon (c-Si) which were used as the precondition of the calculation. In FIG. 24, the horizontal axis represents wavelength (μm) and the vertical axis represents absorption coefficient $(cm^{-1})$ with respect to corresponding wavelengths.

Figure 25:
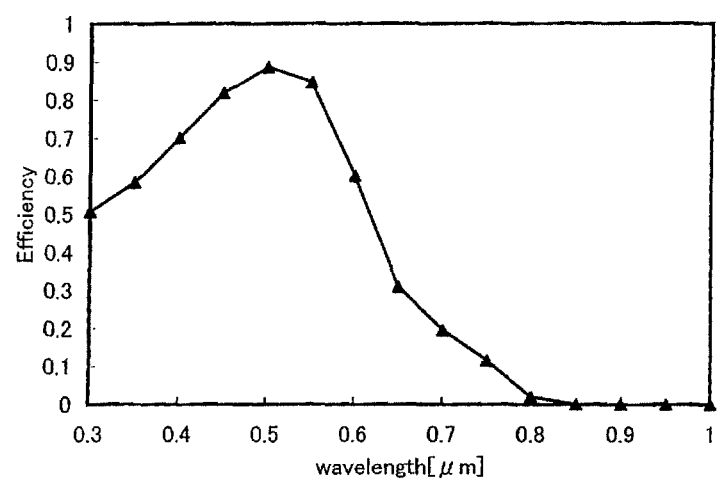
FIG. 25 is a graph showing the dependence of quantum efficiency of a photoelectric conversion layer using amorphous silicon (a-Si) on wavelengths.

FIG. 25 shows the quantum efficiency of the photoelectric conversion layer using amorphous silicon (a-Si), which was calculated on the basis of the above data. In FIG. 25, the horizontal axis represents wavelength (μm) and the vertical axis represents quantum efficiency with respect to corresponding wavelengths. The quantum efficiency is obtained on the basis of a fraction in which the denominator is a current of the case where all incident light is converted into current and the numerator is a current of a negative electrode.

According to FIG. 25, the photoelectric conversion efficiency of the photoelectric conversion layer using amorphous silicon is high on the shorter wavelength side (0.4 μm to 0.6 μm). The photoelectric conversion layer using amorphous silicon is capable of sufficient photoelectric conversion even when the thickness is approximately 100 nm. Further, the photoelectric conversion layer using amorphous silicon is preferably used as a top cell because it can sufficiently transmit light with a longer wavelength with the above thickness.

Figure 26:
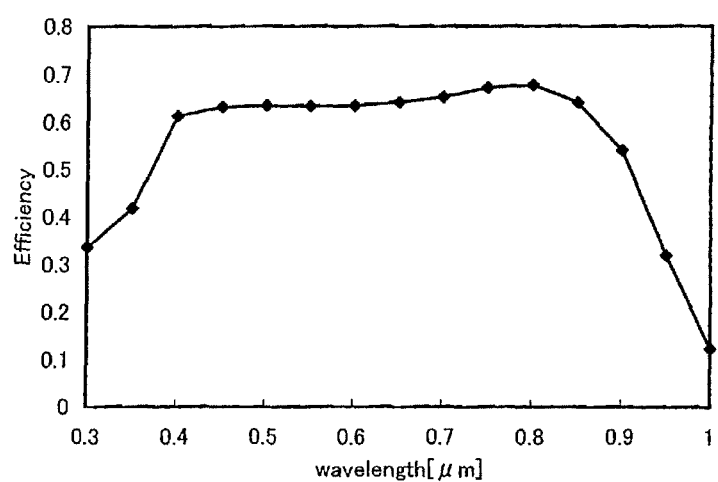
FIG. 26 is a graph showing the dependence of quantum efficiency of a photoelectric conversion layer using single crystal silicon (c-Si) on wavelengths.

FIG. 26 shows the quantum efficiency of the photoelectric conversion layer using single crystal silicon (c-Si). In FIG. 26, as in FIG. 25, the horizontal axis represents wavelength (μm) and the vertical axis represents quantum efficiency with respect to corresponding wavelengths.

According to FIG. 26, the photoelectric conversion efficiency of the photoelectric conversion layer using single crystal silicon is high in a wide wavelength range (0.4 μm to 0.9 μm). The photoelectric conversion layer using single crystal silicon is preferably used as a bottom cell because its preferable thickness is several tens of micrometers.

Figure 27:
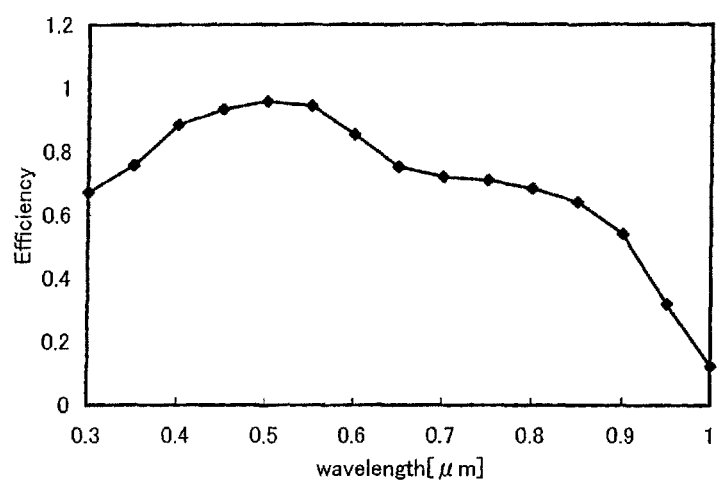
FIG. 27 is a graph showing the dependence of quantum efficiency of a structure in which photoelectric conversion layers are stacked on wavelengths.

FIG. 27 shows the quantum efficiency of a structure in which the photoelectric conversion layer using amorphous silicon and the photoelectric conversion layer using single crystal silicon are stacked, which was obtained using the results shown in FIG. 25 and FIG. 26. Note that FIG. 27 shows the quantum efficiency of the case where the photoelectric conversion layer using amorphous silicon was used as a top cell and the photoelectric conversion layer using single crystal silicon was used as a bottom cell. Here, for simplicity, the calculation was performed by excluding factors other than the above photoelectric conversion layers. In other words, an effect of an intermediate layer connecting the top cell and the bottom cell, or the like is not considered.

According to the calculation results of this embodiment, it was found that the wavelength suitable for photoelectric conversion in the photoelectric conversion layer using amorphous silicon and the wavelength suitable for photoelectric conversion in the photoelectric conversion layer using single crystal silicon were different. In other words, it can be said that the photoelectric conversion efficiency can be improved when those photoelectric conversion layers are stacked.

Note that this embodiment can be combined with any of other embodiments as appropriate.

This application is based on Japanese Patent Application serial no. 2009-136644 filed with Japan Patent Office on Jun. 5, 2009, the entire contents of which are hereby incorporated by reference.

REFERENCE NUMERALS

101: substrate, 102: cell, 103: structure body, 104: substrate, 105: cell, 106: fibrous body, 107: organic resin, 110: conductive film, 111: photoelectric conversion layer, 112: conductive film, 113: p-layer, 114: i-layer, 115: n-layer, 120: conductive film, 121: photoelectric conversion layer, 122: conductive film, 123: n-layer, 124: i-layer, 125: p-layer, 130: paste, 131: photoelectric conversion layer, 133: p-layer, 135: n-layer, 143: p-layer, 145: n-layer, 151: photoelectric conversion layer, 152: photoelectric conversion layer, 153: p-layer, 154: i-layer, 155: n-layer, 156: p-layer, 157: i-layer, 158: n-layer, 159: photoelectric conversion layer, 160: p-layer, 161: i-layer, 162: n-layer, 163: intermediate layer, 250: warp yarn, 251: weft yarn, 252: basket hole, 600: conductor, 602: photoelectric conversion region, 604: terminal region, 606: connection terminal, 608: connection terminal, 610: photoelectric conversion region, 614: photoelectric conversion region, 1000: transfer chamber, 1002: load/unload chamber, 1004: deposition chamber, 1006: deposition chamber, 1008: deposition chamber, 1010: deposition chamber, 1012: deposition chamber, 1020: transfer robot, 1101: single crystal semiconductor substrate, 1102: protective layer, 1103: first semiconductor layer, 1104: fragile layer, 1105: conductive film, 1106: insulating layer, 1107: supporting substrate, 1108: separation substrate, 1109: second semiconductor layer, 1110: third semiconductor layer, 1111: photoelectric conversion layer, 1112: conductive film, 1101*a*: single crystal semiconductor substrate, 1101*b*: single crystal semiconductor substrate, 1201: supporting substrate, 1202: separation layer, 1203: insulating layer, 1204: conductive film, 1205: first semiconductor layer, 1206: second semiconductor layer, 1207: third semiconductor layer, 1208: temporary supporting substrate, 1209: adhesive for separation, 1210: adhesive layer, 1211: plastic substrate, 1212: conductive film, 1221: photoelectric conversion layer, 121*a*: photoelectric conversion layer, 121*b*: photoelectric conversion layer, 1301: single crystal semiconductor substrate, 1302: texture structure, 1303: first semiconductor layer, 1304: conductive film, 1305: third semiconductor layer, 1306: conductive film, 1307: photoelectric conversion layer, 141*a*: photoelectric conversion layer, 141*b*: photoelectric conversion layer, 2100: transfer chamber, 2102: analysis chamber, 2104: surface treatment chamber, 2106: deposition chamber, 2108: load chamber, 2110: deposition chamber, 2112: deposition chamber, 2114: deposition chamber, 2120: transfer robot, 2140: transfer chamber, 2142: deposition chamber, 2144: deposition chamber, 2146: deposition chamber, 2148: unload chamber, 2150: deposition chamber, 2152: deposition chamber, 2154: deposition chamber, 2160: transfer robot, 2180: connection chamber, 4002: supporting substrate, 4016: auxiliary electrode, 4018: electrode, 4020: photoelectric conversion layer, 5026: back electrode, 5027: back electrode, 5028: solar photovoltaic module, 5029: charge control circuit, 5030: storage battery, 5031: load, 6000: vehicle, 6002: converter, 6004: capacitor, 6006: engine, 6008: monitor, 6010: radiator, 6012: circulation pump, 7002: photoelectric conversion device, 7004: capacitor, 7006: switching regulator, 7008: pulse width modulation circuit, 7010: band path filter, 7012: attenuator, 7014: triangle wave generation circuit, 7016: comparator, 7020: switching transistor, 7021: smoothing capacitor, 7022: inductor, 7024: diode, 7026: switching transistor, 7027: switching transistor, 7028: switching transistor, 7029: switching transistor, 7030: pulse width modulation wave, 7032: sin wave, 7050: photoelectric conversion device, 7052: DC switch, 7054: charge control circuit, 7056: power storage device, 7058: inverter, 7060: distribution board, 7062: AC switch, 7064: transformer, 7068: electric grid, 7070: electric device, 7096: cell, 7080: conductive member, 7082: wiring member, 7084: sealing resin, 7088: frame, 7090: power storage device, 7092: terminal, 7094: backflow prevention diode, 7096: cell, 7098: substrate, 7100: fibrous body, 7102: organic resin

EXPLANATION OF REFERENCE

101: substrate, 102: cell, 103: structure body, 104: substrate, 105: cell, 106: fibrous body, 107: organic resin, 110: conductive film, 111: photoelectric conversion layer, 112: conductive film, 113: p-layer, 114: i-layer, 115: n-layer, 120: conductive film, 121: photoelectric conversion layer, 122: conductive film, 123: n-layer, 124: i-layer, 125: p-layer, 130: paste, 131: photoelectric conversion layer, 133: p-layer, 135: n-layer, 143: p-layer, 145: n-layer, 151: photoelectric conversion layer, 152: photoelectric conversion layer, 153: p-layer, 154: i-layer, 155: n-layer, 156: p-layer, 157: i-layer, 158: n-layer, 159: photoelectric conversion layer, 160: p-layer, 161: i-layer, 162: n-layer, 163: intermediate layer, 250: warp yarn, 251: weft yarn, 252: basket hole, 600: conductor, 602: photoelectric conversion region, 604: terminal region, 606: connection terminal, 608: connection terminal, 610: photoelectric conversion region, 614: photoelectric conversion region, 1000: transfer chamber, 1002: load/unload chamber, 1004: deposition chamber, 1006: deposition chamber, 1008: deposition chamber, 1010: deposition chamber, 1012: deposition chamber, 1020: transfer robot, 1101: single crystal semiconductor substrate, 1102: protective layer, 1103: first semiconductor layer, 1104: fragile layer, 1105: conductive film, 1106: insulating layer, 1107: supporting substrate, 1108: separation substrate, 1109: second semiconductor layer, 1110: third semiconductor layer, 1111: photoelectric conversion layer, 1112: conductive film, 1101a: single crystal semiconductor substrate, 1101b: single crystal semiconductor substrate, 1201: supporting substrate, 1202: separation layer, 1203: insulating layer, 1204: conductive film, 1205: first semiconductor layer, 1206: second semiconductor layer, 1207: third semiconductor layer, 1208: temporary supporting substrate, 1209: adhesive for separation, 1210: adhesive layer, 1211: plastic substrate, 1212: conductive film, 1221: photoelectric conversion layer, 121a: photoelectric conversion layer, 121b: photoelectric conversion layer, 1301: single crystal semiconductor substrate, 1302: texture structure, 1303: first semiconductor layer, 1304: conductive film, 1305: third semiconductor layer, 1306: conductive film, 1307: photoelectric conversion layer, 141a: photoelectric conversion layer, 141b: photoelectric conversion layer, 2100: transfer chamber, 2102: analysis chamber, 2104: surface treatment chamber, 2106: deposition chamber, 2108: load chamber, 2110: deposition chamber, 2112: deposition chamber, 2114: deposition chamber, 2120: transfer robot, 2140: transfer chamber, 2142: deposition chamber, 2144: deposition chamber, 2146: deposition chamber, 2148: unload chamber, 2150: deposition chamber, 2152: deposition chamber, 2154: deposition chamber, 2160: transfer robot, 2180: connection chamber, 4002: supporting substrate, 4016: auxiliary electrode, 4018: electrode, 4020: photoelectric conversion layer, 5026: back electrode, 5027: back electrode, 5028: solar photovoltaic module, 5029: charge control circuit, 5030: storage battery, 5031: load, 6000: vehicle, 6002: converter, 6004: capacitor, 6006: engine, 6008: monitor, 6010: radiator, 6012: circulation pump, 7002: photoelectric conversion device, 7004: capacitor, 7006: switching regulator, 7008: pulse width modulation circuit, 7010: band path filter, 7012: attenuator, 7014: triangle wave generation circuit, 7016: comparator, 7020: switching transistor, 7021: smoothing capacitor, 7022: inductor, 7024: diode, 7026: switching transistor, 7027: switching transistor, 7028: switching transistor, 7029: switching transistor, 7030: pulse width modulation wave, 7032: sin wave, 7050: photoelectric conversion device, 7052: DC switch, 7054: charge control circuit, 7056: power storage device, 7058: inverter, 7060: distribution board, 7062: AC switch, 7064: transformer, 7068: electric grid, 7070: electric device, 7096: cell, 7080: conductive member, 7082: wiring member, 7084: sealing resin, 7088: frame, 7090: power storage device, 7092: terminal, 7094: backflow prevention diode, 7096: cell, 7098: substrate, 7100: fibrous body, 7102: organic resin

The invention claimed is:

1. A photoelectric conversion device comprising:
   a first substrate;
   a second substrate facing the first substrate;
   a first cell having a photoelectric conversion function in contact with the first substrate, the first cell being positioned between the first substrate and the second substrate;
   a second cell having a photoelectric conversion function in contact with the second substrate, the second cell being positioned between the first substrate and the second substrate; and
   a structure body between the first cell and the second cell, the first cell and the second cell facing each other with the structure body therebetween,
   wherein the structure body is configured to fix the first cell and the second cell to each other,
   wherein the structure body includes a fibrous body and a conductor wherein the conductor intersects and permeates through the fibrous body, and makes direct contact with the first cell and the second cell, wherein a surface area of a first end of the conductor is greater than a surface area of a second end of the conductor,
   wherein the first cell includes a first conductive film over the first substrate, a first photoelectric conversion layer over the first conductive film, and a second conductive film over the first photoelectric conversion layer,
   wherein the second cell includes a third conductive film over the structure body, a second photoelectric conversion layer over the third conductive film, and a fourth conductive film over the second photoelectric conversion layer,
   wherein the conductor is configured to electrically connect the second conductive film and the third conductive film to each other,
   wherein side surfaces of the first photoelectric conversion layer are spaced from the structure body,
   wherein side surfaces of the second photoelectric conversion layer are spaced from the structure body,
   wherein the first photoelectric conversion layer includes a first p-type semiconductor layer and a first n-type semiconductor layer, wherein the second photoelectric conversion layer includes a second p-type semiconductor layer and a second n-type semiconductor layer, wherein a first i-type semiconductor layer is formed between the first p-type semiconductor layer and the first n-type semiconductor layer, and wherein a second i-type semiconductor layer is formed between the second p-type semiconductor layer and the second n-type semiconductor layer.

2. The photoelectric conversion device according to claim 1, wherein the first cell or the second cell includes any one of amorphous silicon, crystalline silicon, and single crystal silicon.

3. A photoelectric conversion device comprising:
a first substrate;
a second substrate facing the first substrate;
a first cell having a photoelectric conversion function in contact with the first substrate, the first cell being positioned between the first substrate and the second substrate;
a second cell having a photoelectric conversion function in contact with the second substrate, the second cell being positioned between the first substrate and the second substrate; and
a structure body between the first cell and the second cell, the first cell and the second cell facing each other with the structure body therebetween,
wherein the structure body is configured to fix the first cell and the second cell to each other,
wherein the structure body includes a fibrous body and a conductor wherein the conductor intersects and permeates through the fibrous body, and makes direct contact with the first cell and the second cell, wherein a surface area of a first end of the conductor is greater than a surface area of a second end of the conductor,
wherein the first cell includes a first conductive film over the first substrate, a first photoelectric conversion layer over the first conductive film, and a second conductive film over the first photoelectric conversion layer,
wherein the second cell includes a third conductive film over the structure body, a second photoelectric conversion layer over the third conductive film, and a fourth conductive film over the second photoelectric conversion layer,
wherein the conductor is configured to electrically connect the second conductive film and the third conductive film to each other,
wherein side surfaces of the first photoelectric conversion layer are spaced from the structure body, and
wherein side surfaces of the second photoelectric conversion layer are spaced from the structure body.

4. The photoelectric conversion device according to claim 3, wherein the first cell or the second cell includes any one of amorphous silicon, crystalline silicon, and single crystal silicon.

5. A photoelectric conversion device comprising:
a first substrate;
a second substrate facing the first substrate;
a first cell having a photoelectric conversion function in contact with the first substrate, the first cell being positioned between the first substrate and the second substrate;
a second cell having a photoelectric conversion function in contact with the second substrate, the second cell being positioned between the first substrate and the second substrate;
a structure body between the first cell and the second cell, the first cell and the second cell facing each other with the structure body therebetween; and
a film battery electrically connected to the first cell, the film battery being attached to a side surface of the first substrate and a side surface of the second substrate,
wherein the structure body is configured to fix the first cell and the second cell to each other,
wherein the structure body includes a fibrous body and a conductor wherein the conductor intersects and permeates through the fibrous body, and makes direct contact with the first cell and the second cell, wherein a surface area of a first end of the conductor is greater than a surface area of a second end of the conductor,
wherein the first cell includes a first conductive film over the first substrate, a first photoelectric conversion layer over the first conductive film, and a second conductive film over the first photoelectric conversion layer,
wherein the second cell includes a third conductive film over the structure body, a second photoelectric conversion layer over the third conductive film, and a fourth conductive film over the second photoelectric conversion layer,
wherein the conductor is configured to electrically connect the second conductive film and the third conductive film to each other,
wherein side surfaces of the first photoelectric conversion layer are spaced from the structure body, and
wherein side surfaces of the second photoelectric conversion layer are spaced from the structure body.

6. The photoelectric conversion device according to claim 5, wherein the first cell or the second cell includes any one of amorphous silicon, crystalline silicon, and single crystal silicon.

7. The photoelectric conversion device according to claim 5, wherein the first substrate or the second substrate comprises a glass substrate.

8. The photoelectric conversion device according to claim 5, wherein the fibrous body is a glass fiber.

9. The photoelectric conversion device according to claim 5, wherein the first cell and the second cell are electrically connected in series.

10. The photoelectric conversion device according to claim 1, wherein the first substrate and the second substrate comprise a flexible substrate.

11. The photoelectric conversion device according to claim 3, wherein the first substrate and the second substrate comprise a flexible substrate.

12. The photoelectric conversion device according to claim 5, wherein the first substrate and the second substrate comprise a flexible substrate.

* * * * *